(12) United States Patent
Mushiga et al.

(10) Patent No.: US 10,490,564 B2
(45) Date of Patent: Nov. 26, 2019

(54) THREE-DIMENSIONAL MEMORY DEVICE AND METHODS OF MAKING THE SAME USING REPLACEMENT DRAIN SELECT GATE ELECTRODES

(71) Applicant: SANDISK TECHNOLOGIES LLC, Addison, TX (US)

(72) Inventors: Mitsuteru Mushiga, Yokkaichi (JP); Hisakazu Otoi, Yokkaichi (JP); Kenji Sugiura, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/023,866

(22) Filed: Jun. 29, 2018

(65) Prior Publication Data
US 2019/0326307 A1 Oct. 24, 2019

Related U.S. Application Data

(60) Provisional application No. 62/662,025, filed on Apr. 24, 2018.

(51) Int. Cl.
*H01L 27/11556* (2017.01)
*H01L 27/11519* (2017.01)
(Continued)

(52) U.S. Cl.
CPC .... *H01L 27/11556* (2013.01); *H01L 27/1157* (2013.01); *H01L 27/11519* (2013.01);
(Continued)

(58) Field of Classification Search
CPC ........... H01L 27/1156; H01L 27/11519; H01L 27/11524; H01L 27/11565; H01L 27/1157;
(Continued)

(56) References Cited

U.S. PATENT DOCUMENTS 9,177,966 B1 11/2015 Rabkin et al.
9,853,038 B1 * 12/2017 Cui .................. H01L 27/11565
(Continued)

FOREIGN PATENT DOCUMENTS

JP 2013-187294 A 9/2013
KR 10-1182942 B1 9/2012
KR 10-2017-0136363 A 12/2017

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Zandra V Smith
*Assistant Examiner* — Andre C Stevenson
(74) *Attorney, Agent, or Firm* — The Marbury Law Group PLLC

(57) ABSTRACT

A method of forming a three-dimensional memory device includes forming an alternating stack of insulating layers and sacrificial material layers over a substrate, forming a patterned template structure around memory openings in a drain-select-level above the alternating stack, forming drain-select-level isolation structures in trenches in the patterned template structure, forming memory stack structures in the memory openings extending through the alternating stack, where each of the memory stack structures includes a memory film and a vertical semiconductor channel, replacing the sacrificial material layers with word lines, and separately replacing the patterned template structure with a drain select gate electrode.

12 Claims, 56 Drawing Sheets

(51) Int. Cl.
| | |
|---|---|
| *H01L 27/11565* | (2017.01) |
| *H01L 27/11524* | (2017.01) |
| *H01L 27/11582* | (2017.01) |
| *H01L 27/1157* | (2017.01) |
| *H01L 21/3065* | (2006.01) |
| *H01L 21/311* | (2006.01) |
| *H01L 21/306* | (2006.01) |

(52) U.S. Cl.
CPC .. H01L 27/11524 (2013.01); H01L 27/11565 (2013.01); H01L 27/11582 (2013.01); *H01L 21/3065* (2013.01); *H01L 21/30604* (2013.01); *H01L 21/31111* (2013.01); *H01L 21/31116* (2013.01)

(58) Field of Classification Search
CPC ......... H01L 27/11582; H01L 21/30604; H01L 21/3065; H01L 21/31111; H01L 21/31116
See application file for complete search history.

(56) References Cited

U.S. PATENT DOCUMENTS

| | | | |
|---|---|---|---|
| 9,922,987 | B1 | 3/2018 | Mizutani et al. |
| 2016/0111435 | A1 | 4/2016 | Pang et al. |
| 2016/0268274 | A1* | 9/2016 | Kawai ............... H01L 27/11582 |
| 2018/0108671 | A1 | 4/2018 | Yu et al. |

OTHER PUBLICATIONS

U.S. Appl. No. 15/704,286, filed Sep. 14, 2017, SanDisk Technologies.
U.S. Appl. No. 15/784,549, filed Oct. 16, 2017, SanDisk Technologies.
U.S. Appl. No. 15/818,061, filed Nov. 20, 2017, SanDisk Technologies.
U.S. Appl. No. 15/818,146, filed Nov. 20, 2017, SanDisk Technologies.
U.S. Appl. No. 15/888,714, filed Feb. 5, 2018, SanDisk Technologies.
U.S. Appl. No. 15/906,109, filed Feb. 27, 2018, SanDisk Technologies.
U.S. Appl. No. 16/023,289, filed Jun. 29, 2018, SanDisk Technologies.
U.S. Appl. No. 16/024,048, filed Jun. 29, 2018, SanDisk Technologies.
Notification of Transmittal of the International Search Report and Written Opinion of the International Search Authority for International Patent Application No. PCT/US2019/020141, dated Jun. 19, 2019, 12 pages.
USPTO Office Communication, Non-Final Office Action for Corresponding U.S. Appl. No. 16/024,048, dated Apr. 19, 2019, 10 pages.

* cited by examiner

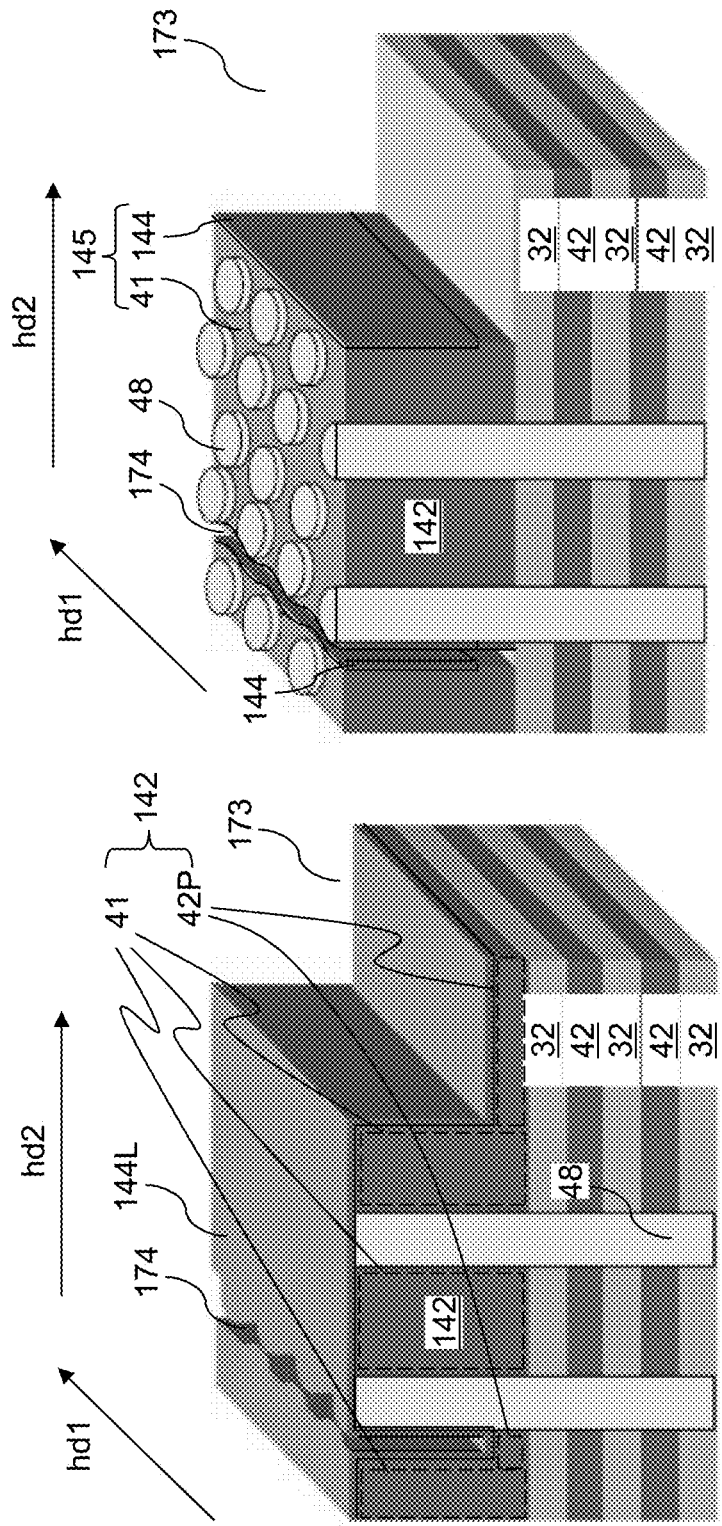

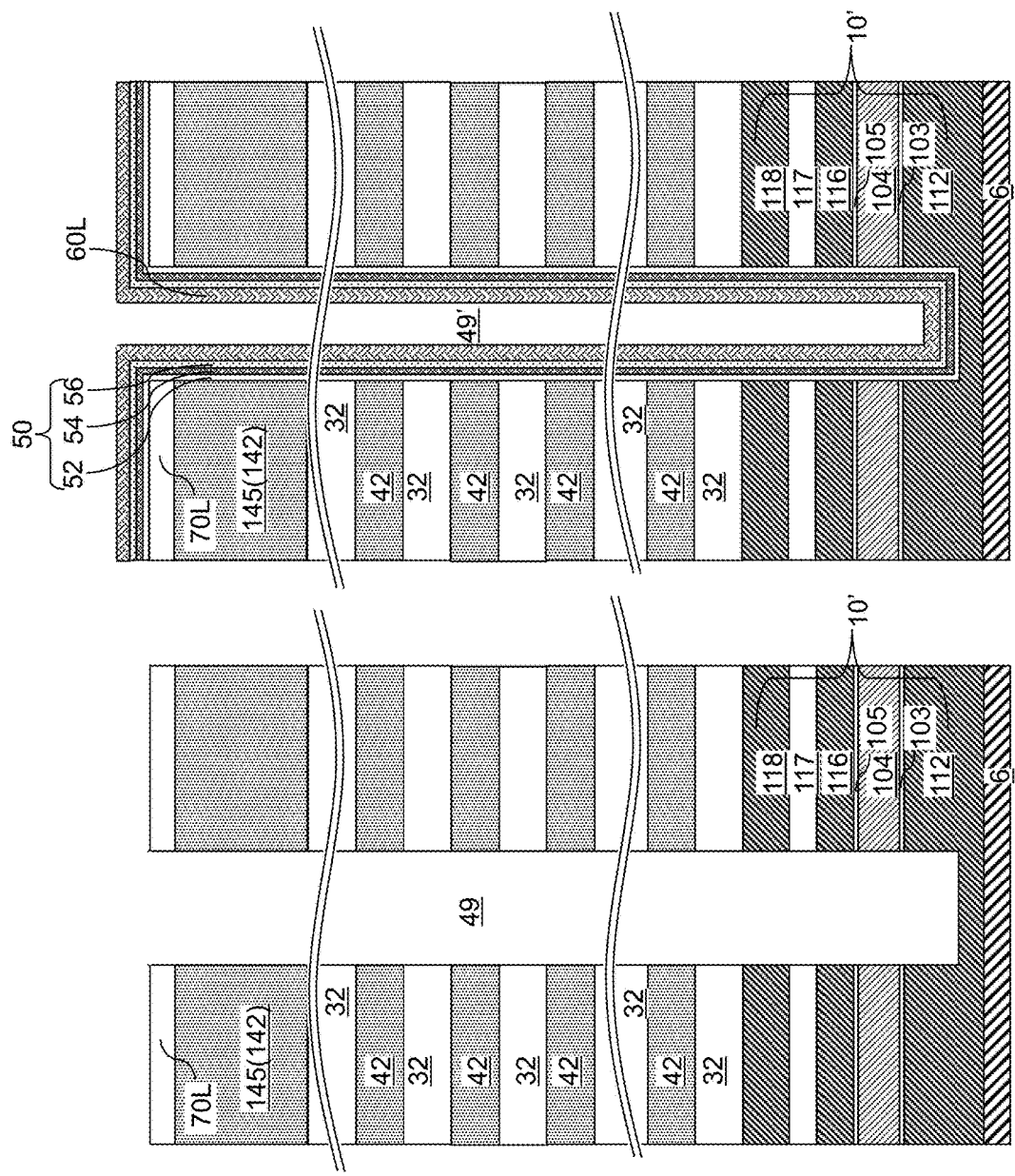

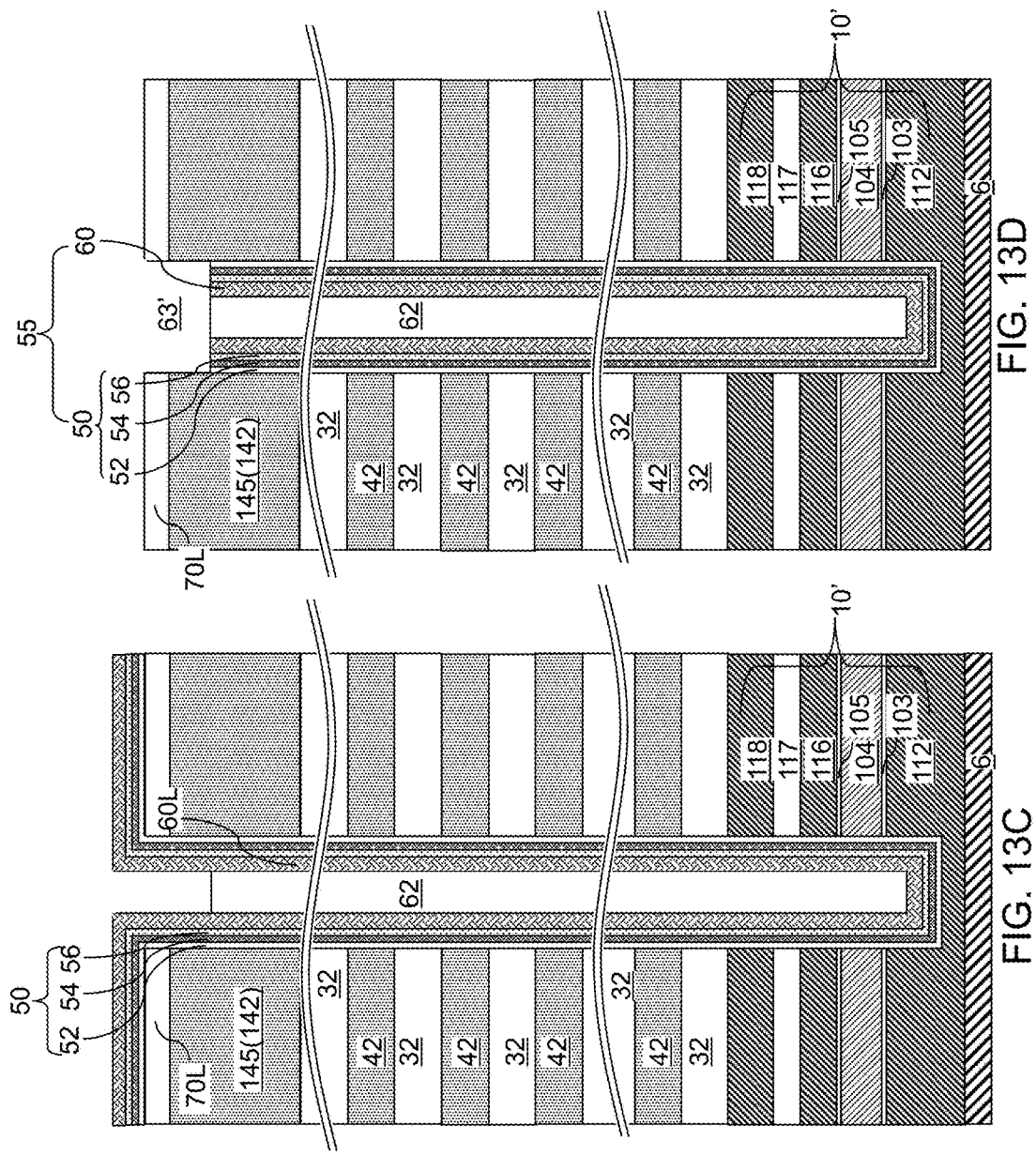

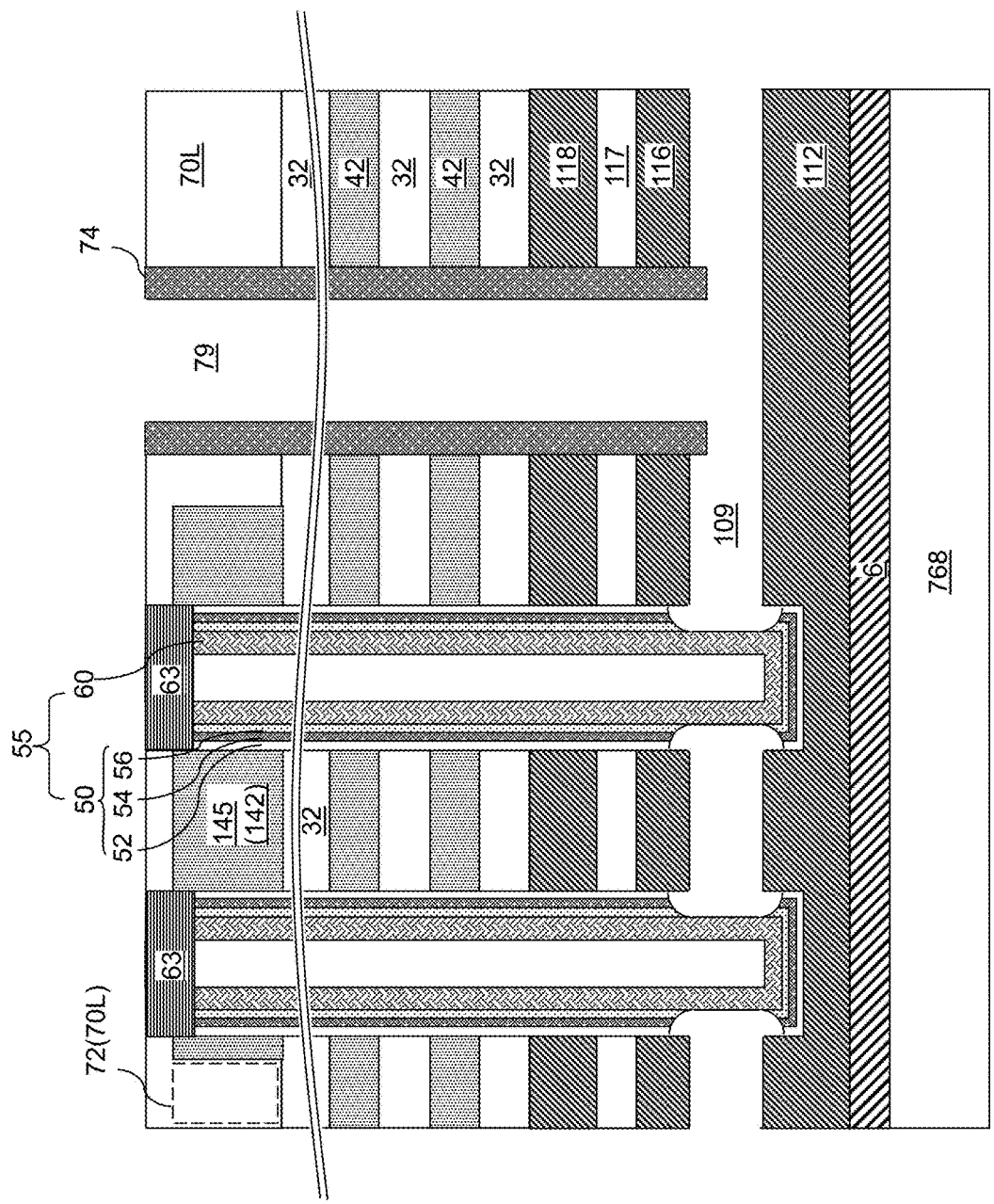

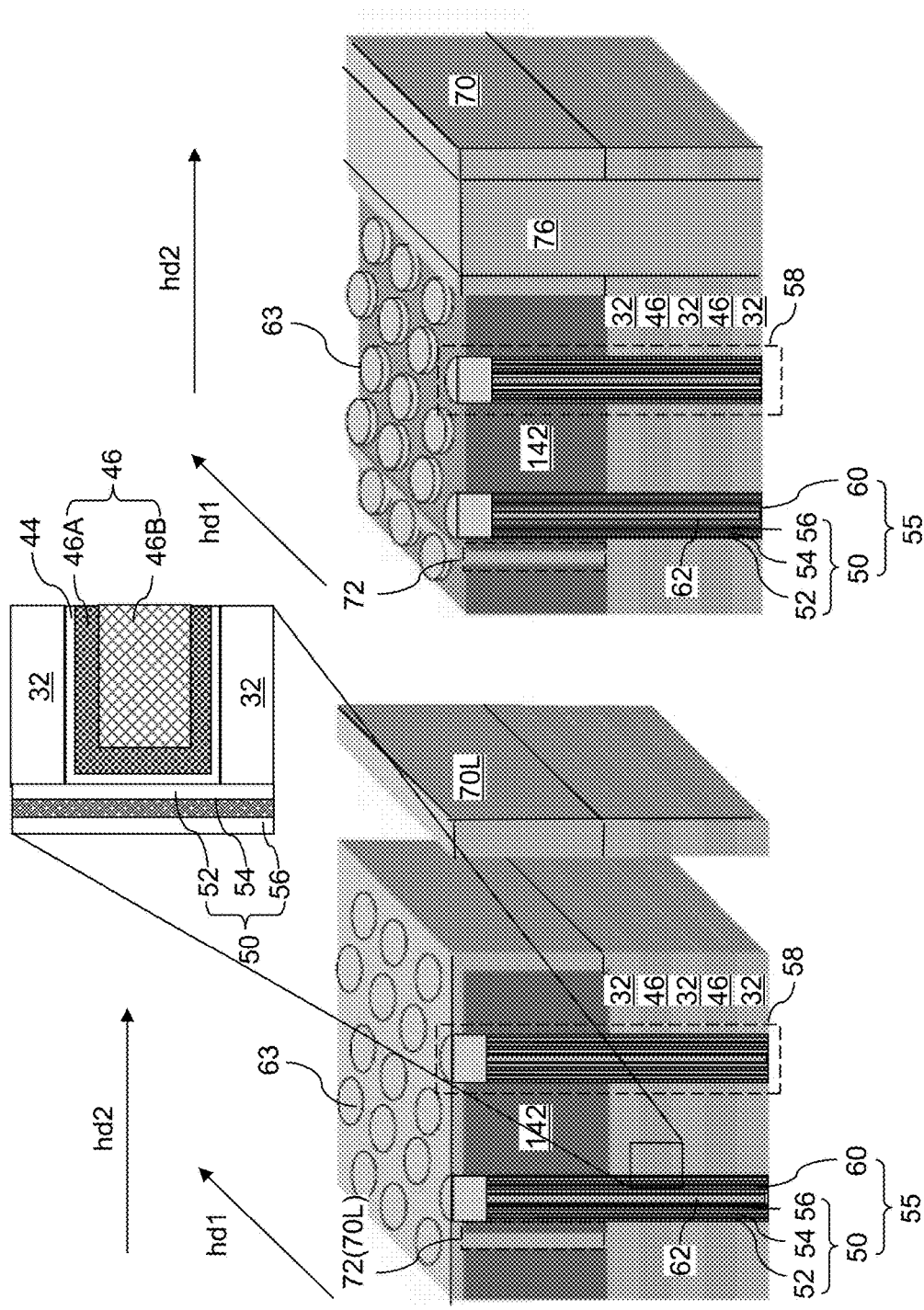

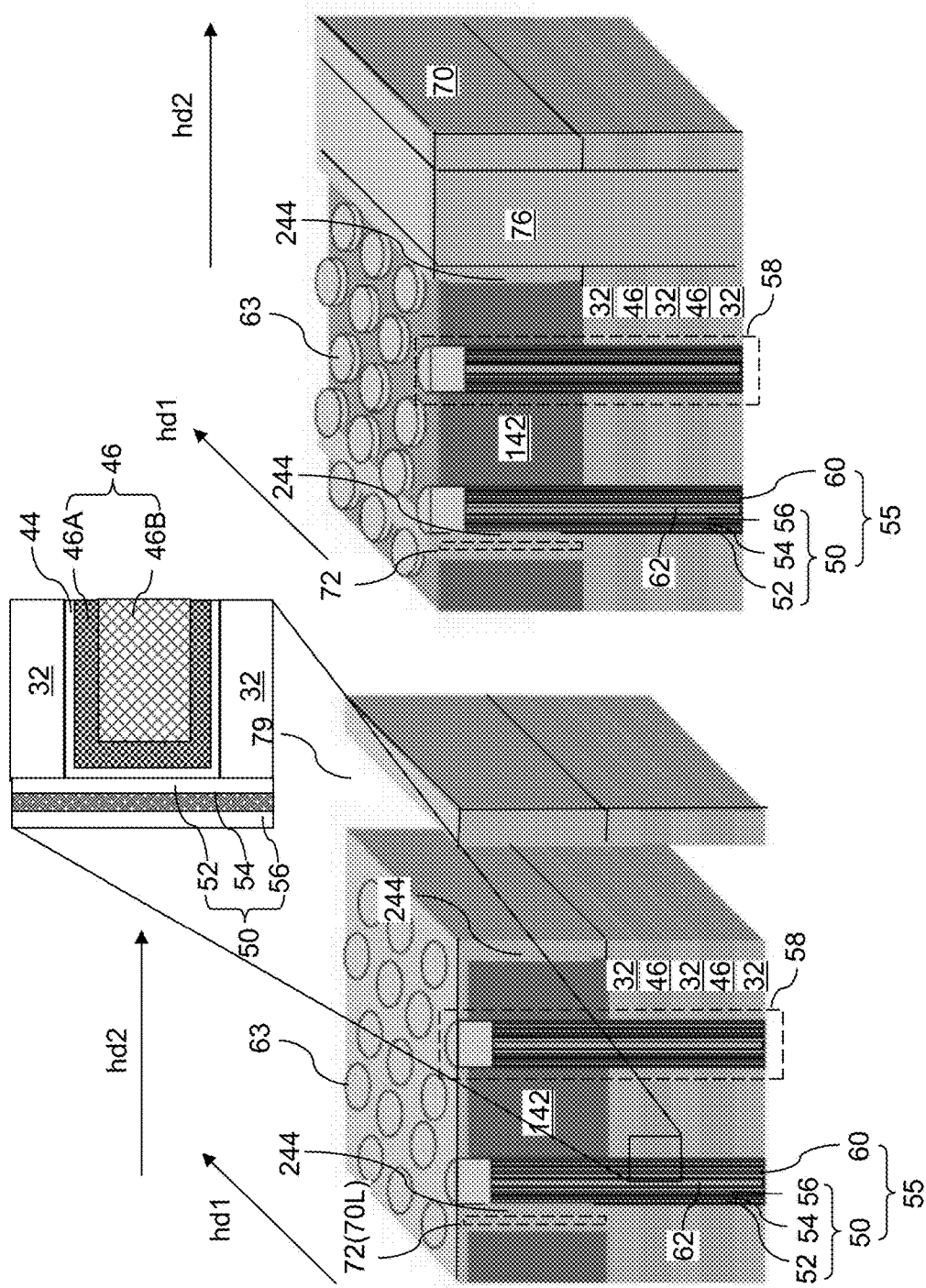

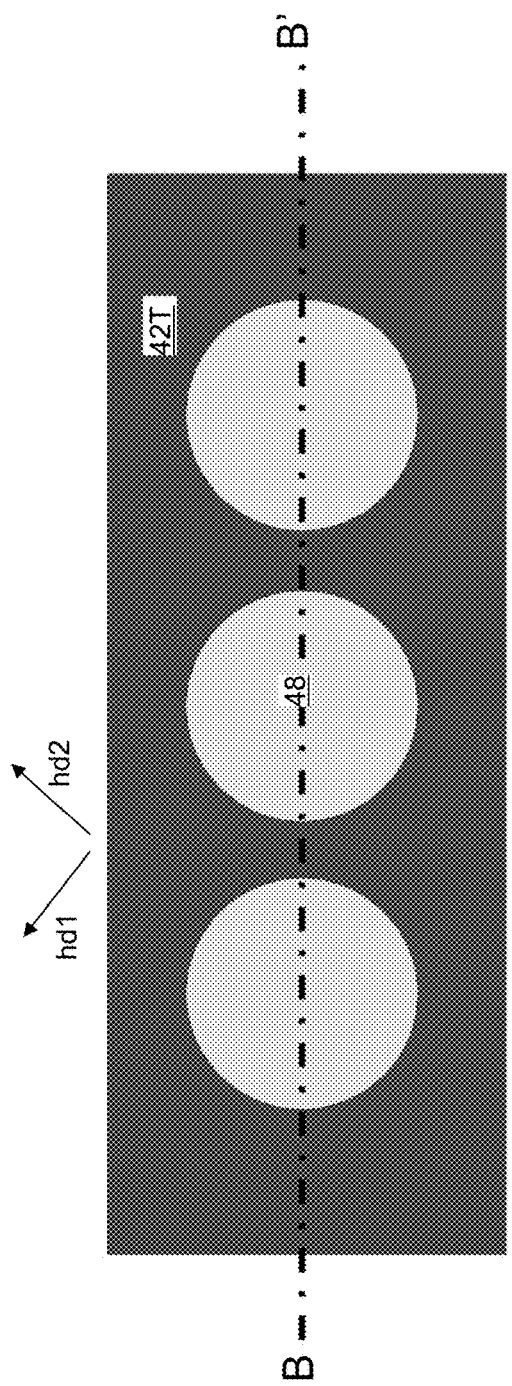
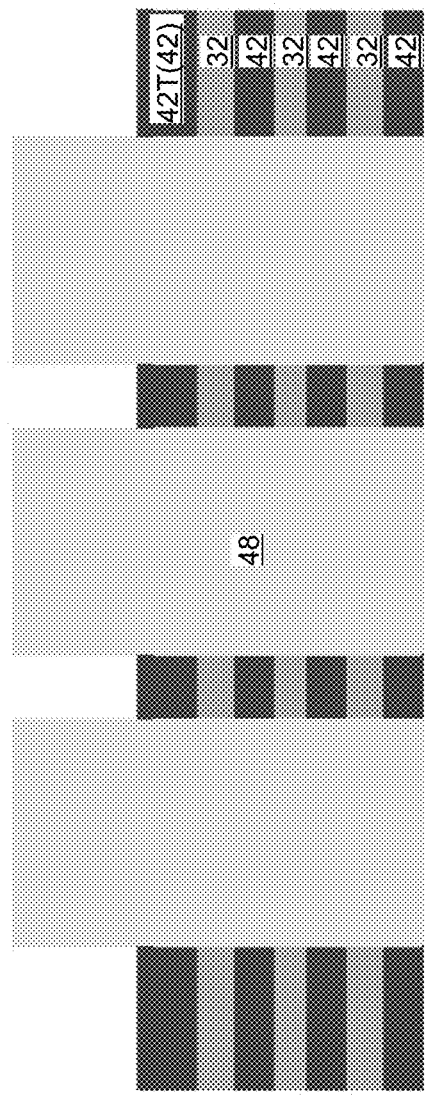
FIG. 34A
FIG. 34B

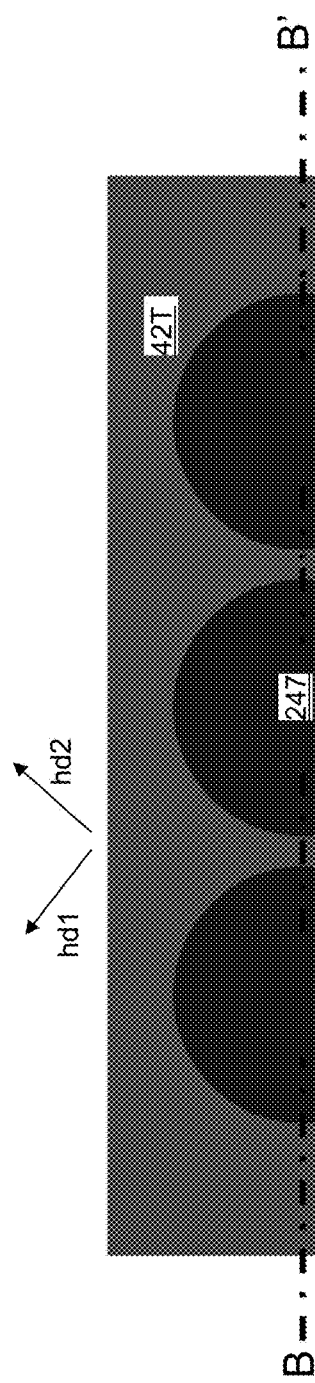
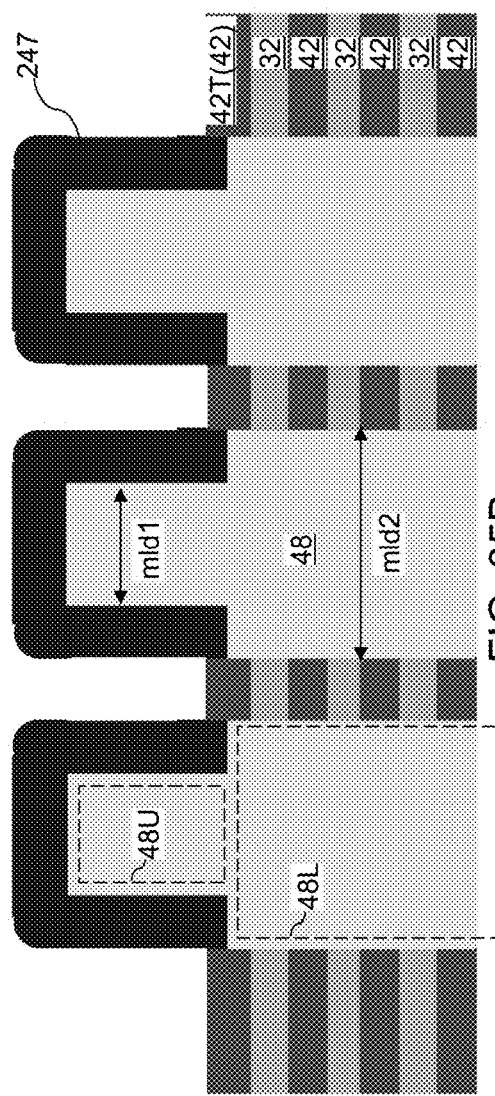
FIG. 35A
FIG. 35B

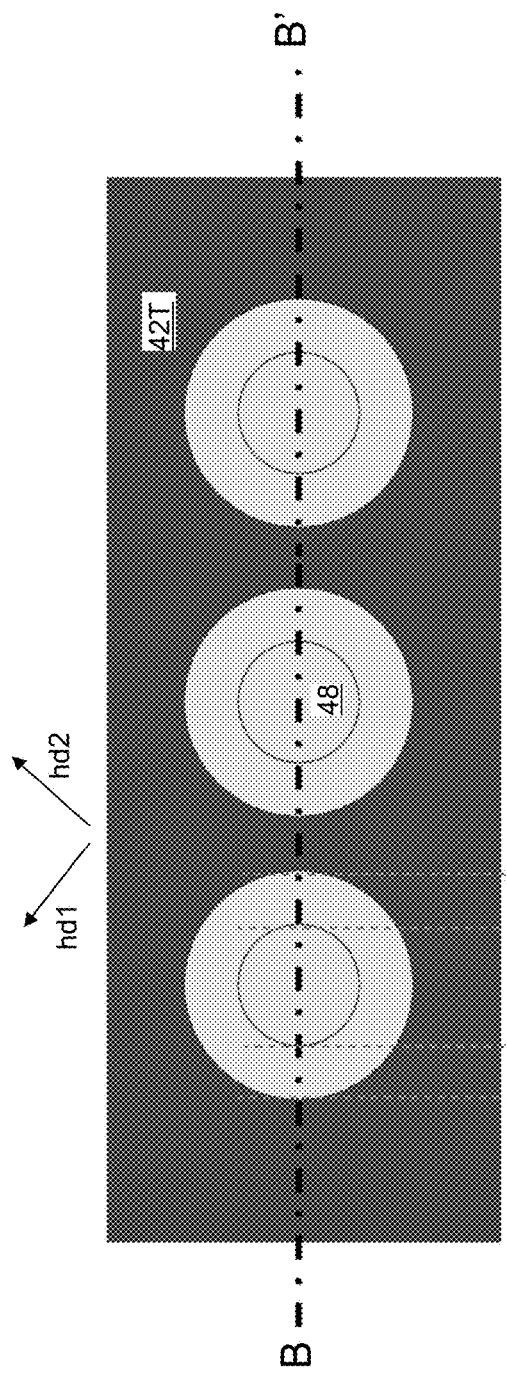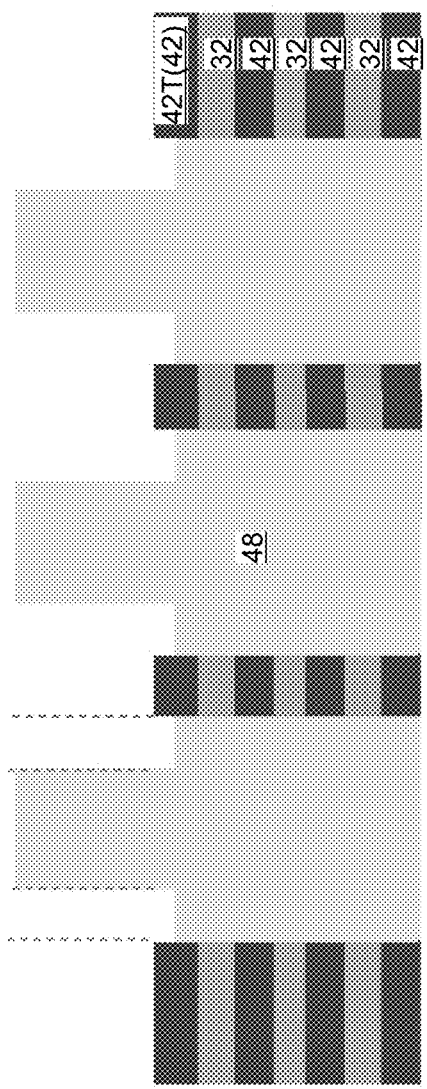

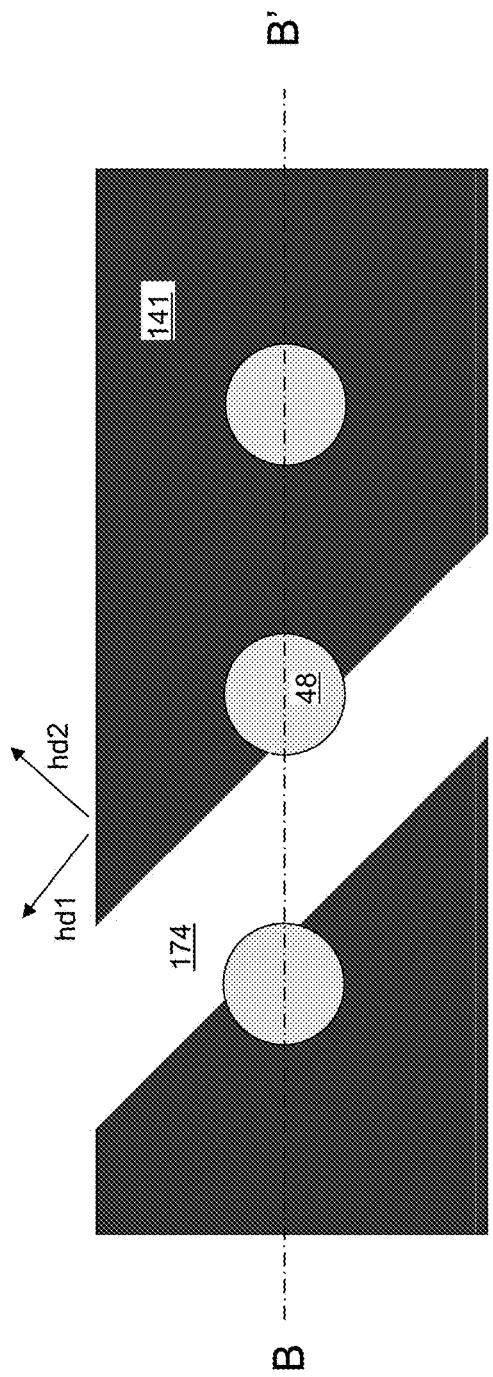
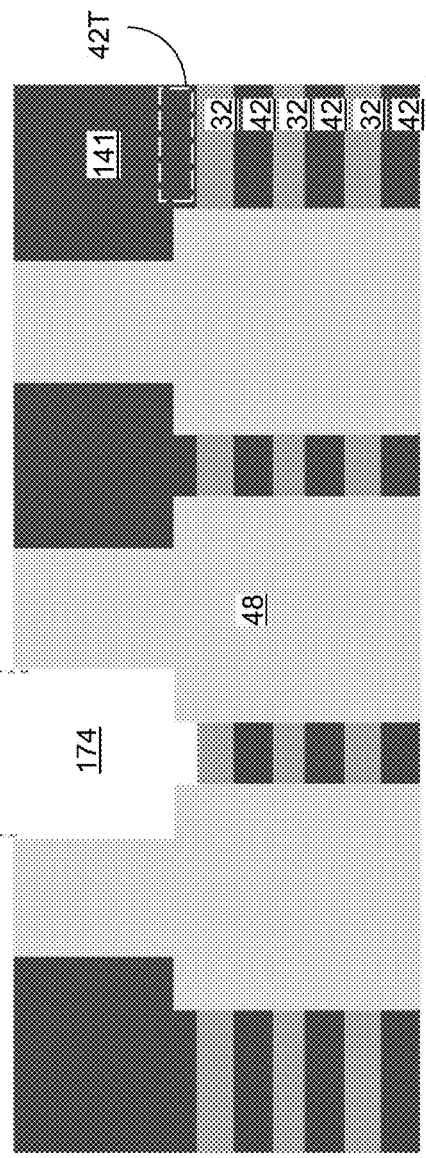
FIG. 38A
FIG. 38B

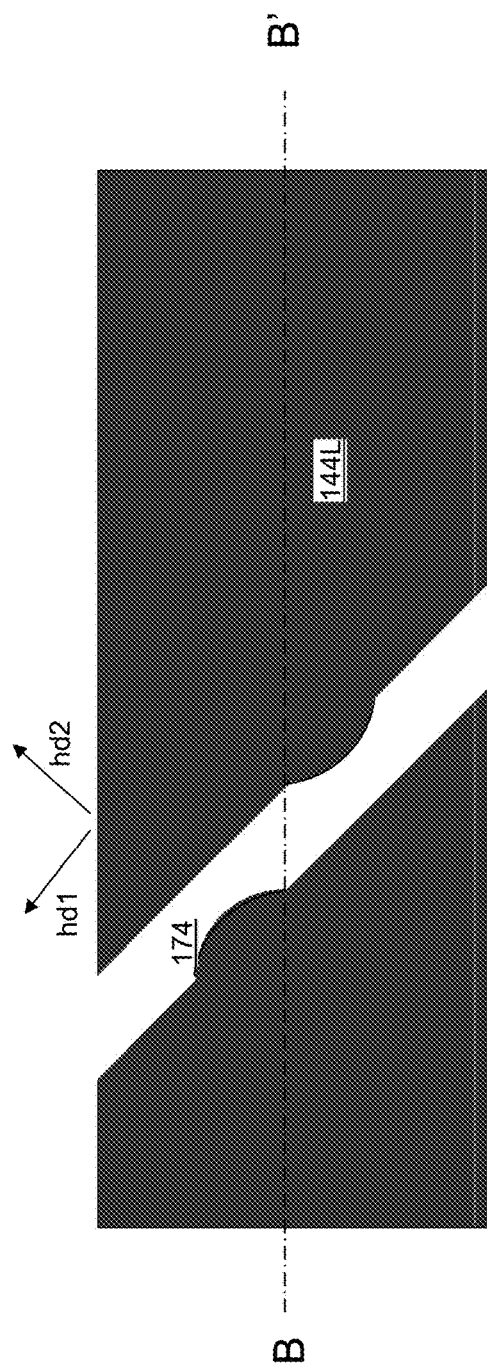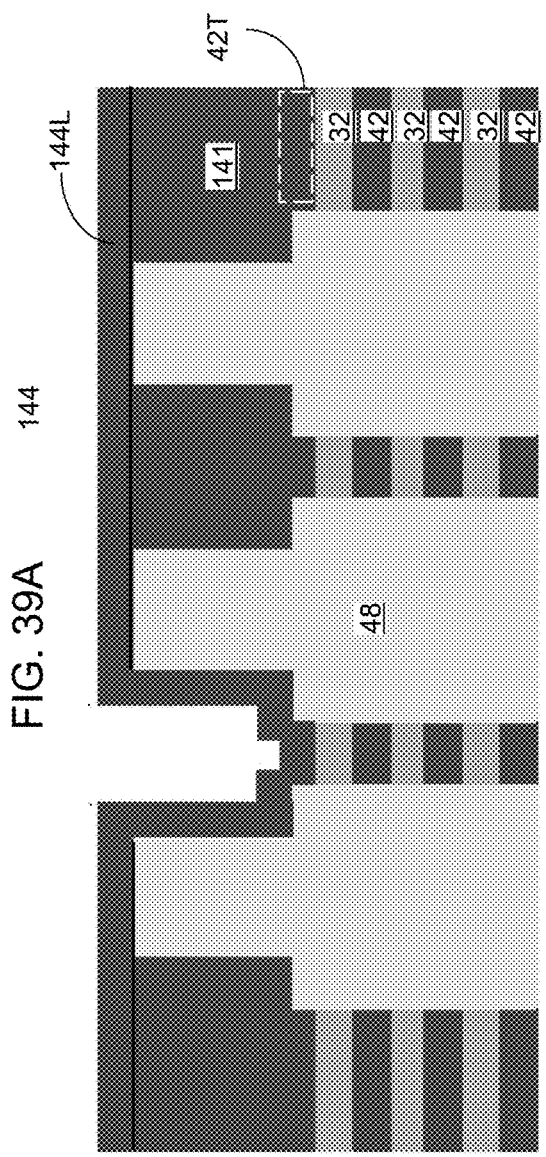

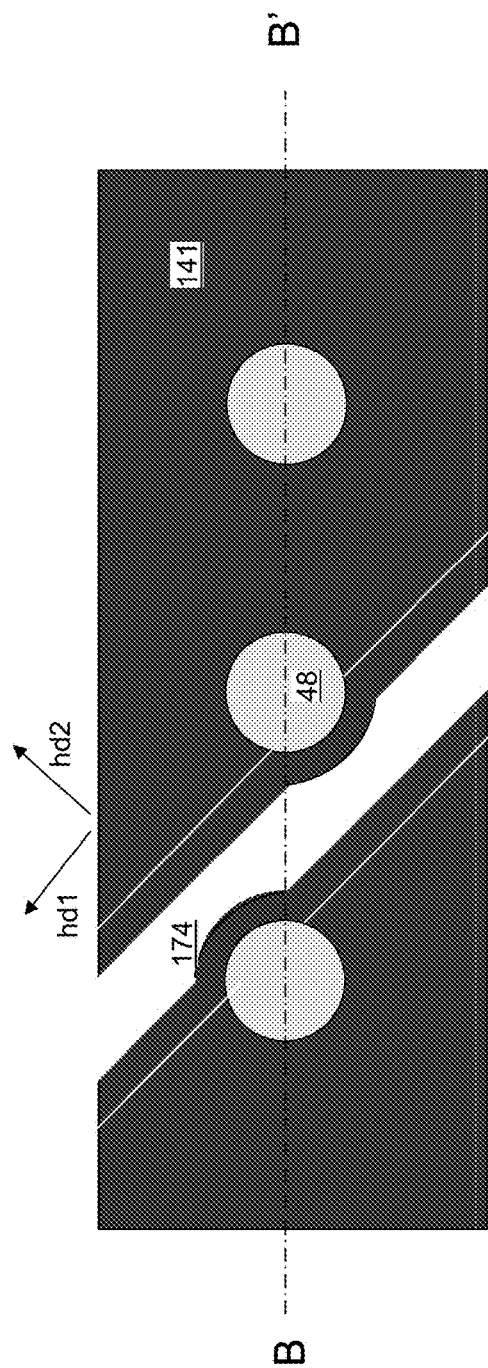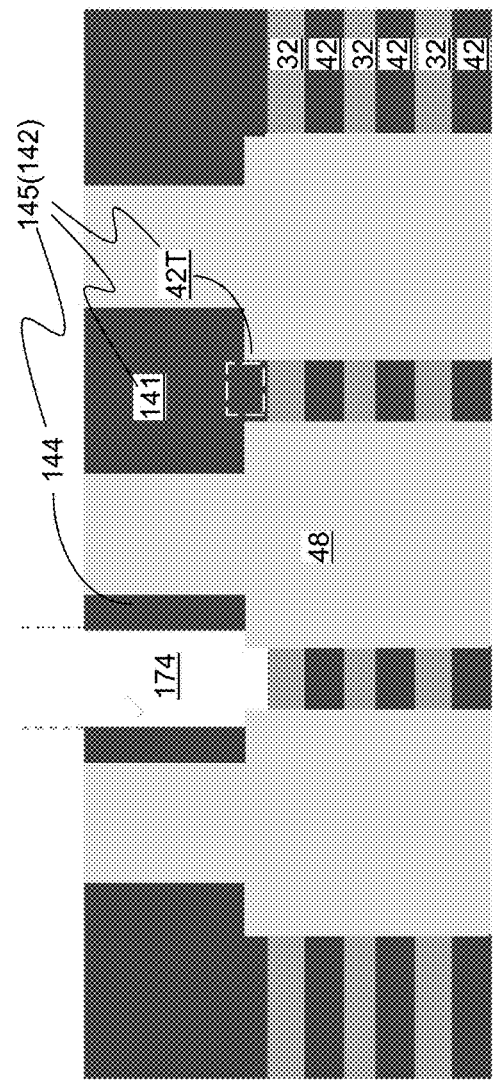
FIG. 40A
FIG. 40B

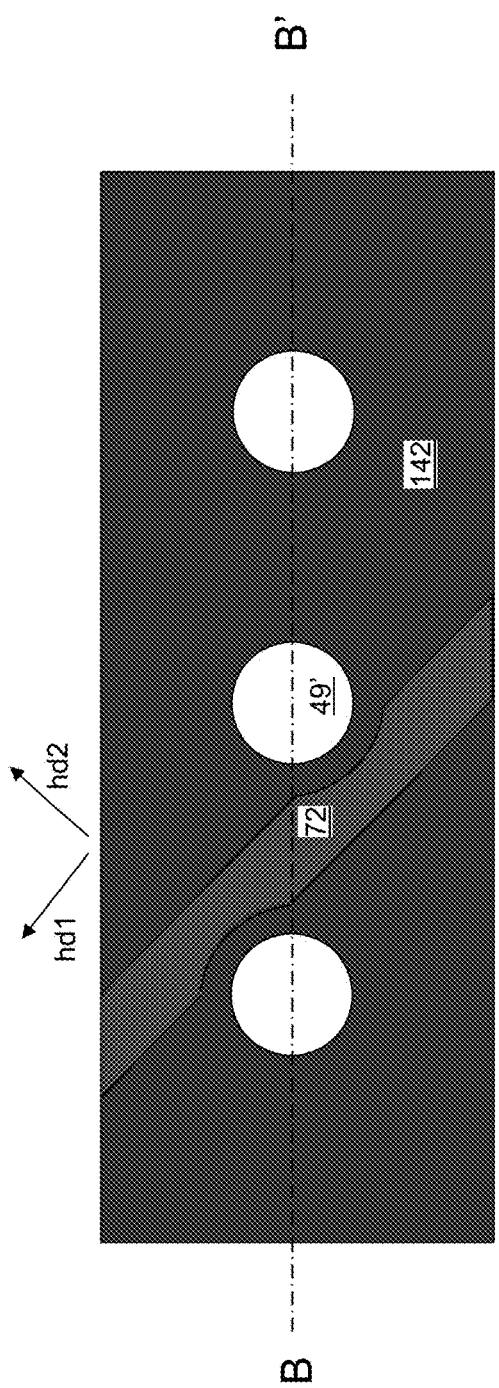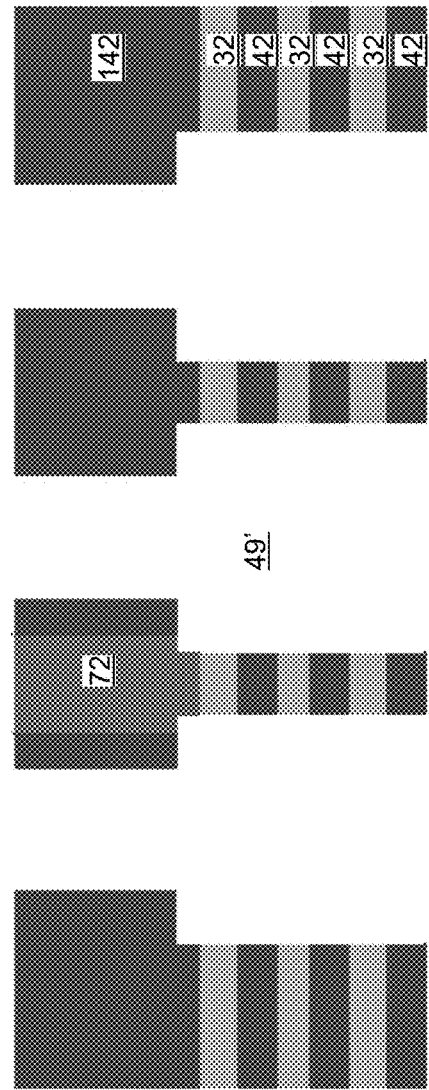
FIG. 42A
FIG. 42B

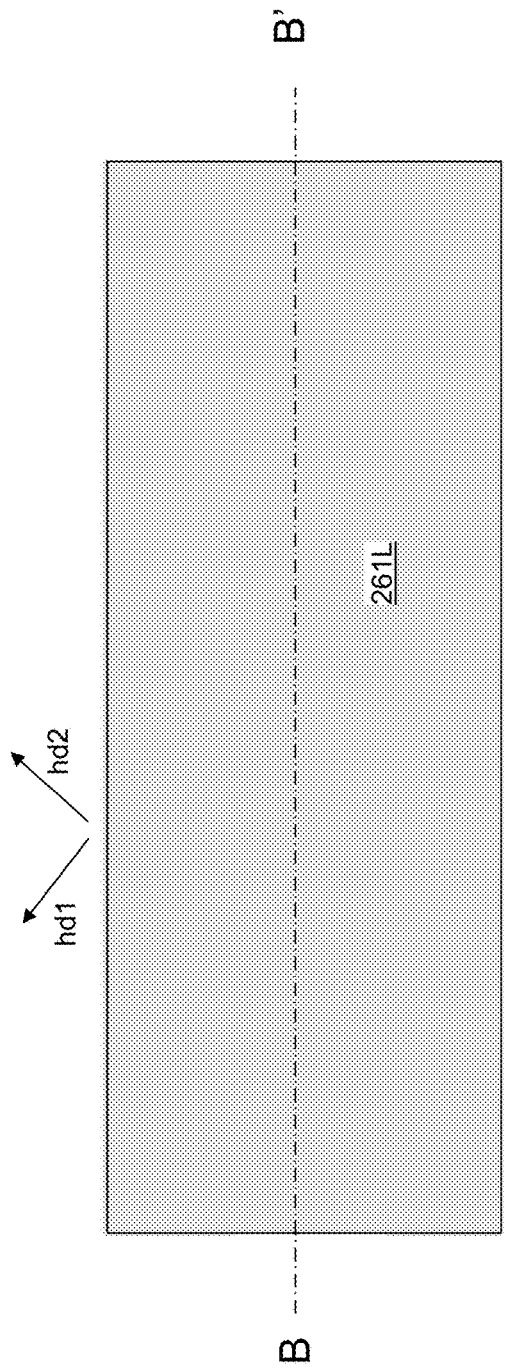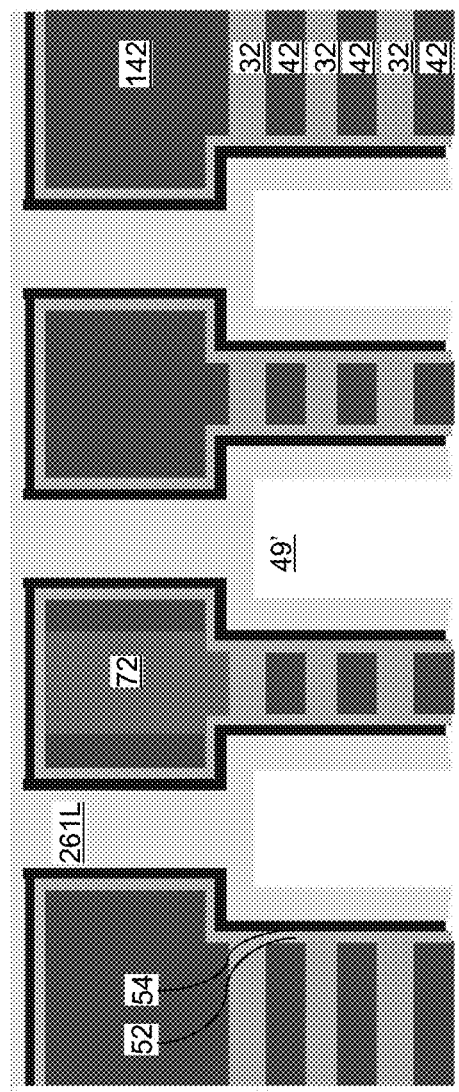

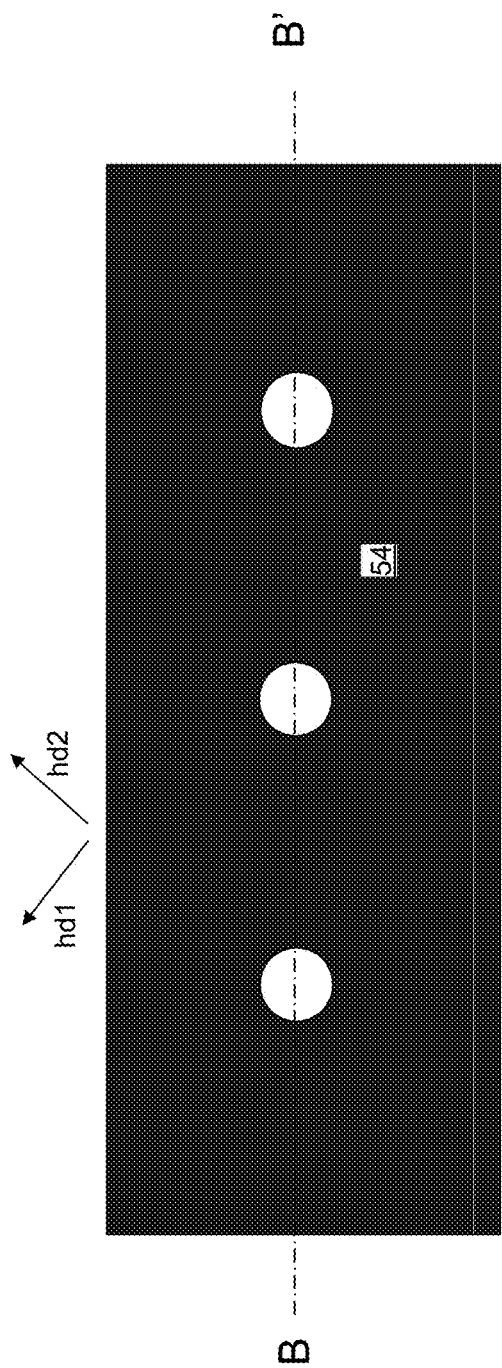
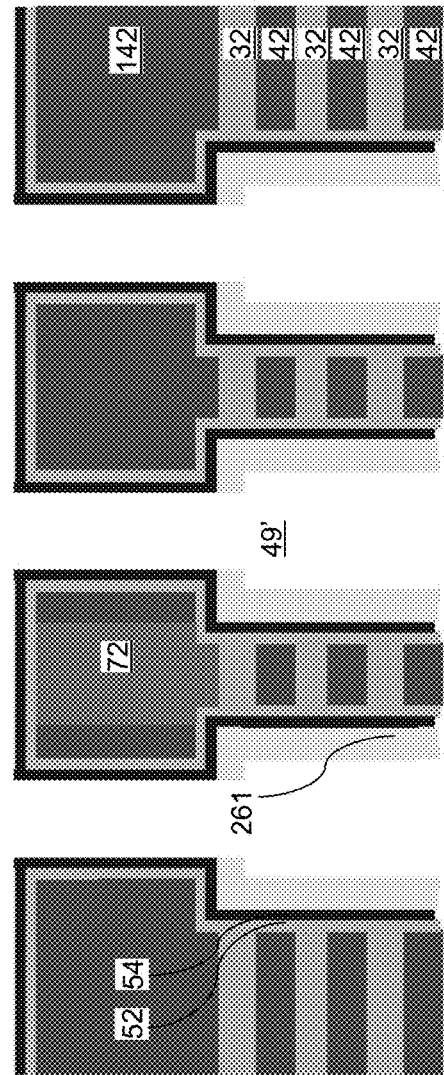
FIG. 44A
FIG. 44B

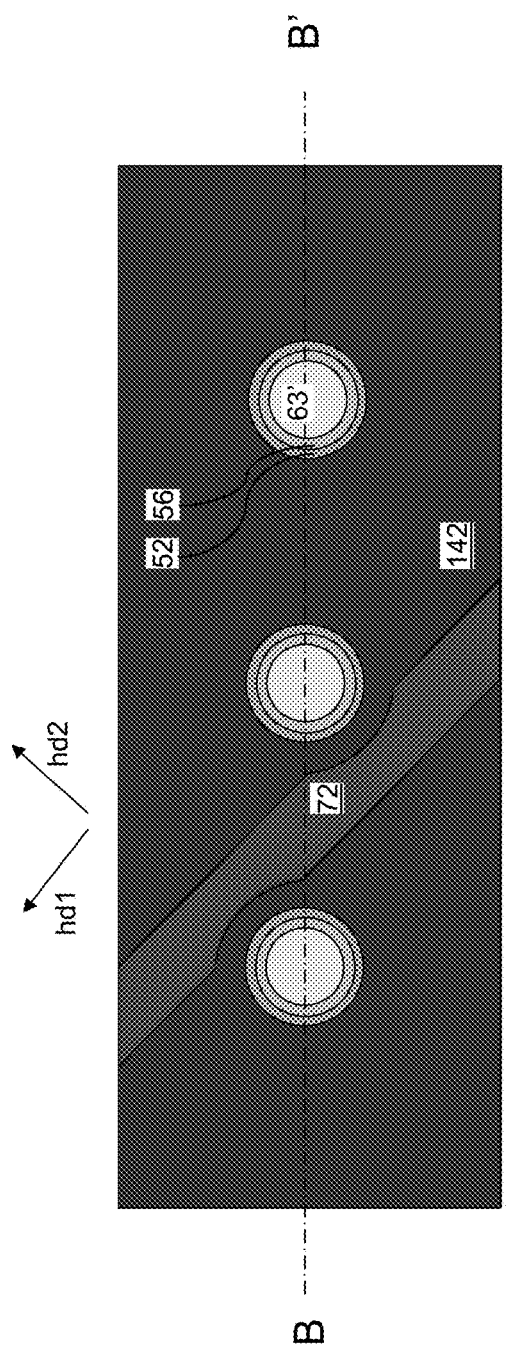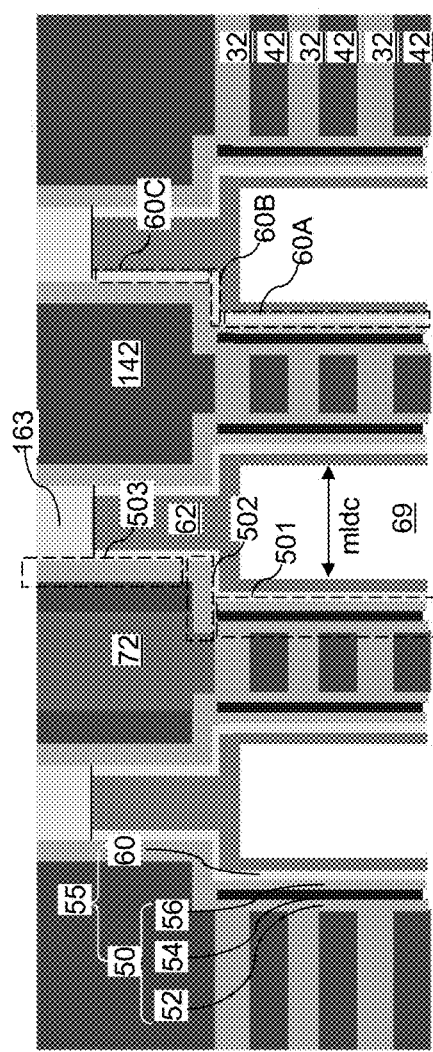
FIG. 47A
FIG. 47B

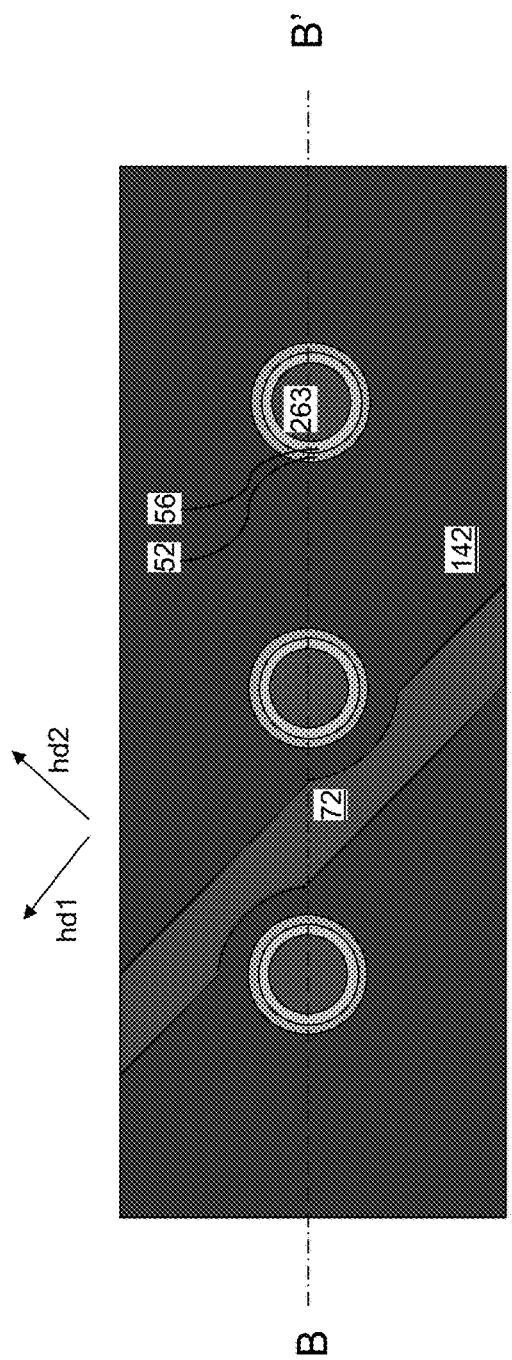
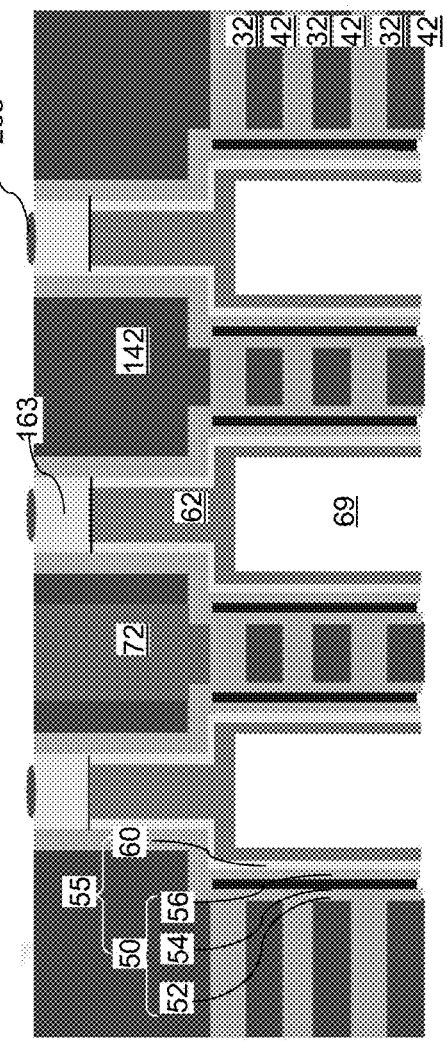
FIG. 48A
FIG. 48B

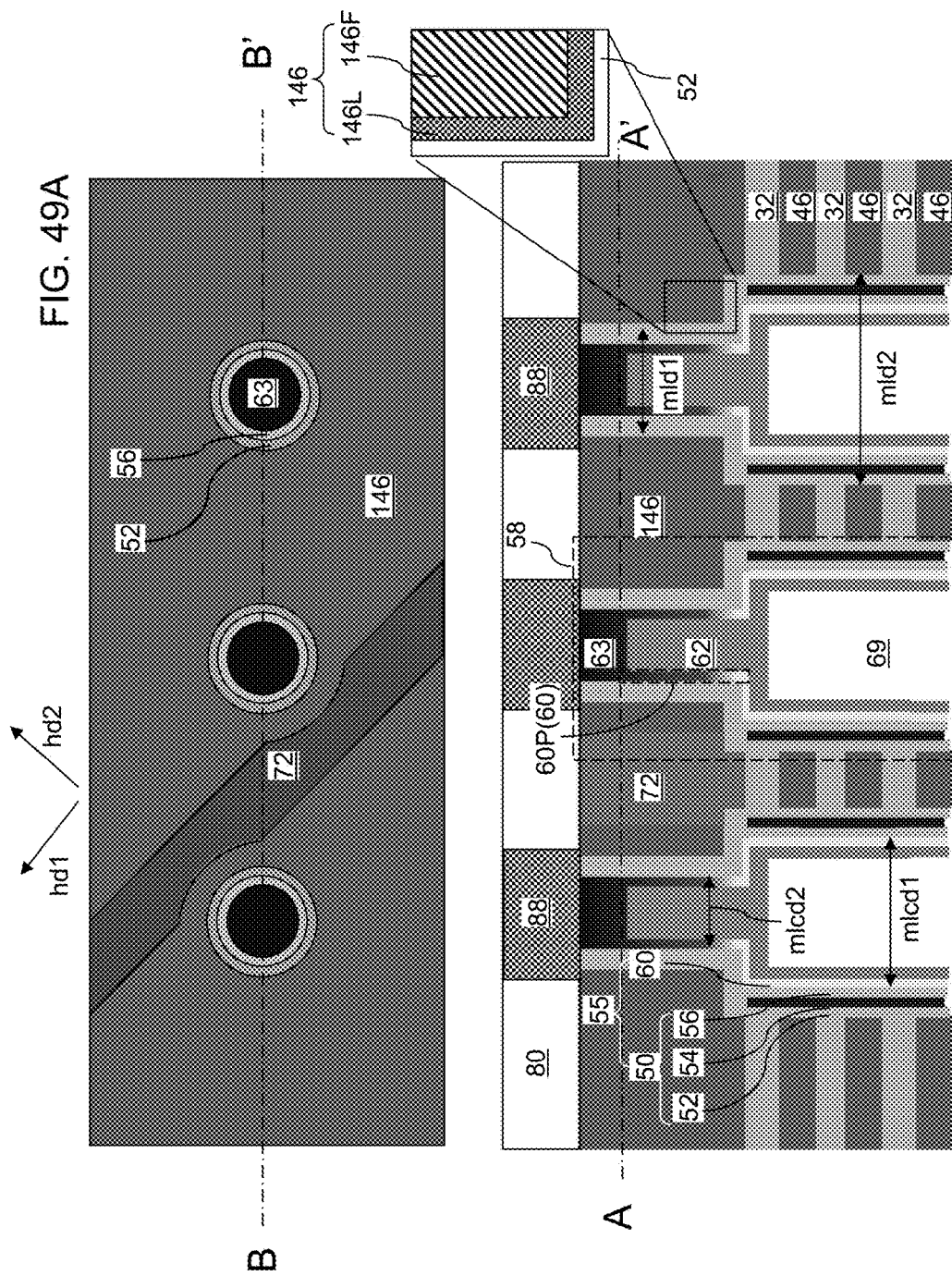

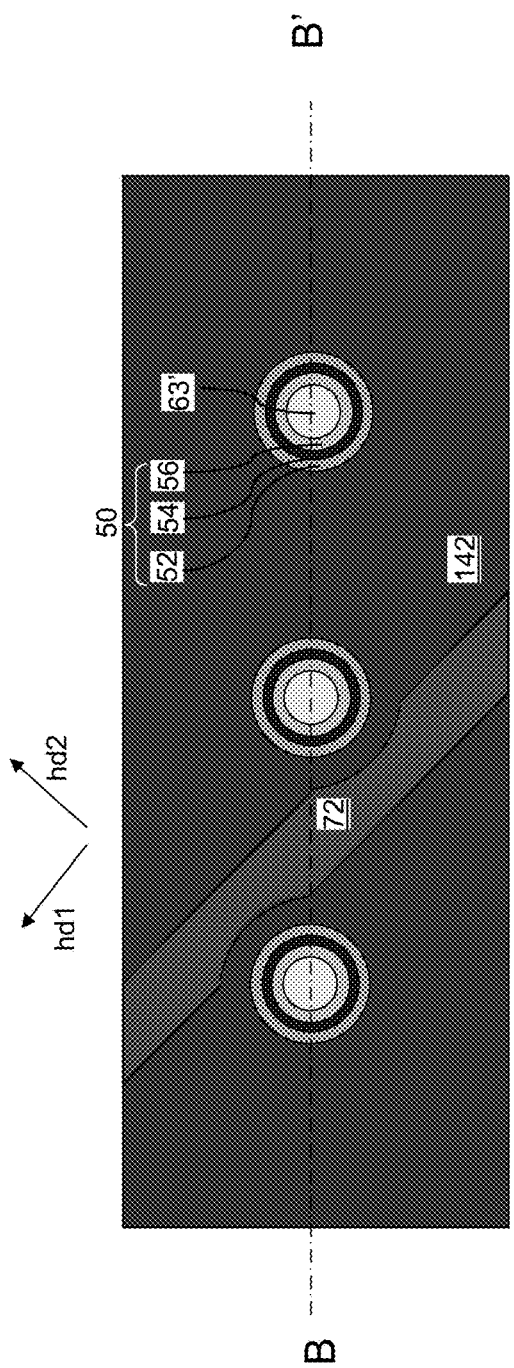
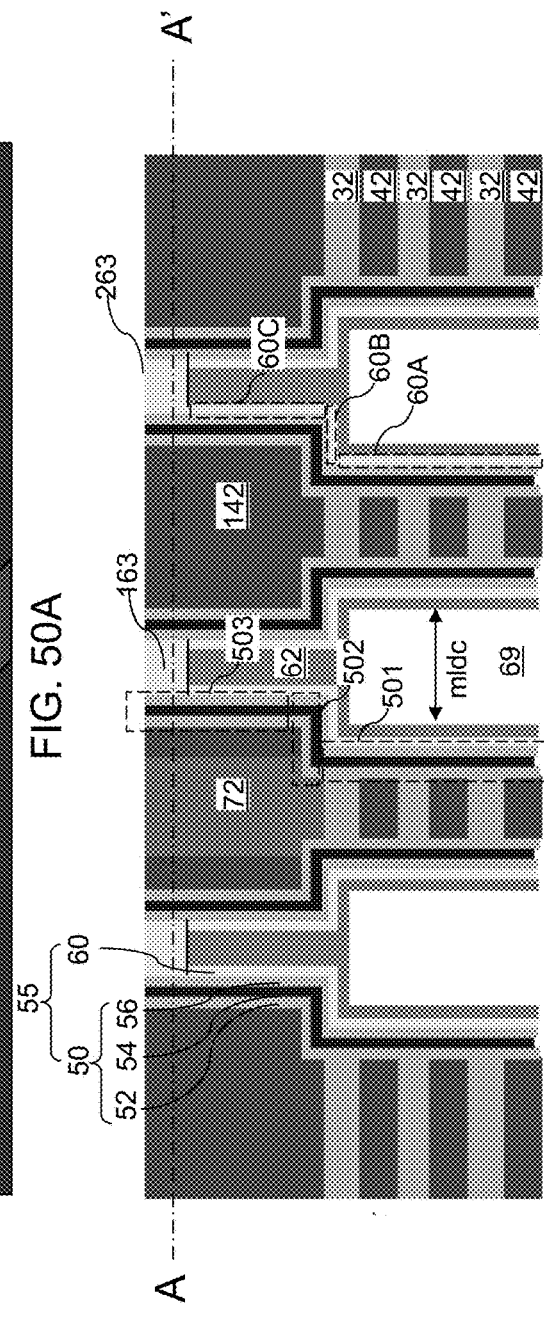
FIG. 50A
FIG. 50B

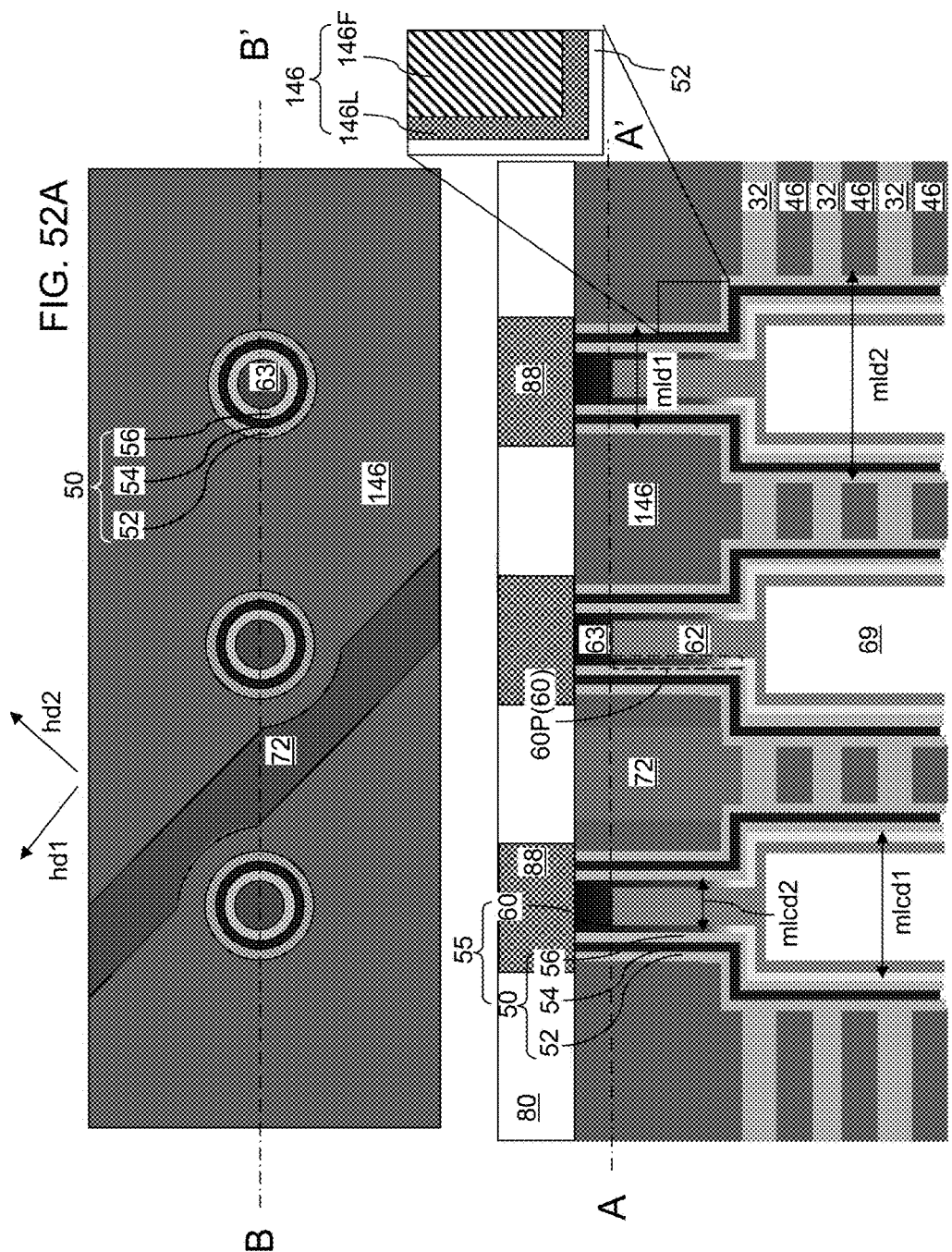

THREE-DIMENSIONAL MEMORY DEVICE AND METHODS OF MAKING THE SAME USING REPLACEMENT DRAIN SELECT GATE ELECTRODES

FIELD

The present disclosure relates generally to the field of semiconductor devices, and particular to a three-dimensional memory device including replacement drain select gate electrodes and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of insulating layers and electrically conductive layers located over a substrate, drain-select-level electrically conductive strips located over the alternating stack, a drain-select-level isolation structure located between a neighboring pair of the drain-select-level electrically conductive strips, memory stack structures comprising a memory film and a vertical semiconductor channel vertically extending through the alternating stack and a respective one of the drain-select-level electrically conductive strips, wherein the memory stack structures contact, and are completely laterally surrounded by, a cylindrical sidewall of a respective one of the drain-select-level electrically conductive strips, and a contact level dielectric layer overlying the drain-select-level electrically conductive strips, the drain-select-level isolation structure and the memory stack structures, wherein the contact level dielectric layer contacts the drain-select-level isolation structure.

According to another aspect of the present disclosure, a method of forming a three-dimensional memory device is provided, which comprises: forming an alternating stack of insulating layers and spacer material layers over a substrate; forming a sacrificial matrix layer over the alternating stack; forming sacrificial pillar structures through the sacrificial matrix layer and the alternating stack; replacing at least the sacrificial matrix layer with a combination of a patterned template structure and an insulating cap layer, wherein the patterned template structure comprises template material blocks that laterally surround an upper region of a respective subset of the sacrificial pillar structures and have a respective sidewall including a plurality of convex vertical sidewall segments; replacing the sacrificial pillar structures with memory opening fill structures comprising a memory film and a vertical semiconductor channel; forming drain-select-level cavities by removing an entirety of each of the template material blocks; and depositing at least one electrically conductive material within volumes of the drain-select-level cavities, to form drain-select-level electrically conductive strips.

According to yet another aspect of the present disclosure, a three-dimensional memory device is illustrated, which comprises: an alternating stack of insulating layers and electrically conductive layers located over a substrate; drain-select-level electrically conductive strips located over the alternating stack, wherein each of the drain-select-level electrically conductive strips comprises a combination of at least one metallic material portion and a doped semiconductor spacer; a drain-select-level isolation structure located between a neighboring pair of drain-select-level electrically conductive strips; memory stack structures comprising a memory film and a vertical semiconductor channel vertically extending through the alternating stack and a respective one of the drain-select-level electrically conductive strips; and drain regions located on top of a respective one of the memory stack structures.

According to still another aspect of the present disclosure, a method of forming a three-dimensional memory device is provided, which comprises: forming an alternating stack of insulating layers and spacer material layers over a substrate; forming a sacrificial matrix layer over the alternating stack; forming sacrificial pillar structures through the sacrificial matrix layer and the alternating stack; replacing at least the sacrificial matrix layer with a combination of a patterned template structure, doped semiconductor spacers contacting sidewalls of the patterned template structure, and an insulating cap layer; replacing the sacrificial pillar structures with memory opening fill structures; forming drain-select-level cavities by removing an entirety of each of the patterned template structure selective to materials of the doped semiconductor spacers and the insulating cap layer; and depositing at least one electrically conductive material within volumes of the drain-select-level cavities to form drain-select-level electrically conductive strips comprising a combination of a respective portion of the at least one deposited electrically conductive material and a respective pair of doped semiconductor spacers.

According to another aspect of the present disclosure, a method of forming a three-dimensional memory device includes forming an alternating stack of insulating layers and sacrificial material layers over a substrate, forming a patterned template structure around memory openings in a drain-select-level above the alternating stack, forming drain-select-level isolation structures in trenches in the patterned template structure, forming memory stack structures in the memory openings extending through the alternating stack, where each of the memory stack structures includes a memory film and a vertical semiconductor channel, replacing the sacrificial material layers with word lines, and separately replacing the patterned template structure with a drain select gate electrode.

According to an aspect of the present disclosure, a three-dimensional memory device is provided, which comprises: an alternating stack of insulating layers and electrically conductive layers located over a substrate; drain-select-level electrically conductive strips located over the alternating stack; a drain-select-level isolation structure located between a neighboring pair of the drain-select-level electrically conductive strips; and memory stack structures extending through the alternating stack and the drain-select-level electrically conductive strips and comprising a respective vertical semiconductor channel vertically extending through the alternating stack and a respective one of the drain-select-level electrically conductive strips, wherein each vertical semiconductor channel comprises: a respective first vertically-extending portion extending through levels of the electrically conductive layers and having a first maximum lateral channel dimension; and a respective second vertically-extending portion located at a level of the drain-select-level conductive strips and having a second maximum lateral channel dimension that is less than the first maximum lateral channel dimension.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming sacrificial pillar structures extending through the alternating stack and including a respective upper region that protrudes above the alternating stack and having a first maximum lateral dimension and a respective lower region embedded within the alternating stack and having a second maximum lateral dimension that is greater than the first maximum lateral dimension; forming a combination of a patterned template structure and dielectric material portions over the alternating stack and around the upper regions of the sacrificial pillar structures, wherein the patterned template structure comprises template material blocks that laterally surround upper regions of a respective subset of the sacrificial pillar structures and have a respective sidewall including a plurality of convex vertical sidewall segments; replacing the sacrificial pillar structures with memory opening fill structures comprising a memory film and a vertical semiconductor channel; and replacing the template material blocks with drain-select-level electrically conductive strips.

BRIEF DESCRIPTION OF THE DRAWINGS

FIG. 9 is a perspective view of the upper region of the first exemplary structure after depositing a conformal template material liner comprising a dielectric material according to the first embodiment of the present disclosure.

FIG. 10 is a perspective view of the upper region of the first exemplary structure after anisotropically etching the conformal template material liner and the patterned template structure according to the first embodiment of the present disclosure.

FIGS. 13A-13E illustrate a region of the first exemplary structure that includes a memory opening during replacement of a sacrificial pillar structure with a memory opening fill structure according to the first embodiment of the present disclosure.

FIGS. 15A-15E illustrate a region of the first exemplary structure that includes memory openings and a backside trench during replacement of in-process source-level material layers with source-level material layers according to the first embodiment of the present disclosure.

FIG. 17 is a perspective view of the upper region of the first exemplary structure after formation of electrically conductive layers according to the first embodiment of the present disclosure.

FIG. 18 is a perspective view of the upper region of the first exemplary structure after formation of a dielectric wall structure in the backside trench and removal of a horizontal portion of the insulating cap layer according to the first embodiment of the present disclosure.

FIG. 28 is a perspective view of the upper region of the second exemplary structure after formation of electrically conductive layers according to the second embodiment of the present disclosure.

FIG. 29 is a perspective view of the upper region of the second exemplary structure after formation of a dielectric wall structure in the backside trench and removal of a horizontal portion of the insulating cap layer according to the second embodiment of the present disclosure.

FIG. 34A is a top-down view of a region of the third exemplary structure after removal of the sacrificial matrix layer according to the third embodiment of the present disclosure.

FIG. 34B is a vertical cross-sectional view of the third exemplary structure of FIG. 34A along the vertical plane B-B'.

FIG. 35A is a top-down view of a region of the third exemplary structure after conversion of surface portions of the sacrificial pillar structures into semiconductor oxide portions according to the third embodiment of the present disclosure.

FIG. 35B is a vertical cross-sectional view of the third exemplary structure of FIG. 35A along the vertical plane B-B'.

FIG. 36A is a top-down view of a region of the third exemplary structure after removal of the semiconductor oxide portions according to the third embodiment of the present disclosure.

FIG. 36B is a vertical cross-sectional view of the third exemplary structure of FIG. 36A along the vertical plane B-B'.

FIG. 38A is a top-down view of a region of the third exemplary structure after formation of drain-select-level line trenches according to the third embodiment of the present disclosure.

FIG. 38B is a vertical cross-sectional view of the third exemplary structure of FIG. 38A along the vertical plane B-B'.

FIG. 39A is a top-down view of a region of the third exemplary structure after formation of a second template material layer according to the third embodiment of the present disclosure.

FIG. 39B is a vertical cross-sectional view of the third exemplary structure of FIG. 39A along the vertical plane B-B'.

FIG. 40A is a top-down view of a region of the third exemplary structure after formation of a patterned template structure according to the third embodiment of the present disclosure.

FIG. 40B is a vertical cross-sectional view of the third exemplary structure of FIG. 40A along the vertical plane B-B'.

FIG. 42A is a top-down view of a region of the third exemplary structure after formation of cavities in the memory openings through removal of the sacrificial pillar structures according to the third embodiment of the present disclosure.

FIG. 42B is a vertical cross-sectional view of the third exemplary structure of FIG. 42A along the vertical plane B-B'.

FIG. 43A is a top-down view of a region of the third exemplary structure after formation of a cover material layer according to the third embodiment of the present disclosure.

FIG. 43B is a vertical cross-sectional view of the third exemplary structure of FIG. 43A along the vertical plane B-B'.

FIG. 44A is a top-down view of a region of the third exemplary structure after formation of cylindrical cover material portions by anisotropically etching the cover material layer according to the third embodiment of the present disclosure.

FIG. 44B is a vertical cross-sectional view of the third exemplary structure of FIG. 44A along the vertical plane B-B'.

FIG. 47A is a top-down view of a region of the third exemplary structure after formation of tunneling dielectrics, dielectric cores, core cavities, and drain semiconductor material portions according to the third embodiment of the present disclosure.

FIG. 47B is a vertical cross-sectional view of the third exemplary structure of FIG. 47A along the vertical plane B-B'.

FIG. 48A is a top-down view of a region of the third exemplary structure after formation of drain implant dopant regions according to the third embodiment of the present disclosure.

FIG. 48B is a vertical cross-sectional view of the third exemplary structure of FIG. 48A along the vertical plane B-B'.

FIG. 49A is a top-down view of a region of the third exemplary structure after formation of drain regions and replacement of sacrificial material layers and the patterned template structure with electrically conductive layers and drain-select-level electrically conductive strips according to the third embodiment of the present disclosure.

FIG. 49B is a vertical cross-sectional view of the third exemplary structure of FIG. 49A along the vertical plane B-B'.

FIG. 50A is a top-down view of a region of the third exemplary structure after formation of memory films, dielectric cores, core cavities, and drain semiconductor material portions according to an alternative configuration of the third embodiment of the present disclosure.

FIG. 50B is a vertical cross-sectional view of the third exemplary structure of FIG. 50A along the vertical plane B-B'.

FIG. 52A is a horizontal cross-sectional view of a region of the third exemplary structure after formation of drain regions and replacement of sacrificial material layers and the patterned template structure with electrically conductive layers and drain-select-level electrically conductive strips according to the alternative configuration of the third embodiment of the present disclosure.

FIG. 52B is a vertical cross-sectional view of the third exemplary structure of FIG. 52A along the vertical plane B-B'. The horizontal plane A-A' is the plane of the horizontal cross-sectional view of FIG. 52A.

DETAILED DESCRIPTION

Figure 1A:
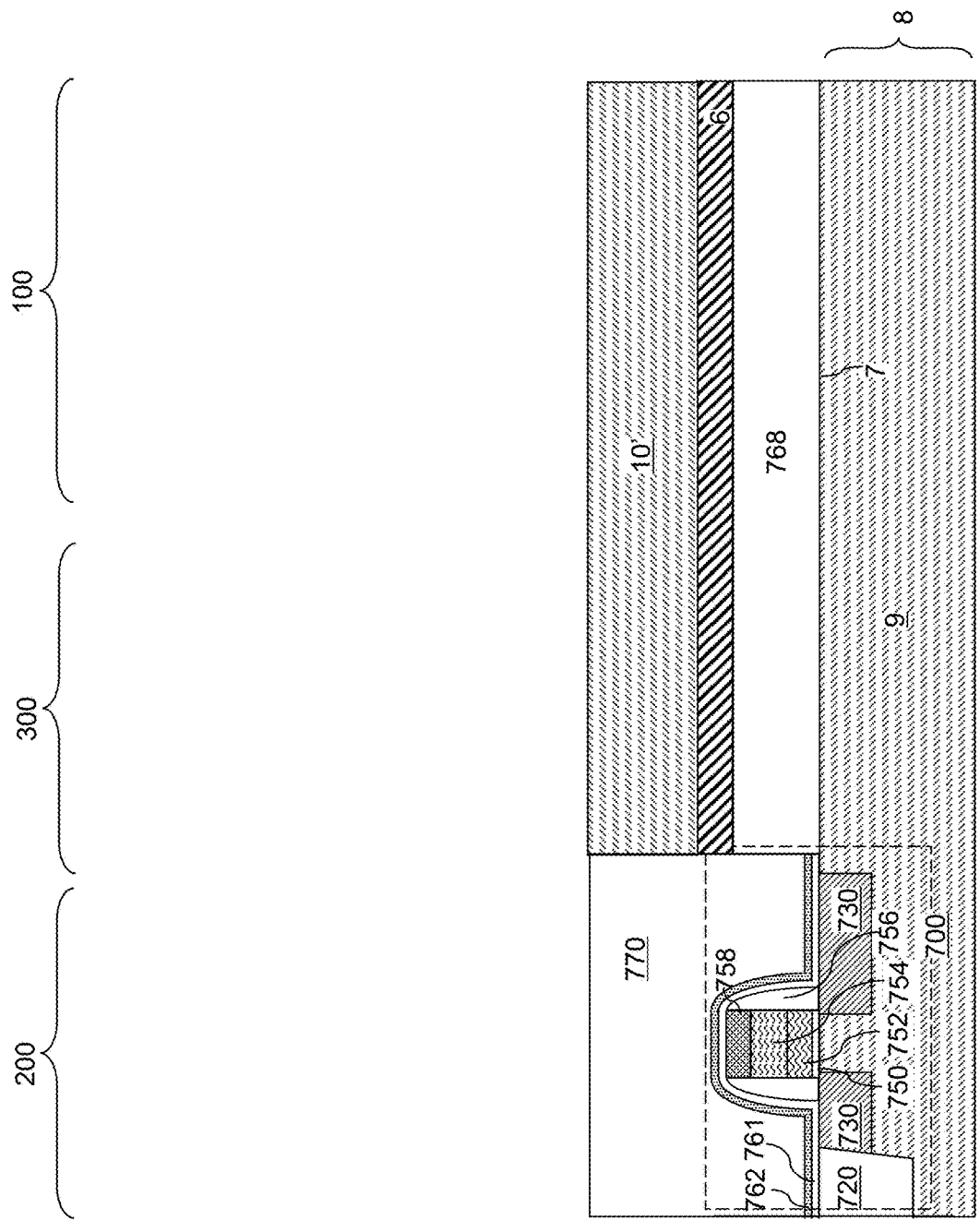
FIG. 1A is a schematic vertical cross-sectional view of a first exemplary structure after formation of at least one peripheral device, an insulating layer, a buried conductive layer, and in-process source-level material layers according to a first embodiment of the present disclosure.

As discussed above, the present disclosure is directed to a three-dimensional memory device including replacement drain select gate electrodes and self-aligned drain-select-level isolation structures and methods of manufacturing the same, the various aspects of which are described below. The replacement drain select gate electrodes and self-aligned drain-select-level isolation structures provide a more compact device layout and reduced chip size, as well as provide a simpler, less costly self aligned fabrication process. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first", "second", and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
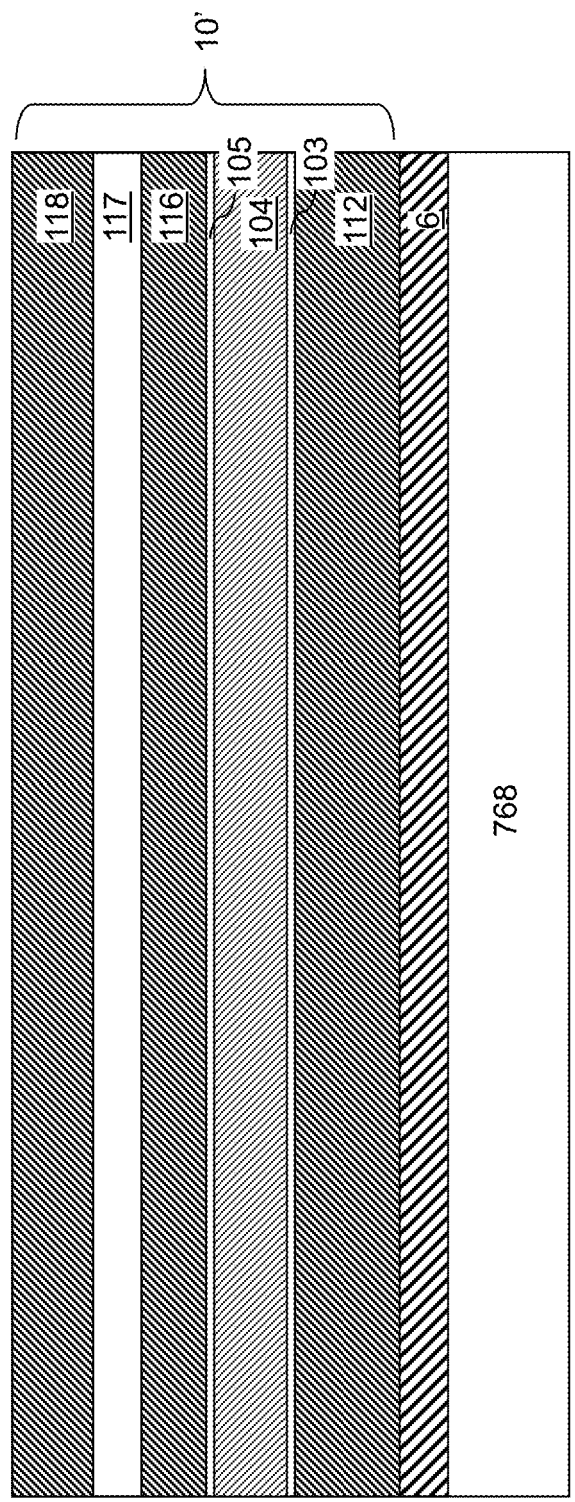
FIG. 1B is a vertical cross-sectional view of a layer stack of the insulating layer, the buried conductive layer, and the in-process source-level material layer of FIG. 1A.

Referring to FIGS. 1A and 1B, a first exemplary structure according to a first embodiment of the present disclosure is illustrated, which can be employed, for example, to fabricate a device structure containing vertical NAND memory devices. The first exemplary structure includes a substrate 8, such as a silicon wafer or a silicon on insulator substrate, for example. The substrate 8 can include a substrate semiconductor layer 9 in an upper portion thereof. The substrate semiconductor layer 9 may be an upper portion of the silicon wafer 8, a doped well in the upper portion of the silicon wafer 8, or a semiconductor (e.g., silicon) layer located over a top surface of the substrate. The substrate 8 can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device. A dielectric material such as silicon oxide can be deposited over the at least one semiconductor device, and can be subsequently planarized to form a planarization dielectric layer 770. The region including the at least one semiconductor device 700 is herein referred to as a peripheral device region 200.

A dielectric material layer 768 can be formed over the substrate semiconductor layer 9. The dielectric material layer 768 may include a single dielectric material layer or a plurality of dielectric material layers. The dielectric material layer 768 may include any one or more of doped silicate glass, undoped silicate glass, and organosilicate glass. In one embodiment, the at least one dielectric material layer 768 can comprise, or consist essentially of, dielectric material layers having dielectric constant that does not exceed the dielectric constant of undoped silicate glass (silicon oxide) of 3.9.

An optional layer of a metallic material and a layer of a semiconductor material can be deposited over, or within patterned recesses of, the dielectric material layer 768, and are lithographically patterned to provide an optional conductive plate layer 6 and in-process source-level material layers 10'. As used herein, an "in-process" element refers to an element that is modified during a subsequent processing step. The optional conductive plate layer 6, if present, provides a high conductivity conduction path for electrical current that flows into, or out of, the in-process source-level material layers 10'. The optional conductive plate layer 6 includes a conductive material such as a metal, metal silicide, or a heavily doped semiconductor material. The optional conductive plate layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 can include a metallic compound material such as a conductive metallic silicide or nitride (e.g., TiN) and/or a metal (e.g., W). The thickness of the optional conductive plate layer 6 may be in a range from 5 nm to 100 nm, although lesser and greater thicknesses can also be employed.

The in-process source-level material layers 10' can include various layers that are subsequently modified to form source-level material layers. The source-level material layers, upon formation, include a source contact layer that functions as a common source region for vertical field effect transistors of a three-dimensional memory device. In one embodiment, the in-process source-level material layer 10' can include, from bottom to top, a lower source-level material layer 112, a lower sacrificial liner 103, a source-level sacrificial layer 104, an upper sacrificial liner 105, an upper source-level material layer 116, a source-level insulating layer 117, and an optional source-select-level conductive layer 118.

The lower source-level material layer 112 and the upper source-level material layer 116 can include a doped semiconductor material such as doped polysilicon or doped amorphous silicon. The conductivity type of the lower source-level material layer 112 and the upper source-level material layer 116 can be the opposite of the conductivity of vertical semiconductor channels to be subsequently formed. For example, if the vertical semiconductor channels to be subsequently formed have a doping of a first conductivity type, the lower source-level material layer 112 and the upper source-level material layer 116 have a doping of a second conductivity type that is the opposite of the first conductivity type. The thickness of each of the lower source-level material layer 112 and the upper source-level material layer 116 can be in a range from 10 nm to 300 nm, such as from 20 nm to 150 nm, although lesser and greater thicknesses can also be employed.

The source-level sacrificial layer 104 includes a sacrificial material that can be removed selective to the lower sacrificial liner 103 and the upper sacrificial liner 105. In one embodiment, the source-level sacrificial layer 104 can include a semiconductor material such as undoped amorphous silicon, polysilicon, or a silicon-germanium alloy with an atomic concentration of germanium greater than 20%. The thickness of the source-level sacrificial layer 104 can be in a range from 30 nm to 400 nm, such as from 60 nm to 200 nm, although lesser and greater thicknesses can also be employed.

The lower sacrificial liner 103 and the upper sacrificial liner 105 include materials that can function as an etch stop material during removal of the source-level sacrificial layer 104. For example, the lower sacrificial liner 103 and the upper sacrificial liner 105 can include silicon oxide, silicon nitride, and/or a dielectric metal oxide. In one embodiment, each of the lower sacrificial liner 103 and the upper sacrificial liner 105 can include a silicon oxide layer having a thickness in a range from 2 nm to 30 nm, although lesser and greater thicknesses can also be employed.

The source-level insulating layer 117 includes a dielectric material such as silicon oxide. The thickness of the source-level insulating layer 117 can be in a range from 20 nm to 400 nm, such as from 40 nm to 200 nm, although lesser and greater thicknesses can also be employed. The optional source-select-level conductive layer 118 can include a conductive material that can be employed as a source-select-level gate electrode. For example, the optional source-select-level conductive layer 118 can include a heavily doped semiconductor material such as heavily doped polysilicon or doped amorphous silicon that can be subsequently converted into doped polysilicon by an anneal process. The thickness of the optional source-level conductive layer 118 can be in a range from 30 nm to 200 nm, such as from 60 nm to 100 nm, although lesser and greater thicknesses can also be employed.

The in-process source-level material layers 10' can be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface 7 of the substrate 8).

The optional conductive plate layer 6 and the in-process source-level material layers 10' may be patterned to provide openings in areas in which through-memory-level contact via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed. Thus, regions in which the in-process source-level material layers 10' are present include a memory array region 100 in which memory devices are to be subsequently formed and a contact region 300 in which stepped surfaces and contact via structures contacting various electrically conductive layers are to be subsequently formed.

Figure 2A:
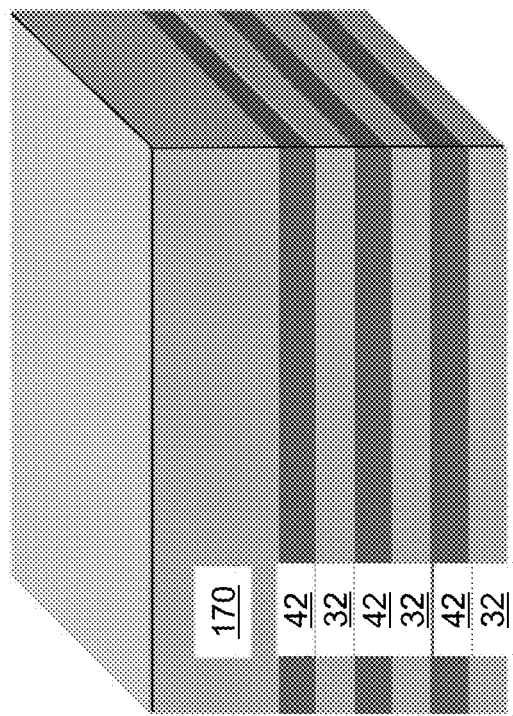
FIG. 2A is a perspective view of an upper region of the first exemplary structure after formation of an alternating stack of insulating layers and spacer material layers and a sacrificial matrix layer according to the first embodiment of the present disclosure.
Figure 2B:
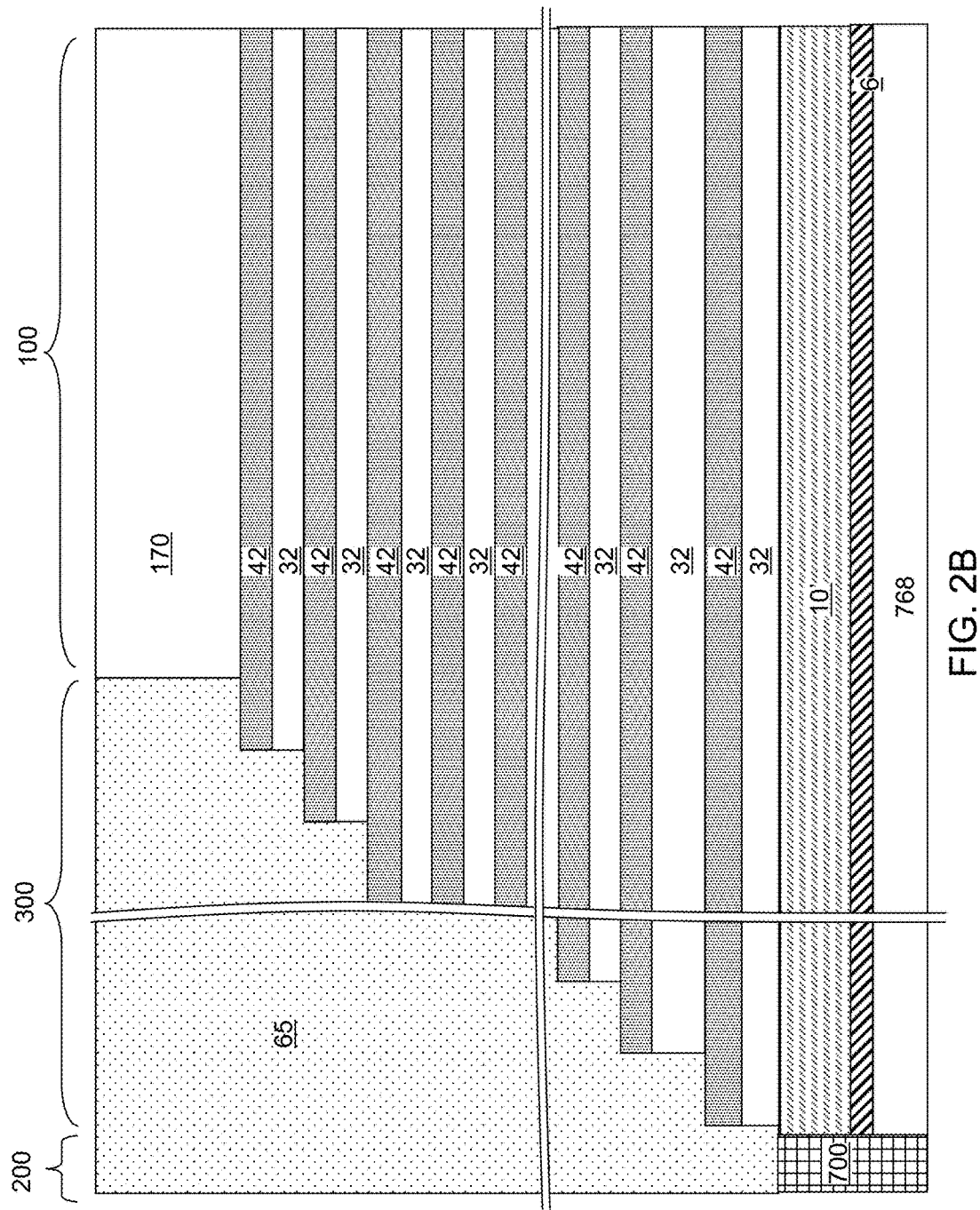
FIG. 2B is a vertical cross-sectional view of the first exemplary structure of FIG. 2A.

Referring to FIGS. 2A and 2B, a stack of an alternating plurality of first material layers (which can be insulating layers 32) and second material layers (which can be sacrificial material layer 42) is formed over the top surface of the substrate 8. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

A sacrificial matrix layer 170 can be formed over the alternating stack (32, 42). The sacrificial matrix layer 170 includes a sacrificial material that is different from the material of the sacrificial material layers 42. In one embodiment, the sacrificial matrix layer 170 can include a silicate glass material such as undoped silicate glass or a doped silicate glass. Examples of doped silicate glasses include borosilicate glass, phosphosilicate glass, borophosphosilicate glass, and organosilicate glass. The sacrificial matrix layer 170 can be formed by a chemical vapor deposition process. For example, tetraethylorthosilicate (TEOS) can be thermally decomposed in the present or absence of dopant gases to form a doped silicate glass or an undoped silicate glass. The thickness of the sacrificial matrix layer 170 can be in a range from 50 nm to 300 nm, although lesser and greater thicknesses can also be employed.

A stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the sacrificial matrix layer 170 and the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the sacrificial matrix layer 170 and the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the topmost surface of the sacrificial matrix layer 170, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 3A:
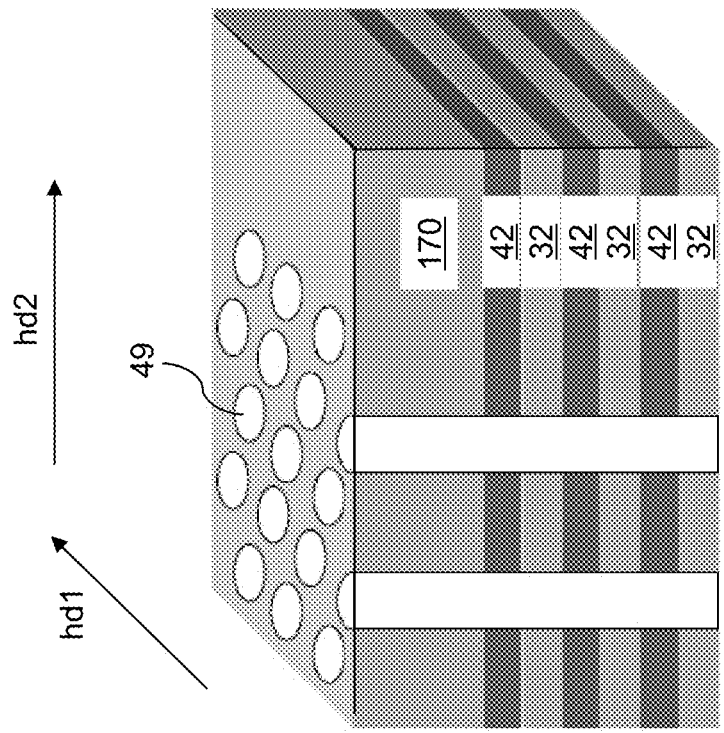
FIG. 3A is a perspective view of the upper region of the first exemplary structure after formation of memory openings and optional support openings according to the first embodiment of the present disclosure.
Figure 3B:
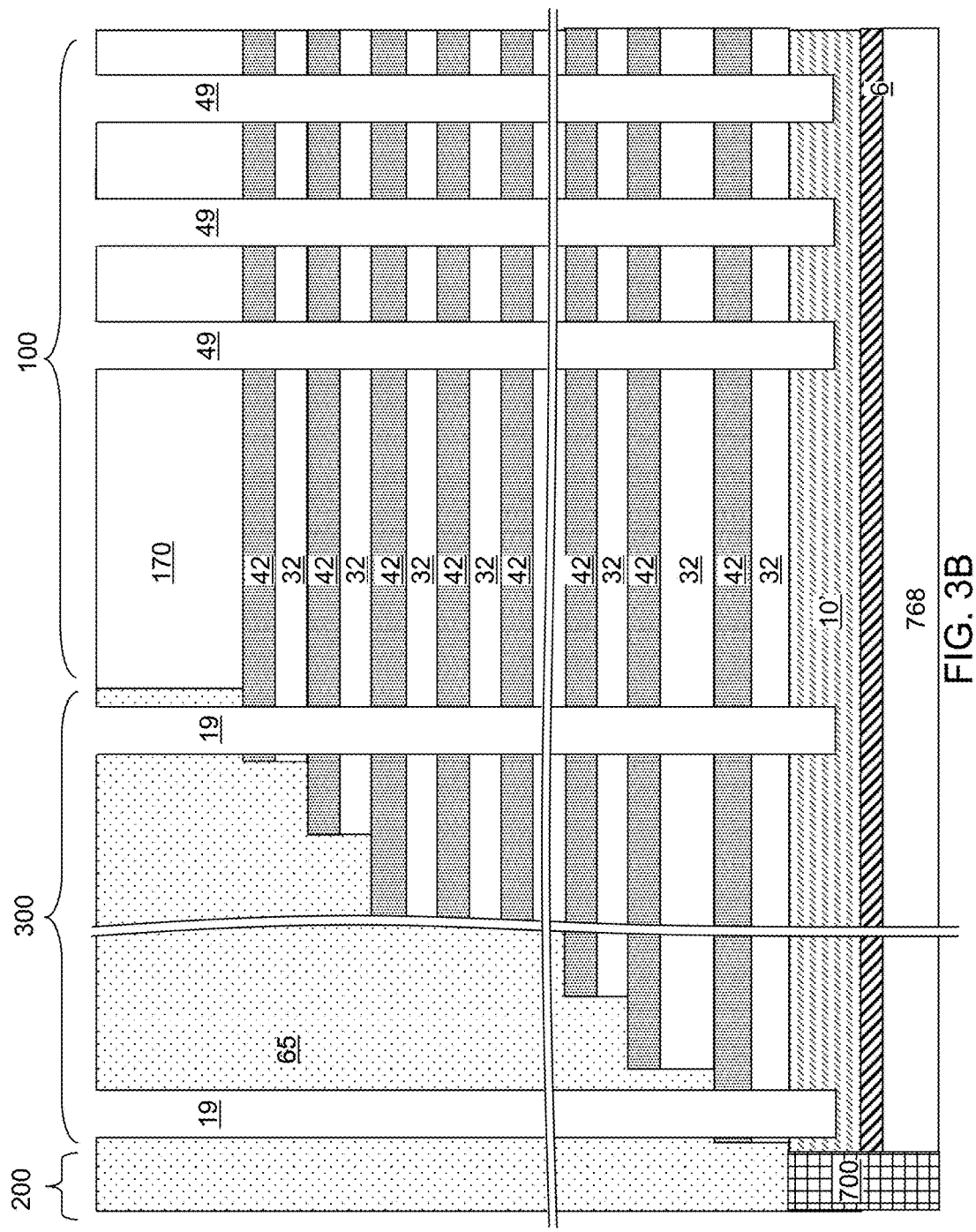
FIG. 3B is a vertical cross-sectional view of the first exemplary structure of FIG. 3A.

Referring to FIGS. 3A and 3B, a lithographic material stack (not shown) including at least a photoresist layer can be formed over the sacrificial matrix layer 170, and can be lithographically patterned to form openings therein. The openings include a first set of openings formed over the memory array region 100 and a second set of openings formed over the contact region 300. The pattern in the lithographic material stack can be transferred through the sacrificial matrix layer 170, the alternating stack (32, 42), and the retro-stepped dielectric material portion 65 by at least one anisotropic etch that employs the patterned lithographic material stack as an etch mask.

Portions of the sacrificial matrix layer 170 and the alternating stack (32, 42) underlying the openings in the patterned lithographic material stack within the memory array region 100 are etched to form memory openings 49. Portions of the sacrificial matrix layer 170, the alternating stack (32, 42), and the retro-stepped dielectric material portion 65 underlying the openings in the patterned lithographic material stack within the contact region 300 are etched to form support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surfaces of the sacrificial matrix layer 170 to the lower source-level material layer 112 in the in-process source-level material layers 10. In one embodiment, an overetch into the lower source-level material layer 112 may be optionally performed after the top surface of the lower source-level material layer 112 is physically exposed at a bottom of each memory opening 49 and each support opening 19. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the lower source-level material layer 112.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

The memory openings 49 can be arranged in groups such that each group includes a plurality of rows of memory openings 49. Within each group of memory openings 49, the memory openings 49 can be arranged as rows that extend along the first horizontal direction hd1. The multiple rows can be spaced apart along the second horizontal direction hd2 that is perpendicular to the first horizontal direction hd1 with a uniform inter-row pitch for an entirety of the group of memory openings 49. In this case, the rows of memory openings 49 are "on-pitch," i.e., have a uniform pitch, along the second horizontal direction.

Figure 4:
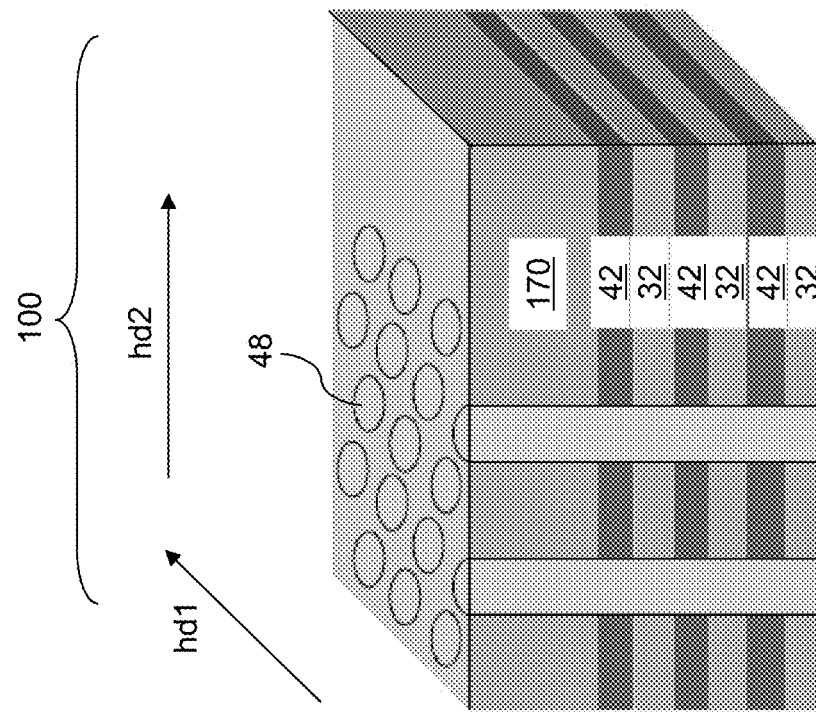
FIG. 4 is a perspective view of the upper region of the first exemplary structure after formation of sacrificial pillar structures according to the first embodiment of the present disclosure.

Referring to FIG. 4, a thin sacrificial liner (such as a silicon oxide liner having a thickness less than 2 nm) can be deposited in the memory openings 49 and the support openings 19. A sacrificial fill material can be deposited in the memory openings 49 and the support openings 19. The sacrificial fill material can be different from the materials of the sacrificial matrix layer 170, the insulating layers 32, and the sacrificial material layers 42. For example, the sacrificial fill material can include a semiconductor material such as amorphous silicon, polysilicon, or a silicon-germanium alloy. The sacrificial fill material can be deposited in the memory openings 49 and the support openings 19 by a conformal deposition process such as low pressure chemical vapor deposition (LPCVD) process. Excess portions of the sacrificial fill material can be removed from above the top surface of the sacrificial matrix layer 170 by a planarization process, which can include a recess etch process or a chemical mechanical planarization (CMP) process. Each remaining portion of the fill material in the memory openings 49 and the support openings 19 constitute a sacrificial pillar structure 48. Each sacrificial pillar structure 48 can have a top surface within the horizontal plane of the top surface of the sacrificial matrix layer 170. The sacrificial pillar structures 48 filling the memory openings 49 can have the same periodicity as the memory openings. The sacrificial pillar structures 48 are formed through the sacrificial matrix layer 170 and the alternating stack (32, 42).

Figure 5:
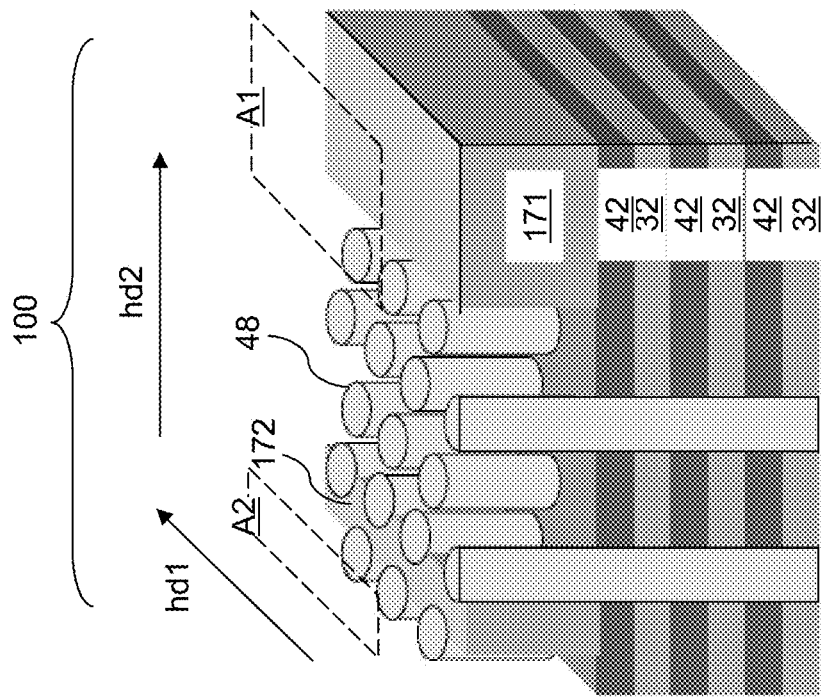
FIG. 5 is a perspective view of the upper region of the first exemplary structure after patterning the sacrificial matrix layer into sacrificial matrix portions according to the first embodiment of the present disclosure.

Referring to FIG. 5, a photoresist layer (not shown) can be applied over the first exemplary structure, and can be patterned by lithographic exposure and development to cover multiple areas within the memory array region 100. The multiple areas covered by the patterned photoresist layer can include rectangular areas having lengthwise sides that are parallel to the first horizontal direction hd1 and having widthwise sides that are parallel to the second horizontal direction hd2. For example, portions of the patterned photoresist layer can cover first areas A1 located between a respective neighboring pair of groups of sacrificial pillar structures 48 in the memory array region 100. Each first area A1 can be a rectangular area having a pair of lengthwise sides that are parallel to the first horizontal direction hd1 and a pair of widthwise sides that are parallel to the second horizontal direction hd2. The first areas A1 can be spaced among one another along the second horizontal direction by groups of sacrificial pillar structures 48. Each group of sacrificial pillar structures 48 can be located between a neighboring pair of first areas A1. Each group of sacrificial pillar structures 48 can include multiple rows of sacrificial pillar structures 48 that extend along the first horizontal direction hd1 and laterally spaced apart with a uniform pitch along the second horizontal direction hd2. In one embodiment, each group of sacrificial pillar structures 48 can be in a two-dimensional periodic array, which may be a hexagonal array.

Further, portions of the patterned photoresist layer can cover second areas A2 located between a respective neighboring pair of rows of sacrificial pillar structures 48 within a respective group of sacrificial pillar structures 48. Each second area A2 can be a rectangular strip of an area located between a neighboring pair of rows of sacrificial pillar structures 48. Each second area A2 can be a rectangular area having a pair of lengthwise sides that are parallel to the first horizontal direction hd1 and a pair of widthwise sides that are parallel to the second horizontal direction hd2. The width of each second area A2 along the second horizontal direction hd2 can be less than the center-to-center distance between the neighboring pair of rows of sacrificial pillar structures 48. A single second area A2 or a plurality of second areas A2 may be present between each neighboring pair of first areas A1.

The patterned photoresist layer includes openings in areas that are complementary to the first and second areas (A1, A2). The sacrificial matrix layer 170 can be patterned into sacrificial matrix portions (171, 172) employing a combination of the patterned photoresist layer and the sacrificial pillar structures 48 as an etch mask. Specifically, unmasked regions of the sacrificial matrix layer 170 can be anisotropically etched employing an etch chemistry that is selective to the material of the sacrificial pillar structures 48 and the photoresist layer. For example, if the sacrificial pillar structures 48 include amorphous silicon and if the sacrificial matrix layer 170 includes a silicate glass material, a plasma of at least one etchant gas or gas mixture selected from $CHF_3/O_2$, $C_2F_6$, $C_3F_8$, and $C_5F_8/CO/O_2/Ar$ can be employed to anisotropically etch silicon oxide selective to silicon. The sacrificial matrix layer 170 can be etched through in each area that is not covered by the photoresist layer.

Figure 6:
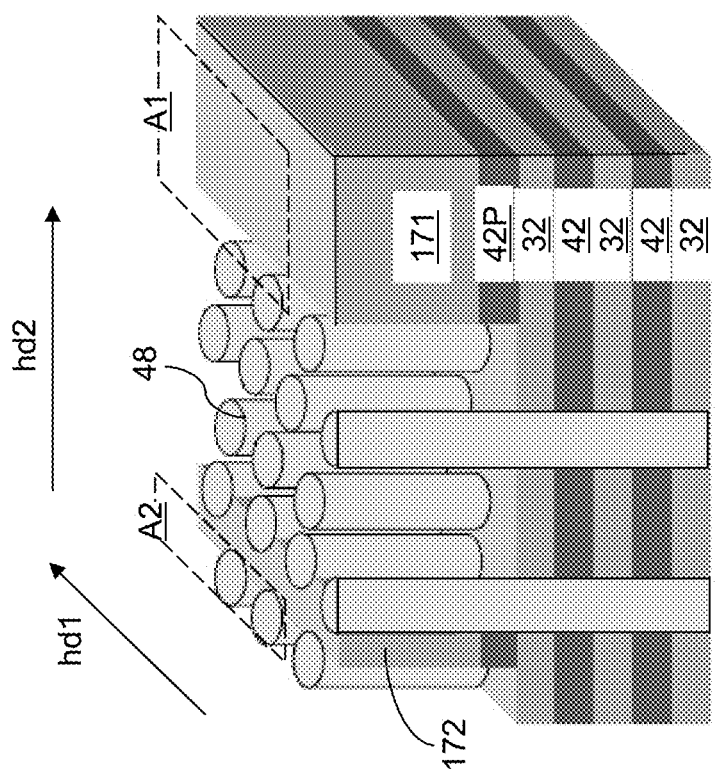
FIG. 6 is a perspective view of the upper region of the first exemplary structure after anisotropically etching a topmost spacer material layer according to the first embodiment of the present disclosure.

Referring to FIG. 6, the topmost sacrificial material layer 42 may be optionally etched. In case unmasked areas of the topmost sacrificial material layer 42 are etched through, the chemistry of the anisotropic etch process can be changed to anisotropically etch the material of the topmost sacrificial material layer 42 selective to the material of the insulating layers 32. For example, if the sacrificial material layers 42 include silicon nitride, the chemistry of the anisotropic etch process can be changed to etch the silicon nitride material of the sacrificial material layers 42 selective to a silicon oxide material of the underlying insulating layer 32. In this case, the topmost sacrificial material layer 42 can be patterned into sacrificial material portions 42P.

A first sacrificial matrix portion 171 is present within each first area A1 after the anisotropic etch process. The area of each first sacrificial matrix portion 171 can be substantially the same as the area of an overlying portion of the photoresist layer. A second sacrificial matrix portion 172 is present within each second area A2 after the anisotropic etch process. The area of each second sacrificial matrix portion 172 can be less than the area of an overlying portion of the photoresist layer by the combined overlap areas between the overlying portion of the photoresist layer and a neighboring pair of rows of the sacrificial pillar structures 48 that contact the second sacrificial matrix portion 172. The photoresist layer can be subsequently removed, for example, by ashing. A recess region is formed within each area from which a portion of the sacrificial matrix layer 170 is removed. Each recess region is surrounded by remaining portions (171, 172) of the sacrificial matrix layer 170.

Each first sacrificial matrix portion 171 can have a pair of lengthwise sidewalls that laterally extend along the first horizontal direction. In one embodiment, the entirety of each lengthwise sidewall may be planar, i.e., located within a two-dimensional Euclidian plane. The plane of each lengthwise sidewall of the first sacrificial matrix portions 171 can be vertical and parallel among one another. Alternatively, the lengthwise sidewalls of the first sacrificial matrix portions 171 may be tapered with respective to a vertical direction, which is perpendicular to the top surface of the topmost insulating layer 32.

Each second sacrificial matrix portion 172 can have a pair of sidewalls that generally extend along the first horizontal direction hd1. As used herein, an element "generally extends" along a specific direction if the overall direction of extension of the element includes the specific direction. Each sidewall of the second sacrificial matrix portions 172 that generally extend along the first horizontal direction hd1 can have a respective laterally alternating sequences of planar vertical sidewall segments and concave vertical sidewall segments. As used herein, a "substantially vertical" surface refers to a surface that extends generally along a vertical direction with a tilt angle of less than 5 degrees from the vertical direction. As used herein, a "planar vertical" surface refers to a surface that is contained within a two-dimensional Euclidean plane that is vertical or substantially vertical. As used herein, a "concave vertical" surface refers to a vertical or substantially vertical surface that is convex at any height. As used herein, a "convex vertical" surface refers to a vertical or substantially vertical surface that is concave at any height.

Sidewalls of upper end portions of the sacrificial pillar structures 48 can be at least partially exposed. Specifically, a respective first subset of the sacrificial pillar structures 48 can protrude within each recess region and does not contact any of the sacrificial matrix portions (171, 172). The portions of the sidewalls of the first subsets of the sacrificial pillar structures 48 that extend above the top surface of the topmost insulating layer 32 may be completely physically exposed. A respective second subset of the sacrificial pillar structures 48 contacts a respective concave vertical surface of the second sacrificial matrix portion 172, which is a remaining portion of the sacrificial material layer 170. Sacrificial pillar structures 48 within each second subset are arranged in two neighboring rows that extend along the first horizontal direction hd1, and have sidewalls that are physically exposed to a respective one of the recess regions on one side and contact a respective second sacrificial matrix portion 172 on the other side.

Figure 7:
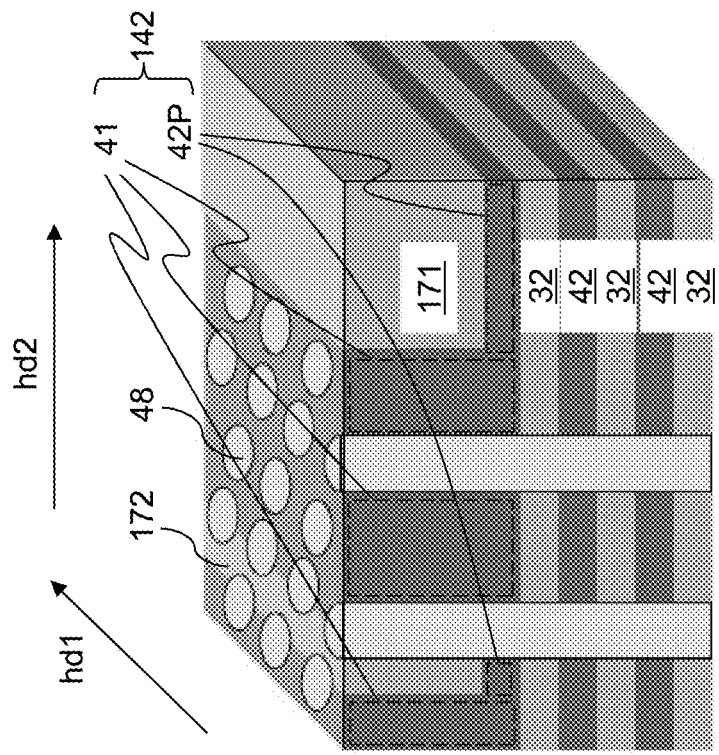
FIG. 7 is a perspective view of the upper region of the first exemplary structure after formatting a first template material portion according to the first embodiment of the present disclosure.

Referring to FIG. 7, a first template material is deposited within each of the recess regions by a conformal deposition process. The first template material is different from the material of the first and second sacrificial material portions (171, 172), and may be the same as, or may be different from, the material of the sacrificial material portions 42P. In one embodiment, the sacrificial material portions 42P can include silicon nitride, and the first template material can include silicon nitride. The first template material can be deposited by a conformal deposition process such as low pressure chemical vapor deposition (LPCVD). Excess portions of the first template material can be removed from above the top surface of the sacrificial material portions (171, 172) by a planarization process such as chemical mechanical planarization. First template material portions 41 are formed in the recess regions. The contiguous set of all of the first template material portions 41 (i.e., the remaining portions of the first template material) and the sacrificial material portions 42P constitutes a patterned template structure 142. In case the sacrificial material portions 42P and the deposited first template material comprise a same material (such as silicon nitride), the patterned template structure 142 can have the same material composition throughout. The top surfaces of the sacrificial pillar structures 48 can be coplanar with the top surfaces of the sacrificial material portions (171, 172) and the patterned template structure 142.

Figure 8:
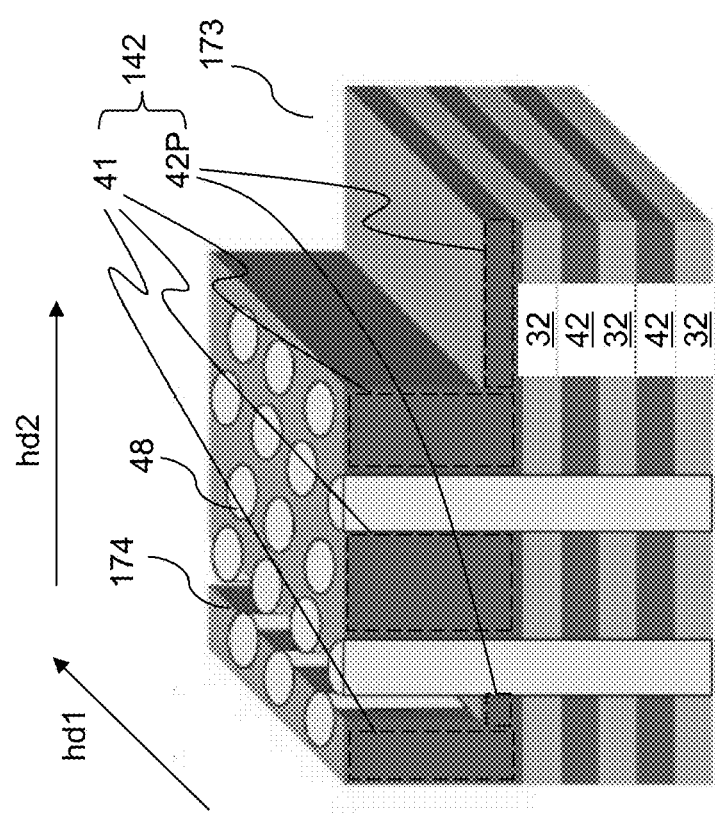
FIG. 8 is a perspective view of the upper region of the first exemplary structure after removing sacrificial matrix portions according to the first embodiment of the present disclosure.

Referring to FIG. 8, the sacrificial material portions (171, 172) can be removed selective to the materials of the patterned template structure 142, which can include the deposited template material and the material of the sacrificial material portions 42P (which are portions of the patterned template structure 142). For example, if the patterned template structure 142 comprises silicon nitride and if the sacrificial material portions (171, 172) include silicon oxide, the sacrificial material portions (171, 172) can be removed selective to the patterned template structure 142 by performing a wet etch process employing dilute hydrofluoric acid. Drain-select-level line trenches (173, 174) are formed in the volumes from which the sacrificial material portions (171, 172) are removed. The drain-select-level line trenches (173, 174) are line trenches that are formed at a drain select level, which is a level at which drain select gate electrodes are subsequently formed.

The drain-select-level line trenches (173, 174) can include straight drain-select-level line trenches 173 and contoured drain-select-level line trenches 174. The straight drain-select-level line trenches 173 are formed in volumes from which the first sacrificial material portions 171 are removed, and include a respective pair of straight sidewalls that extend along the first horizontal direction. The contoured drain-select-level line trenches 174 generally extend along the first horizontal direction hd1. Each contoured drain-select-level line trench 174 can have a pair of sidewalls including a respective alternating sequence of planar vertical sidewall segments and concave vertical sidewall segments. The planar vertical sidewall segments are physically exposed surface segments of the patterned template structure 142. The concave vertical sidewall segments are physically exposed surface segments of the sacrificial pillar structures 48.

Referring to FIG. 9, a conformal template material liner 144L can be deposited on the physically exposed surfaces of the patterned template structure 142 and the physically exposed surfaces of the sacrificial pillar structures 48 (e.g., in the drain-select-level line trenches (173, 174) and over the top surfaces of the patterned template structure 142 and the sacrificial pillar structures 48). The material of the conformal template material liner 144L may be the same as, or may be different from, the material(s) of the patterned template structure 142. The material of the conformal template material liner 144L is herein referred to as a second template material. The second template material is different from the material to be subsequently employed to form an insulating cap layer. In one embodiment, the conformal template material liner 144L includes a dielectric material such as silicon nitride. The conformal template material liner 144L can be deposited over the first template material portions 41 (i.e., portions of the first template material that are incorporated into the patterned template structure 142) and on physically exposed surfaces of the sacrificial pillar structures 48. In one embodiment, the first template material portions 41 and the conformal template material liner 144L comprise a same material (e.g., silicon nitride) that is different from the material (e.g., silicon oxide) of the insulating layers 32. In one embodiment, the patterned template structure 142 and the conformal template material liner 144L can comprise, and/or consist essentially of, silicon nitride. The conformal template material liner 144L can be deposited by a conformal deposition process such as low pressure chemical vapor deposition (LPCVD) process. The thickness of the conformal template material liner 144L can be in a range from 1 nm to 10 nm, such as from 2 nm to 6 nm, although lesser and greater thicknesses can also be employed.

Referring to FIG. 10, the conformal template material liner 144L and the patterned template structure 142 can be anisotropically etched, for example, by a reactive ion etch process. The anisotropic etch process can be selective to the material of the sacrificial pillar structures 48 and the insulating layers 32. For example, if the conformal template material liner 144L and the patterned template structure 142 include silicon nitride and if the sacrificial pillar structures 48 include a semiconductor material, an anisotropic etch employing $CHF_4/O_2$, $CF_4/O_2$, $SF_6$, or $SF_6/O_2$ with no or minimal ion assistance can be employed to provide selectivity with respect to silicon oxide. Horizontal portions of the conformal template material liner 144L are removed by the anisotropic etch process, and remaining vertical portions of the conformal template material liner 144L constitute the second template material portions 144. The second template material portions 144 are formed on sidewalls of each first template material portion 41 (which is a portion of the patterned template structure 142). In one embodiment, a pair of second template material portions 144 may be formed on a first template material portion 41.

The anisotropic etch removes horizontal portions 42P of the patterned template structure 142 that underlie the drain-select-level line trenches (173, 174). The drain-select-level line trenches (173, 174) are vertically extended by the anisotropic etch process, and the sacrificial material portions 42P within the patterned template structure 142 are removed by the anisotropic etch process. Thus, the patterned template structure 142 is divided into multiple discrete material portions that include the first template material portions 41.

The second template material portions 144 that are formed on the first template material portion 41 are incorporated into the remaining portions 41 of the patterned template structure 142. Each contiguous combination of a first template material portion 41 and at least one second template material portion 144 constitutes a template material block 145. The patterned template structure 142 after the anisotropic etch process includes a plurality of template material blocks 145 that are laterally spaced apart by the drain-select-level line trenches (173, 174). In one embodiment, the template material blocks 145 can be free of any semiconductor material.

The second template material portions 144 can be formed as spacers having a uniform lateral thickness. A subset of the second template material portions 144 that are formed at a periphery of a straight drain-select-level line trench 173 can have a pair of straight sidewalls that laterally extend along the first horizontal direction hd1. A subset of the second template material portions 144 formed at a periphery of a contoured drain-select-level line trench 174 can have an inner sidewall and an outer sidewall. The inner sidewall can have a laterally alternating sequence of planar vertical sidewall segments that contact a respective one of the first template material portion 41 and concave vertical sidewall segments that contact upper portions of sidewalls of a row of sacrificial pillar structures 48. The outer sidewall can have a set of convex vertical sidewall segments. In one embodiment, the outer sidewall can have a laterally alternating sequence of planar vertical sidewall segments and convex vertical sidewall segments that generally extends along the first horizontal direction hd1. In another embodiment, the outer sidewall can have convex vertical sidewall segments that are adjoined among one another at vertical edges. The convex vertical sidewall segments of the second template material portions 144 can be laterally spaced from a most proximal one of sidewalls of the sacrificial pillar structures 48 by a same uniform lateral spacing, which is the lateral thickness of the second template material portions 144. The remaining volume of each contoured drain-select-level line trench 174 defines a gap that laterally extends along the first horizontal direction hd1 and having a modulated width. The gap defined by the contoured drain-select-level line trench 174 is self-aligned to sidewalls of peripheral rows of the sacrificial pillar structures 48 that are located on either side of the contoured drain-select-level line trench 174. A top surface of the topmost insulating layer 32 can be physically exposed at the bottom of each of the drain-select-level line trenches (173, 174). The top surfaces of the patterned template structure 142 can be vertically recessed with respect to the top surfaces of the sacrificial pillar structures 48.

Figure 11:
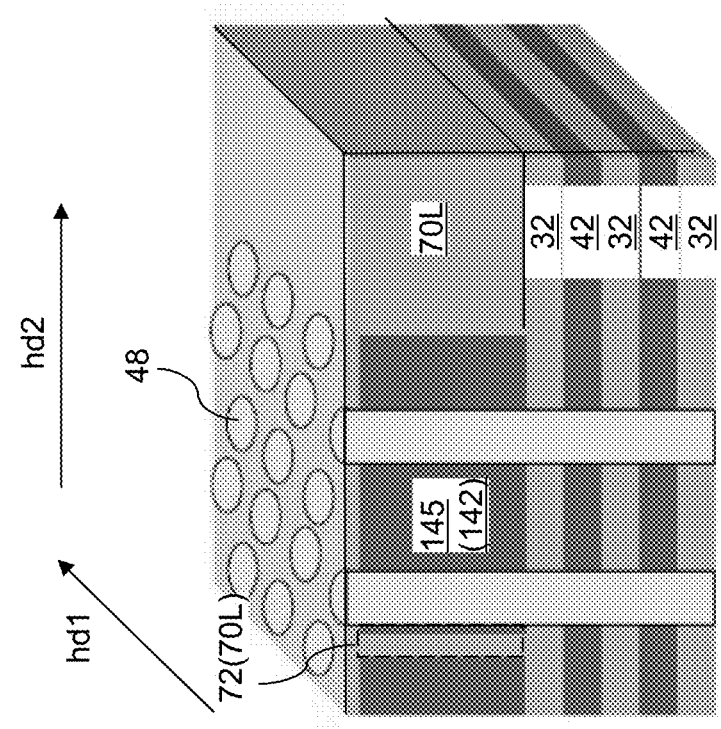
FIG. 11 is a perspective view of the upper region of the first exemplary structure after formation of an insulating cap layer according to the first embodiment of the present disclosure.

Referring to FIG. 11, a dielectric material can be deposited in the drain-select-level line trenches (173, 174) and over the patterned template structure 142 (i.e., the template material blocks 145), and can be planarized to form an insulating cap layer 70L. The dielectric material of the insulating cap layer 70L is different from the material of the patterned template structure 142. In one embodiment, the dielectric material of the patterned template structure 142 can include silicon nitride, and the dielectric material of the insulating cap layer 70L can include undoped silicate glass or a doped silicate glass. The dielectric material of the insulating cap layer 70L can be deposited by a conformal deposition process such as chemical vapor deposition, or can be deposited by a self-planarizing process such as spin coating. Excess portions of the deposited dielectric material can be removed from above the horizontal plane including the top surfaces of the sacrificial pillar structures 48 by a planarization process, which can include chemical mechanical planarization. Each portion of the insulating cap layer 70L that fills the contoured drain-select-level line trenches 174 is herein referred to as a drain-select-level isolation structure 72. In one embodiment, the top surface of the insulating cap layer 70L can be coplanar with the top surfaces of the sacrificial pillar structures 48.

At least the sacrificial matrix layer 170 can be replaced with a combination of the patterned template structure 142 and an insulating cap layer 70L by the processing steps FIGS. 3A and 3B through the processing steps of FIG. 11. In one embodiment, the combination of the topmost sacrificial material layer 42 and the sacrificial matrix layer 170 can be replaced with combination of the patterned template structure 142 and an insulating cap layer 70L. The patterned template structure 142 comprises template material blocks 145 that laterally surround an upper region of a respective subset of the sacrificial pillar structures 48 and have a respective sidewall including a plurality of convex vertical sidewall segments. The plurality of convex vertical sidewall segments of the patterned template structure 142 (i.e., of the template material blocks 145) contact a plurality of concave vertical sidewall segments of the drain-select-level isolation structures 72.

Figure 12:
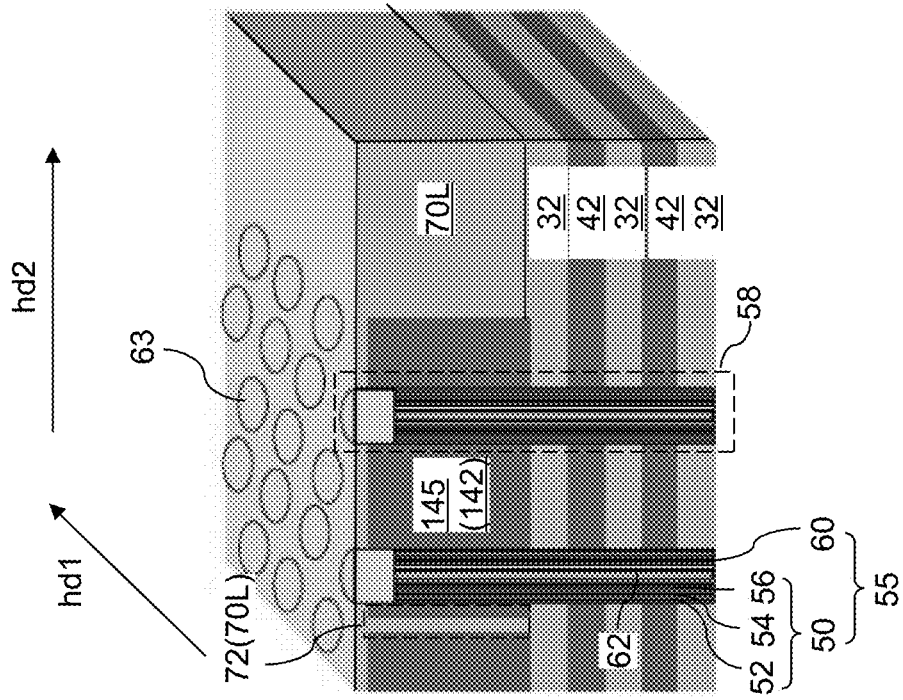
FIG. 12 is a perspective view of the upper region of the first exemplary structure after replacement of the sacrificial pillar structures with memory opening fill structures according to the first embodiment of the present disclosure.

Referring to FIG. 12, the sacrificial pillar structures 48 in the memory openings 49 can be replaced with memory opening fill structures 58 in the memory array region 100. Each memory opening fill structure 58 comprises a memory stack structure 55 and a drain region 63 overlying the memory stack structure 55. Sidewalls of the drain regions 63 contact sidewalls of the combination of the patterned template structure 142 (i.e., the template material blocks 145) and the insulating cap layer 70L. The sacrificial pillar structures 48 in the support openings 19 in the contact region 300 can be replaced with support pillar structures, which can be identical to the memory opening fill structures 58 except for locations and changes of lateral dimensions that may be induced by differences in the lateral dimensions of the support openings 19 with respective to the memory openings 49. The memory opening fill structures 58 include active device components that flow electrical current under electrical bias, while the support pillar structures are not electrically connected in a configuration that enables electrical current flow, and thus, function only as structural components that provide mechanical support in subsequent processing steps.

FIGS. 13A-13E illustrate a region of the first exemplary structure that includes a memory opening 49 during replacement of a sacrificial pillar structure 48 with a memory opening fill structure 58 according to the first embodiment of the present disclosure.

Referring to FIG. 13A, a sacrificial pillar structure 48 and any thin sacrificial liner (if present) can be removed from inside a memory opening 49. In case the sacrificial pillar structure 48 comprises a semiconductor material such as amorphous silicon, the sacrificial pillar structure 48 can be removed by a wet etch process employing hot trimethyl-2 hydroxyethyl ammonium hydroxide ("hot TMY") or tetramethyl ammonium hydroxide (TMAH). If a thin sacrificial liner such as a silicon oxide liner is present at a periphery of the memory opening 49, such as sacrificial liner can be removed by a suitable isotropic etch process. For example, if a silicon oxide liner having a thickness in a range from 1 nm to 10 nm is present at the periphery of the memory opening 49, a wet etch process employing dilute hydrofluoric acid can be employed to remove the silicon oxide liner. Sidewalls of the alternating stack (32, 42) and the in-process source-level material layers 10' can be physically exposed to the memory opening 49. In one embodiment, the memory opening 49 can extend into the lower source-level material layer 112. In this case, the memory opening 49 can include a sidewall (or a plurality of sidewalls) that extends substantially perpendicular to a respective recessed surface of the lower source-level material layer 112.

Referring to FIG. 13B, a memory film 50 and a semiconductor channel material layer 60L can be sequentially deposited in the memory opening 49. Each memory film 50 can include a stack of layers including a blocking dielectric layer 52, a charge storage layer 54, and a tunneling dielectric layer 56.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer. As used herein, a first surface and a second surface are "vertically coincident" if the second surface overlies or underlies the first surface and if there exists a vertical plane including the first surface and the second surface.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. The semiconductor channel material layer 60L can have a doping of a first conductivity type at a dopant concentration in a range from $1.0 \times 10^{14}/cm^3$ to $3.0 \times 10^{17}/cm^3$. A memory cavity 49' is formed in the volume of each memory opening 49 that is not filled with the deposited material layers (52, 54, 56, 60L).

Referring to FIG. 13C, a dielectric material such as undoped silicate glass, a doped silicate glass, or organosilicate glass can be deposited in the memory cavities 49' by a conformal or non-conformal deposition method. The dielectric material can be vertically recessed by a recess etch process such that remaining portions of the dielectric material have top surfaces between the horizontal plane including the top surface of the patterned template structure 142 (i.e., of the template material blocks 145) and the horizontal plane including the bottom surface of the patterned template structure 142 (i.e., of the template material blocks 145). Each remaining portion of the dielectric material constitutes a dielectric core 62.

Referring to FIG. 13D, a series of etch processes can be performed to remove portions of the semiconductor channel material layer 60L and the memory film 50 located above the dielectric core 62. A remaining portion of the semiconductor channel material layer 60L within the memory opening 49 constitutes a vertical semiconductor channel 60. At least one etch processes can be performed to sequentially etch portions of the memory film 50 located above the dielectric core 62. Each contiguous set of a remaining portion of the memory film 50 and a vertical semiconductor channel 60 forms a memory stack structure 55 that includes a vertical stack of memory elements. A drain cavity 63' is formed above each dielectric core 62. A sidewall of the patterned template structure 142 (i.e., of template material blocks 145) can be physically exposed around the drain cavity 63'.

Figure 13E:
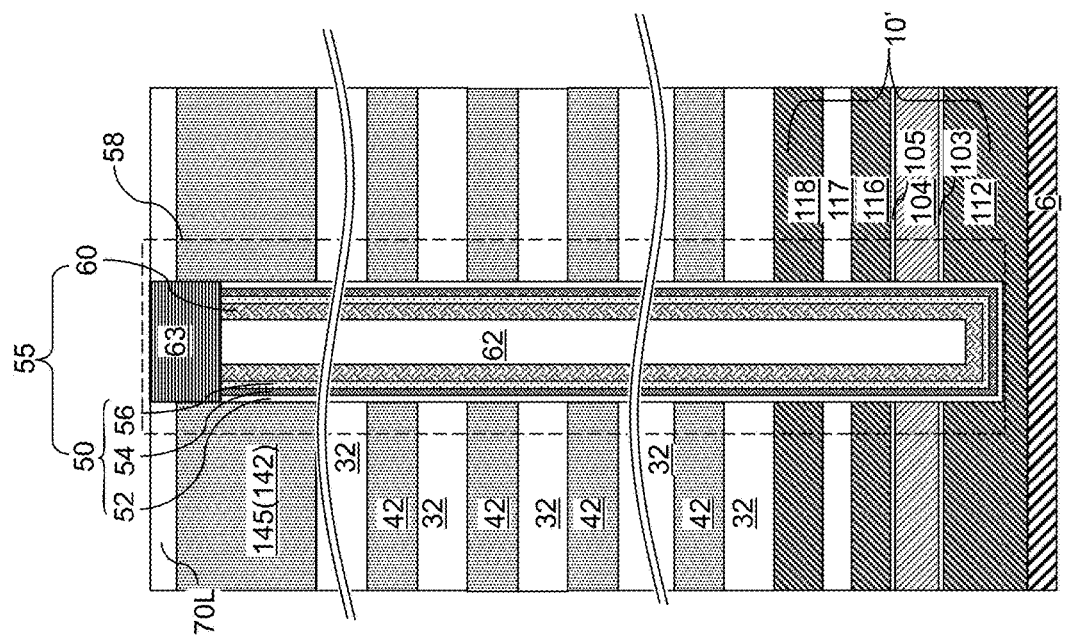

Referring to FIG. 13E, a doped semiconductor material having a doping of a second conductivity type can be deposited in the drain cavity 63' overlying the dielectric core 62. Excess portions of the doped semiconductor material overlying the top surface of the insulating cap layer 70L can be removed by a planarization process employing at least one recess etch process and/or chemical mechanical planarization. A remaining portion of the doped semiconductor material in the memory opening 49 constitutes a drain region 63.

Each contiguous combination of a blocking dielectric 52, a charge storage layer 54, and a tunneling dielectric layer 56 constitutes a memory film 50 in which electrical charges are stored during operation of the three-dimensional memory device to be formed. Each contiguous set of structures filling a memory opening 49 constitutes a memory opening fill structure 58, which can include a memory stack structure 55, a dielectric core 62, and a drain region 63. Each combination of a memory film 50, a vertical semiconductor channel 60, a dielectric core 62, and a drain region 63 within each support opening 19 fills the respective support openings 19, and constitutes a support pillar structure.

Figure 14:
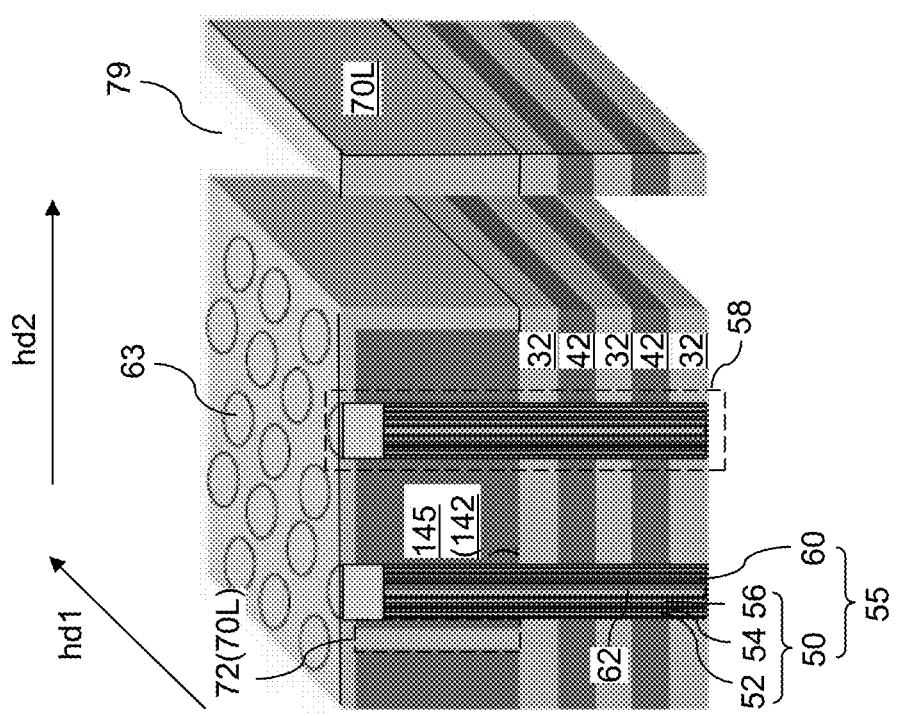
FIG. 14 is a perspective view of the upper region of the first exemplary structure after formation of a backside trench according to the first embodiment of the present disclosure.

Referring to FIG. 14, a photoresist layer (not shown) can be applied over the insulating cap layer 70L, and is lithographically patterned to form openings in areas between clusters of memory opening fill structures 58. The openings can rectangular openings having straight edges that laterally extend along the first horizontal direction. The areas of the openings do not overlap with the areas of the memory opening fill structures 58 in the memory array region 100 or with the areas of the support pillar structures in the contact region 300. In other words, the memory opening fill structures 58 and the support pillar structures can be covered by the patterned photoresist layer. Further, the areas of the openings do not overlap with the areas of the patterned template structure 142 (i.e., of the template material blocks 145).

The pattern in the photoresist layer can be transferred through the insulating cap layer 70L, the alternating stack (32, 42) and the retro-stepped dielectric material portion 65 employing an anisotropic etch to form backside trenches 79. The backside trenches 79 vertically extend from the top surface of the insulating cap layer 70L to a top surface of the source-level sacrificial layer 104, and laterally extend through the memory array region 100 and the contact region 300.

In one embodiment, the backside trenches 79 can laterally extend along the first horizontal direction hd1 and can be laterally spaced apart among one another along the second horizontal direction hd2 (which is perpendicular to the first horizontal direction hd1). The memory stack structures 55 can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between each neighboring pair of a backside trench 79 and a drain-select-level isolation structure 72, and between each neighboring pair of drain-select-level isolation structures 72. The photoresist layer can be removed, for example, by ashing. The patterned template structure 142 (i.e., the template material blocks 145) is encapsulated by the insulating cap layer 70L, the topmost insulating layer 32, and sidewalls of the memory opening fill structures 58.

Figure 15A:
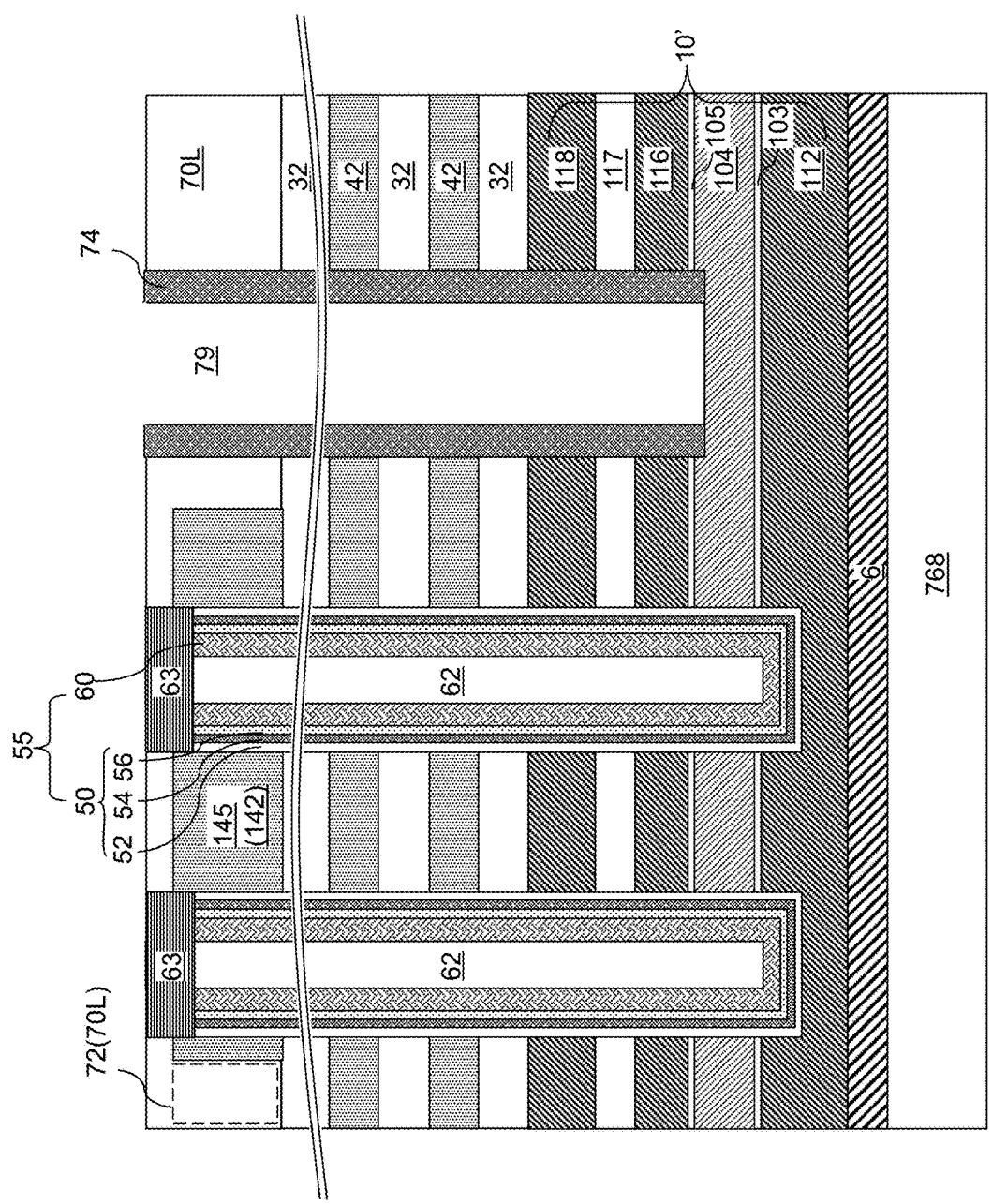

Referring to FIG. 15A, an etch stop material can be conformally deposited and anisotropically etched to form a backside trench spacer 74 within each backside trench 79. The backside trench spacers 74 are sacrificial spacers that protect the alternating stack (32, 42) during replacement of the in-process source-level material layers 10' with source-level material layers 10. In one embodiment, the backside trench spacers 74 include silicon nitride. The thickness of the backside trench spacers 74 can be in a range from 2 nm to 20 nm, such as from 3 nm to 10 nm, although lesser and greater thicknesses can also be employed.

Figure 15B:
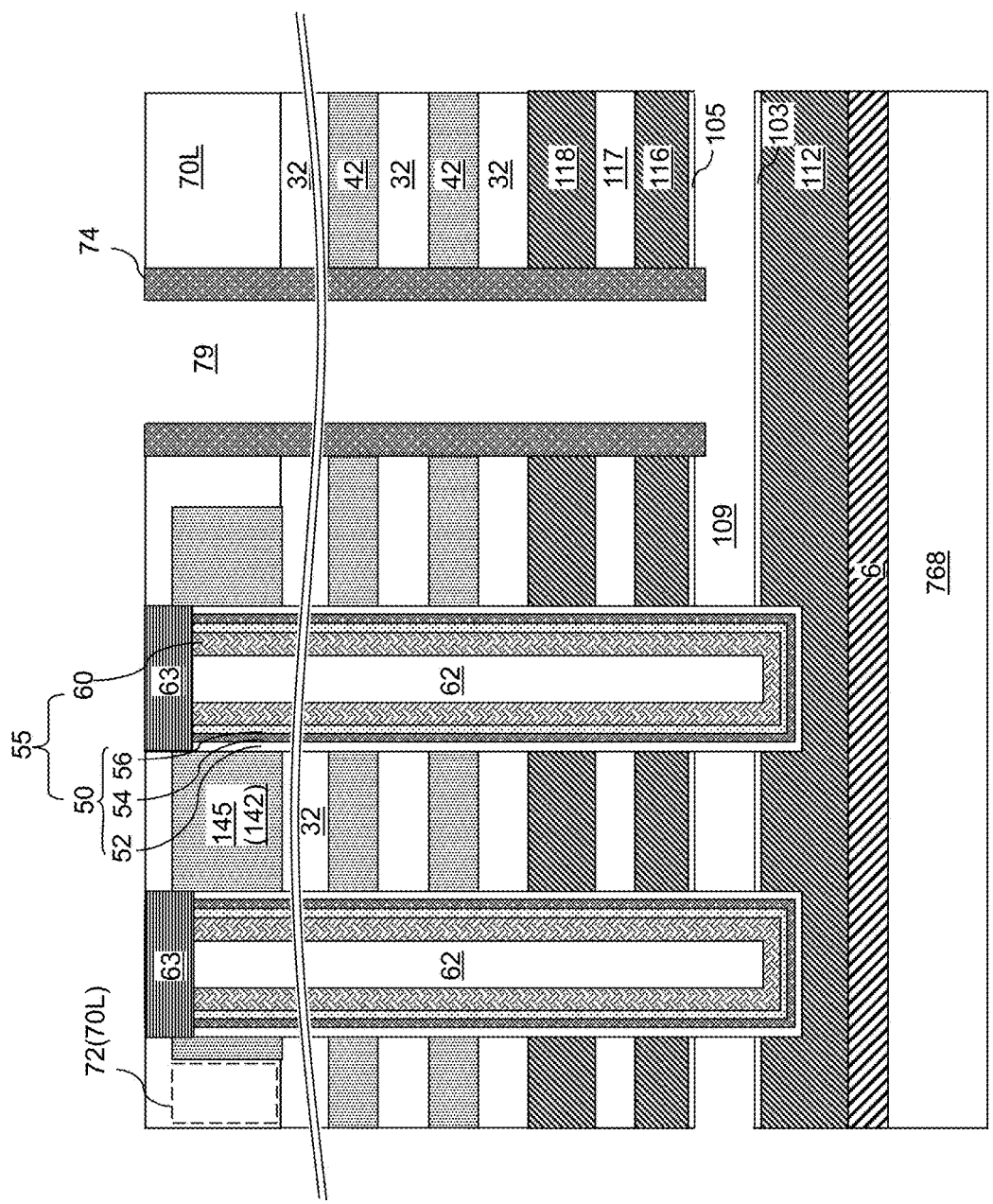

Referring to FIG. 15B, an etchant that etches the material of the source-level sacrificial layer 104 selective to the materials of the alternating stack (32, 42), the insulating cap layer 70L, and the drain regions 63 can be introduced into the backside trenches in an isotropic etch process. For example, if the source-level sacrificial layer 104 includes undoped amorphous silicon or an undoped amorphous silicon-germanium alloy, the backside trench spacers 74 include silicon nitride, the drain regions 63 include a heavily doped semiconductor material (which can include electrical dopants at an atomic concentration greater than $5.0 \times 10^{19}/cm^3$), and the upper and lower sacrificial liners (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower sacrificial liners (105, 103). A source cavity 109 is formed in the volume from which the source-level sacrificial layer 104 is removed.

Referring to FIG. 15C, a sequence of isotropic etchants, such as wet etchants, can be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower sacrificial liners (105, 103). A top surface of the lower source layer 112 and a bottom surface of the upper source layer 116 can be physically exposed to the source cavity 109.

Figure 15D:
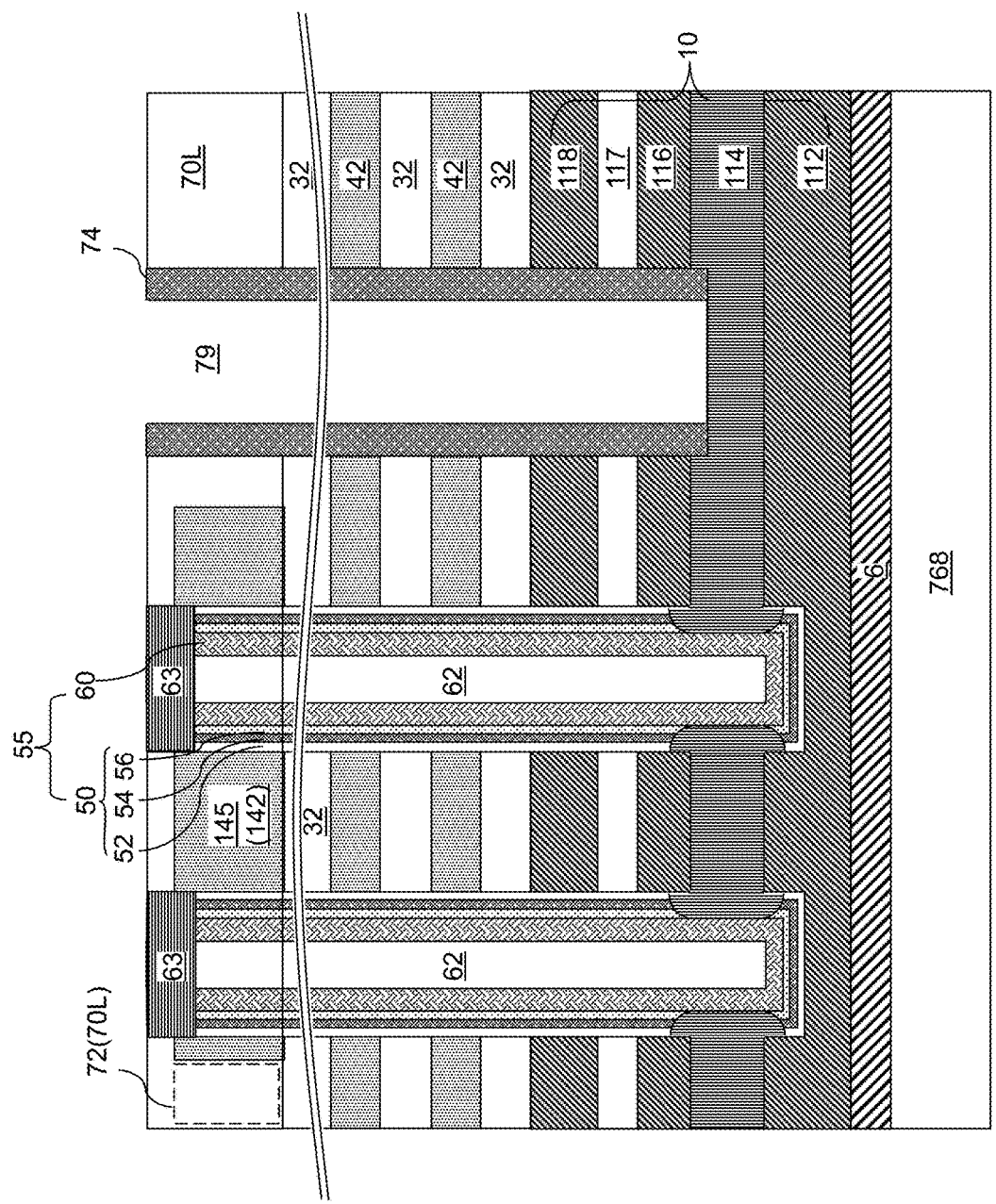

Referring to FIG. 15D, a doped semiconductor material having a doping of the second conductivity type can be deposited by a selective semiconductor deposition process. A semiconductor precursor gas, an etchant, and a dopant precursor gas can be flowed concurrently into a process chamber including the exemplary structure during the selective semiconductor deposition process. For example, if the second conductivity type is n-type, a semiconductor precursor gas such as silane, disilane, or dichlorosilane, an etchant gas such as hydrogen chloride, and a dopant precursor gas such as phosphine, arsine, or stibine. The deposited doped semiconductor material forms a source contact layer 114, which can contact sidewalls of the vertical semiconductor channels 60. The duration of the selective semiconductor deposition process can be selected such that the source cavity is filled with the source contact layer 114, and the source contact layer 114 contacts bottom end portions of inner sidewalls of the backside trench spacers 74. Thus, the source contact layer 114 can be formed by selectively depositing a doped semiconductor material from semiconductor surfaces around the source cavity 109. In one embodiment, the doped semiconductor material can include doped polysilicon.

The layer stack including the lower source layer 112, the source contact layer 114, and the upper source layer 116 constitutes a buried source layer (112, 114, 116), which functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed. The set of layers including the buried source layer (112, 114, 116), the source-level insulating layer 117, and the optional source-select-level conductive layer 118 constitutes source-level material layers 10, which replaces the in-process source-level material layers 10'. Optionally, an oxidation process can be performed to convert a surface portion of the source contact layer 114 into a semiconductor oxide portion (not illustrated) underneath each backside opening 79.

Figure 15E:
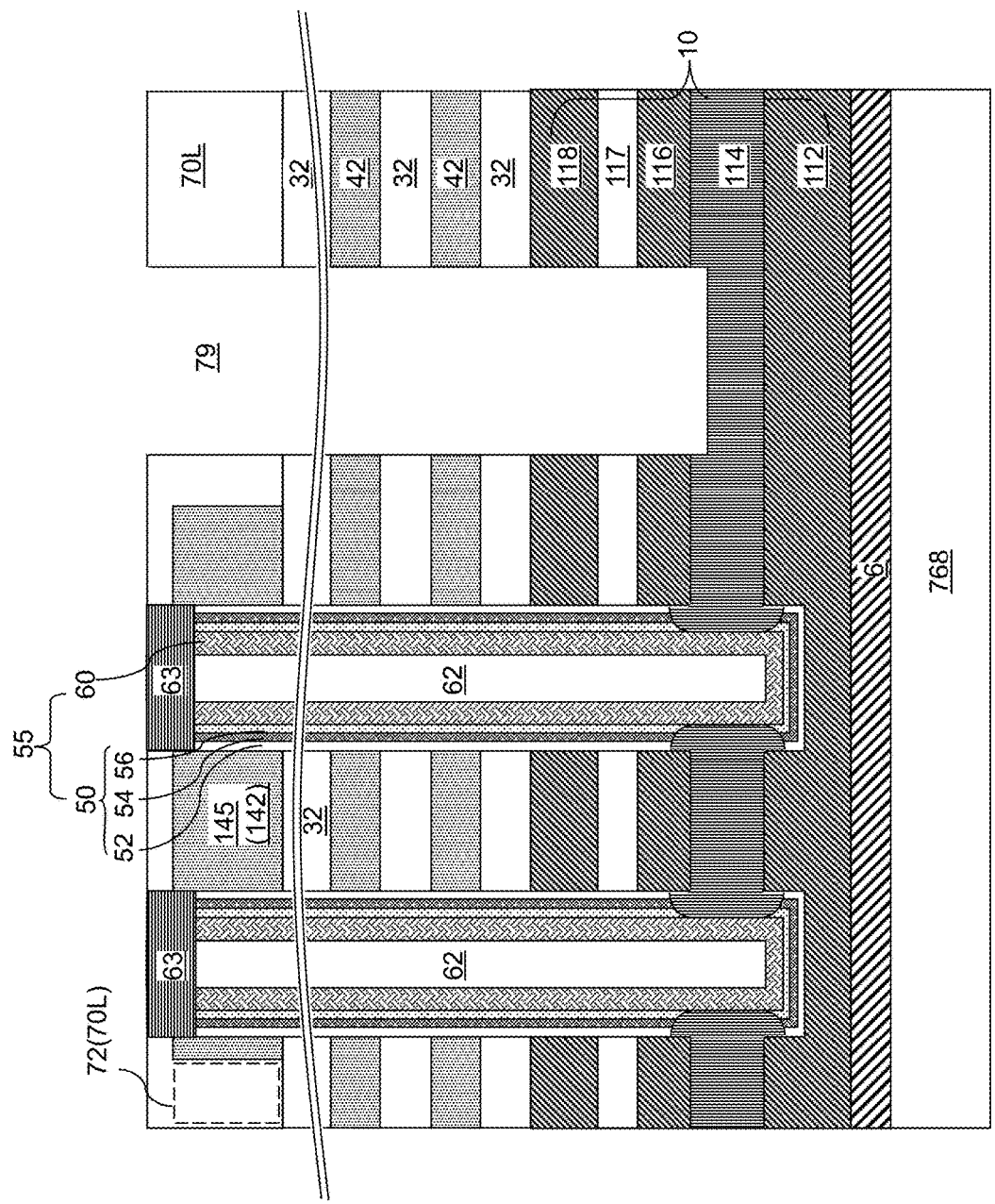

Referring to FIG. 15E, the backside trench spacers 74 can be removed selective to the insulating layers 32, the insulating cap layer 70L, the source contact layer 114, and the drain regions 63 employing an isotropic etch process. For example, if the backside trench spacers 74 include silicon nitride, a wet etch process employing hot phosphoric acid can be performed to remove the backside trench spacers 74. In one embodiment, the isotropic etch process that removes the backside trench spacers 74 can be combined with a subsequent isotropic etch process that etches the sacrificial material layers 42 selective to the insulating layers 32, the insulating cap layers 70L, the source contact layer 114, and the drain regions 63.

Figure 16:
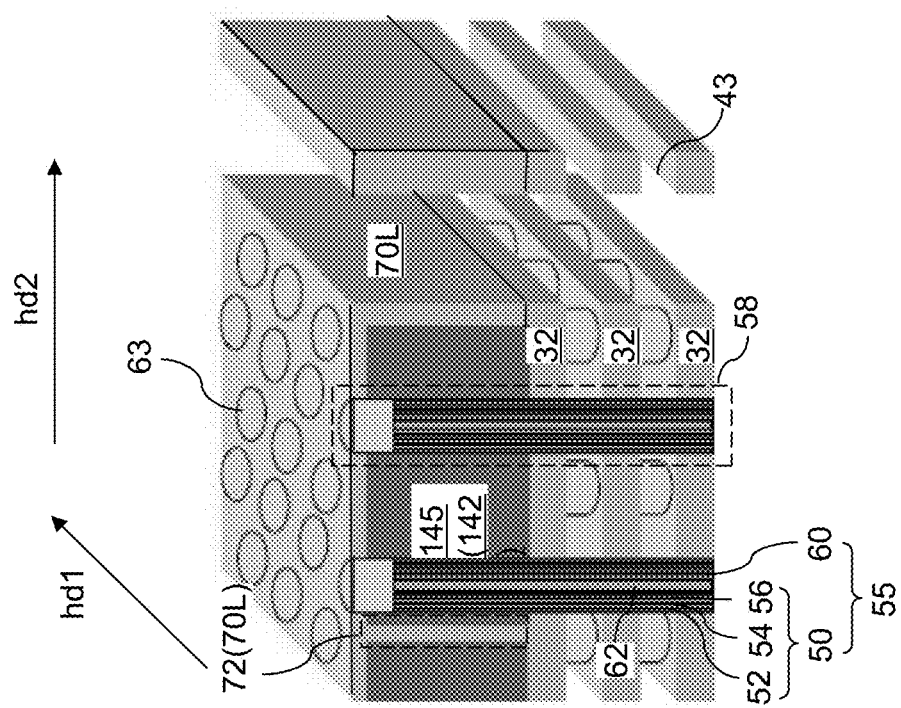
FIG. 16 is a perspective view of the upper region of the first exemplary structure after formation of backside recesses according to the first embodiment of the present disclosure.

Referring to FIG. 16, the sacrificial material layers 42 are can be removed selective to the insulating layers 32, the insulating cap layers 70L, the source contact layer 114, and the drain regions 63. For example, an etchant that selectively etches the materials of the sacrificial material layers 42 with respect to the materials of the insulating layers 32, the insulating cap layer 70L, the retro-stepped dielectric material portion 65 (illustrated in FIGS. 2B and 3B), and the material of the outermost layer of the memory films 50 can be introduced into the backside openings 79, for example, employing an isotropic etch process. For example, the sacrificial material layers 42 can include silicon nitride, the materials of the insulating layers 32, the insulating cap layer 70L, the retro-stepped dielectric material portion 65, and the outermost layer of the memory films 50 can include silicon oxide materials.

The isotropic etch process can be a wet etch process employing a wet etch solution, or can be a gas phase (dry) etch process in which the etchant is introduced in a vapor phase into the backside opening 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. A plurality of backside recesses 43 can be formed in the volumes from which the material of the sacrificial material layers 42 is removed. Each of the backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each of the backside recesses 43 can have a uniform height throughout.

Referring to FIG. 17, a backside blocking dielectric layer 44 can be subsequently formed in the backside recesses 43. The backside blocking dielectric layer 44 can include at least one dielectric material that is subsequently employed to prevent charge tunneling between the charge storage layers 54 and electrically conductive layers to be subsequently formed in the backside recesses 43. For example, the backside blocking dielectric layer 44 can include silicon oxide and/or a dielectric metal oxide such as aluminum oxide. The backside blocking dielectric layer 44 can be formed by a conformal deposition process such as chemical vapor deposition or atomic layer deposition. The thickness of the backside blocking dielectric layer 44 can be in a range from 1 nm to 6 nm, such as 2 nm to 4 nm, although lesser and greater thicknesses can also be employed.

At least one metallic material can be subsequently deposited in the backside recesses 43 and at peripheral portions of the backside trenches 79. For example, a metallic barrier layer 46A can be conformally deposited in the backside recesses 43, for example, by chemical vapor deposition. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Subsequently, a metal fill material is deposited in the plurality of backside recesses 43, on the sidewalls of the at least one the backside trench 79, and over the top surface of the insulating cap layer 70L to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. Alternatively, the metallic fill material layer 46B can include a different metallic material such as cobalt, ruthenium, and/or molybdenum. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the insulating cap layer 70L. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the insulating cap layer 70L.

The deposited metallic material of the continuous electrically conductive material layer is etched back from the sidewalls of each backside trench 79 and from above the insulating cap layer 70L, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode, or a select gate electrode, for the plurality of vertical memory devices.

Referring to FIG. 18, a dielectric material is deposited in the backside trenches 79 to form dielectric wall structures 76. Each of the dielectric wall structures 76 can laterally extend along the first horizontal direction hd1 and can vertically extend through each layer of an alternating stack of the insulating layers 32 and the electrically conductive layers 46. Each dielectric wall structure 76 can contact sidewalls of the insulating cap layer 70L.

Subsequently, the material of the insulating cap layer 70L can be recessed by an etch process to physically expose top surfaces of the patterned template structure 142 (i.e., of the template material blocks 145). For example, if the insulating cap layer 70L includes silicon oxide, a wet etch process employing dilute hydrofluoric acid can be employed to remove the horizontal portions of the insulating cap layer overlying the horizontal plane including the top surfaces of the patterned template structure 142 (i.e., of the template material blocks 145). Remaining portions of the insulating cap layer 70L can include insulating cap strips 70 located on both sides of each dielectric wall structure 76 and the drain-select-level isolation structures 72. Each insulating cap strip 70 can have a pair of straight sidewalls that laterally extend along the first horizontal direction hd1 and laterally spaced along the second horizontal direction hd2 by a uniform spacing. Each drain-select-level isolation structure 72 can include a pair of contoured sidewalls that generally extend along the first horizontal direction hd1. Each contoured sidewall has a lateral undulation along the second horizontal direction hd2, and includes a set of concave vertical sidewall segments that contact a sidewall of a respective template material block 145, i.e., a discrete portion of the patterned template structure 142.

Figure 19A:
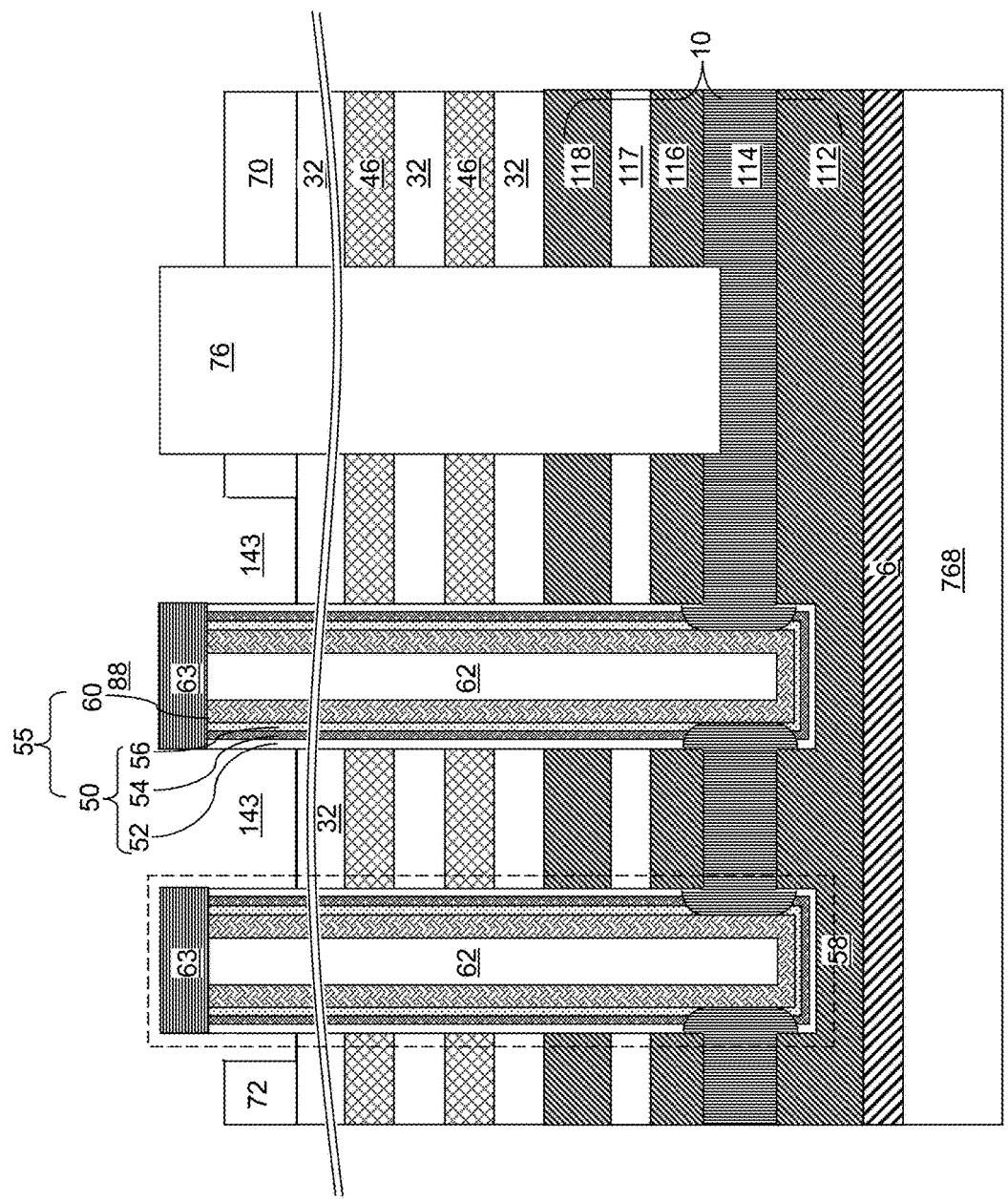
FIG. 19A is a vertical cross-sectional view of a region of the first exemplary structure after formation of drain-select-level cavities by removal of the patterned template structure according to the first embodiment of the present disclosure.
Figure 19B:
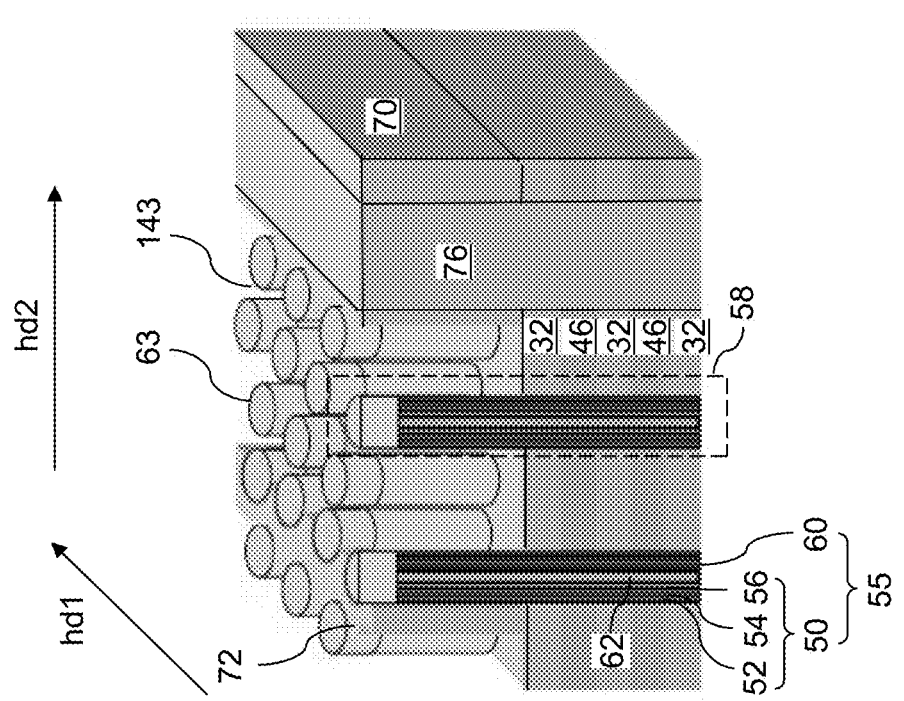
FIG. 19B is a perspective view of an upper region of the first exemplary structure of FIG. 19A.

Referring to FIGS. 19A and 19B, the patterned template structure 142 (i.e., the template material blocks 145) can be removed selective to the memory opening fill structures 58, the insulating cap strips 70, the drain-select-level isolation structures 72, the topmost insulating layer 32, and the dielectric wall structure 76 by an etch process. The etch process can be an anisotropic etch process (such as a reactive ion etch process) or an isotropic etch process (such as a wet etch process). In one embodiment, the entirety of each of the template material blocks 145 of the patterned template structure 142 can be removed employing a wet etch process that removes the template material blocks 145 selective to materials of the physically exposed portions of the memory opening fill structures 58, which include the drain regions 63 and the memory films 50 within the memory stack structures 55. For example, if the template material blocks 145 of the patterned template structure 142 include, or consist essentially of, silicon nitride, a wet etch process employing hot phosphoric acid can be employed to remove the template material blocks 145 of the patterned template structure 142. Drain-select-level cavities 143 are formed in each volume from which the template material blocks 145 of the patterned template structure 142 are removed. Upper portions of outer sidewalls of each memory film 50 can be physically exposed. Each physically exposed surface of the memory films 50 can have a cylindrical configuration. Thus, the physically exposed portion of the outer sidewall of each memory film 50 can azimuthally encompass 360 degrees around a vertical axis that passed through a geometrical center of the volume of the memory opening fill structure 58 that includes the memory film 50.

Figure 20A:
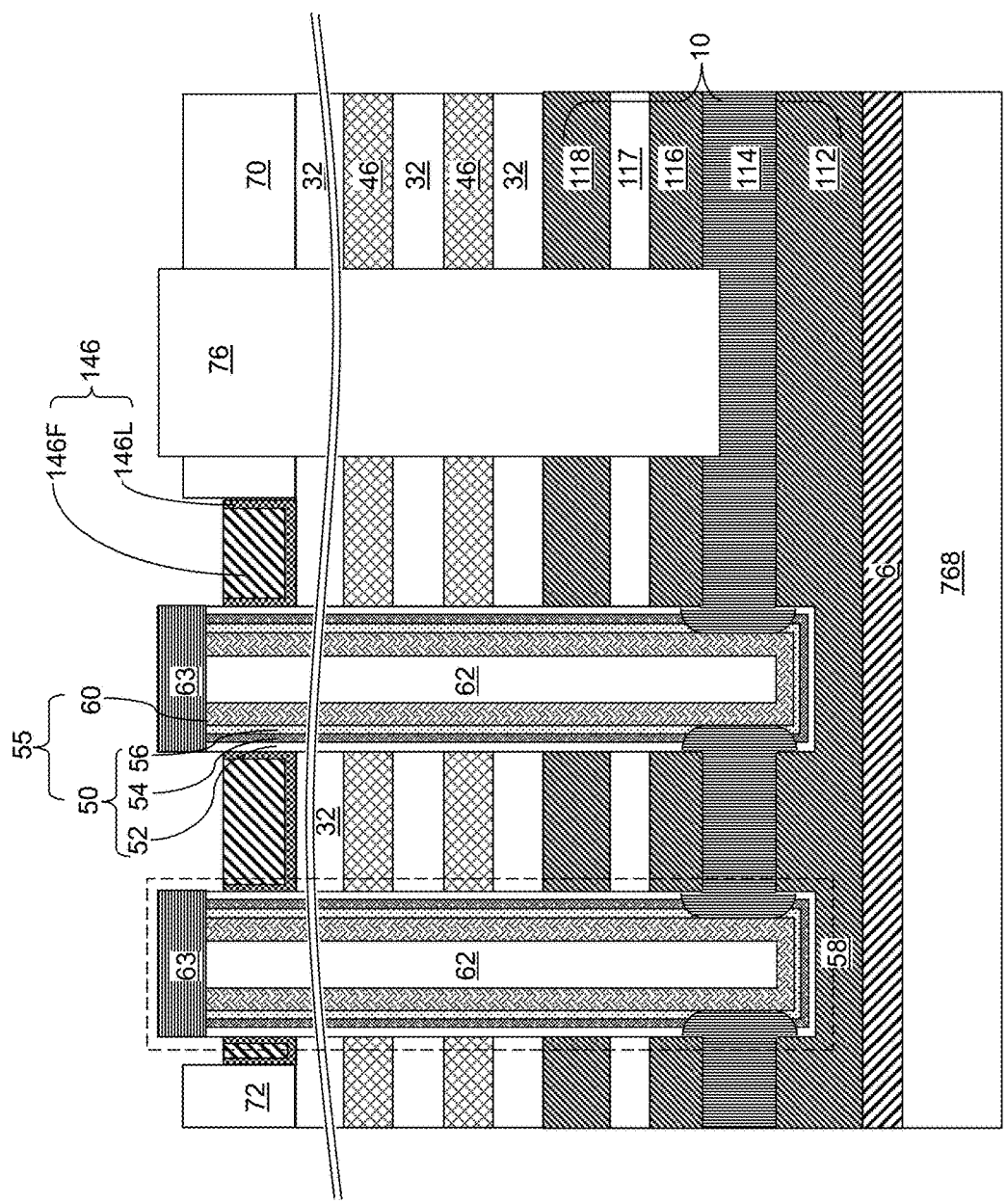
FIG. 20A is a vertical cross-sectional view of a region of the first exemplary structure after formation of drain-select-level electrically conductive strips according to the first embodiment of the present disclosure.
Figure 20B:
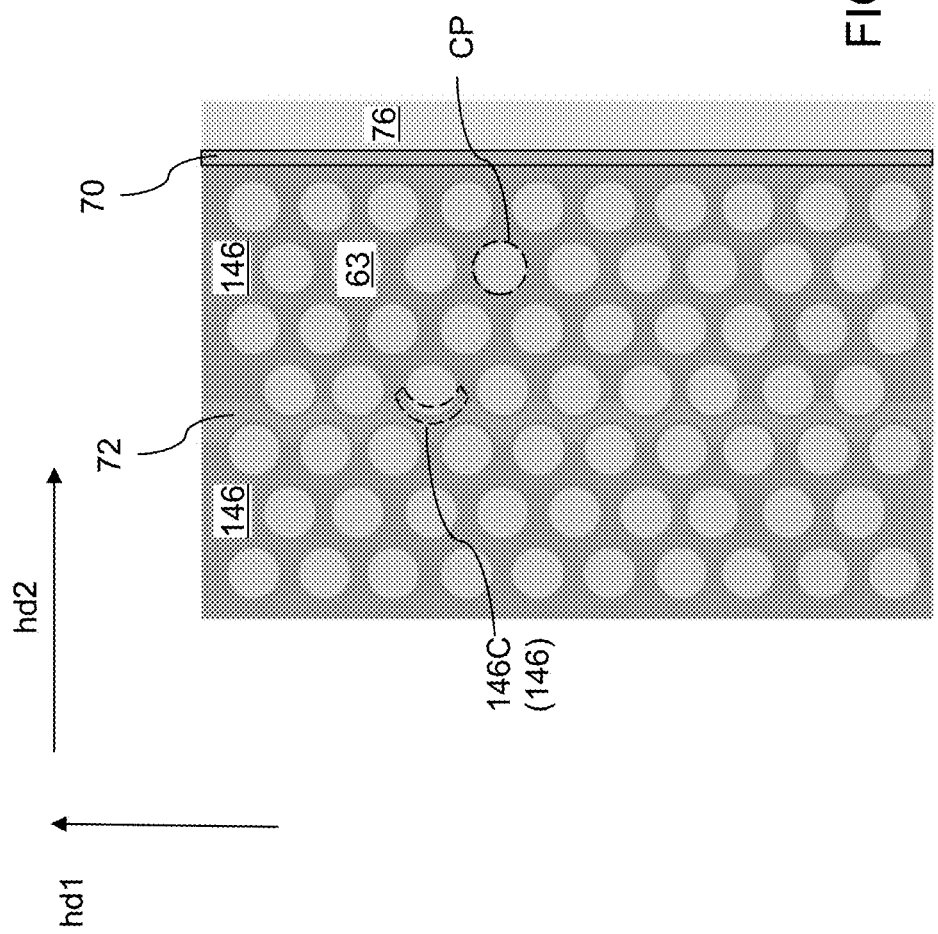
FIG. 20B is a top-down view of a region of the first exemplary structure of FIG. 20A.

Referring to FIGS. 20A and 20B, at least one electrically conductive material can be deposited within volumes of the drain-select-level cavities 143. The at least one electrically conductive material can include a metallic nitride liner material and a metallic fill material. The metallic nitride liner material can comprise, for example, TiN, TaN, and/or WN. The metallic fill material can comprise, for example, W, Co, Mo, and Ru. Each of the at least one electrically conductive material can be deposited conformally (for example, employing a chemical vapor deposition process) or non-conformally (for example, employing a physical vapor deposition process). The at least one electrically conductive material can be planarized, for example, by chemical mechanical planarization process, at, or above, the horizontal plane including the top surfaces of the drain regions 63. Subsequently, the at least one electrically conductive material can be vertically recessed below the horizontal plane including the bottom surfaces of the drain regions 63, for example, by a recess etch process. The recess etch process can be selective to the materials of the drain regions 63, the insulating cap strips 70, and the drain-select-level isolation structures 72. Each drain-select-level cavity 143 can be filled with a respective portion of the at least one electrically conductive material, which constitutes a drain-select-level conductive strip 146.

Each drain-select-level conductive strip 146 generally extends along the first horizontal direction hd1. Each drain-select-level conductive strip 146 can include a remaining portion of the metallic nitride liner material, which forms a drain-select-level metallic nitride liner 146L. Further, each drain-select-level conductive strip 146 can include a remaining portion of the metallic fill material, which forms a drain-select-level metallic fill material portion 146F. Each drain-select-level conductive strip 146 can include a combination of a drain-select-level metallic nitride liner 146L and a drain-select-level metallic fill material portion 146F.

The at least one electrically conductive material of the drain-select-level electrically conductive strips 146 contacts sidewalls of the memory stack structures 55, sidewalls of the drain-select-level isolation structures 72, sidewalls of the insulating cap strips 70, and a top surface of a topmost insulating layer 32. In case the each drain-select-level conductive strip 146 includes a combination of a drain-select-level metallic nitride liner 146L and a drain-select-level metallic fill material portion 146F, the drain-select-level metallic nitride liner 146L can contact, and laterally encircle, each of the memory stack structures 55 located between a neighboring pair of a drain-select-level isolation structure 72 and a dielectric wall structure 76, or between a neighboring pair of drain-select-level isolation structures 72. As shown in FIG. 20B, a cylindrical arc portion 146C of a drain-select-level conductive strip 146 may be located between a memory opening fill structure 58 and an adjacent drain-select-level isolation structure 72. Further, the drain-select-level metallic nitride liner 146L can contact sidewalls of the neighboring pair of the drain-select-level isolation structure 72 and an insulating cap strip 70, or the neighboring pair of the drain-select-level isolation structures 72.

Figure 21A:
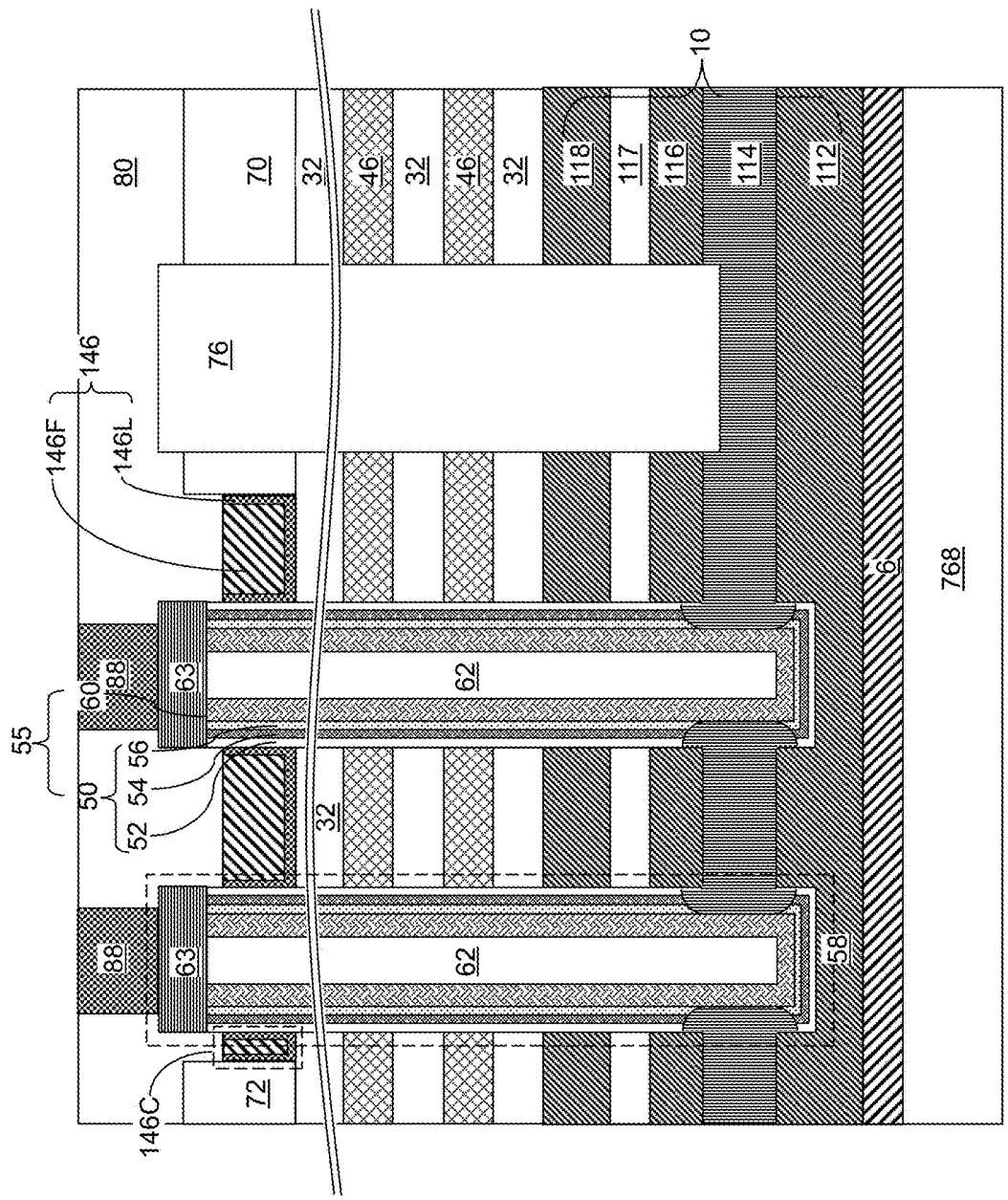
FIG. 21A is a vertical cross-sectional view of a region of the first exemplary structure after formation of a contact level dielectric layer and contact via structures according to the first embodiment of the present disclosure.

Referring to FIG. 21A, a dielectric material such as silicate glass can be deposited over the drain-select-level isolation structures 72, the insulating cap strips 70, the drain regions 63, and the dielectric wall structure 76. The dielectric material can be planarized to provide a planar top surface. The planarized remaining portion of the dielectric material constitutes a contact level dielectric layer 80. Drain contact via structures 88 can be formed through the contact level dielectric layer 80 on a top surface of a respective one of the drain regions 63.

Figure 21B:
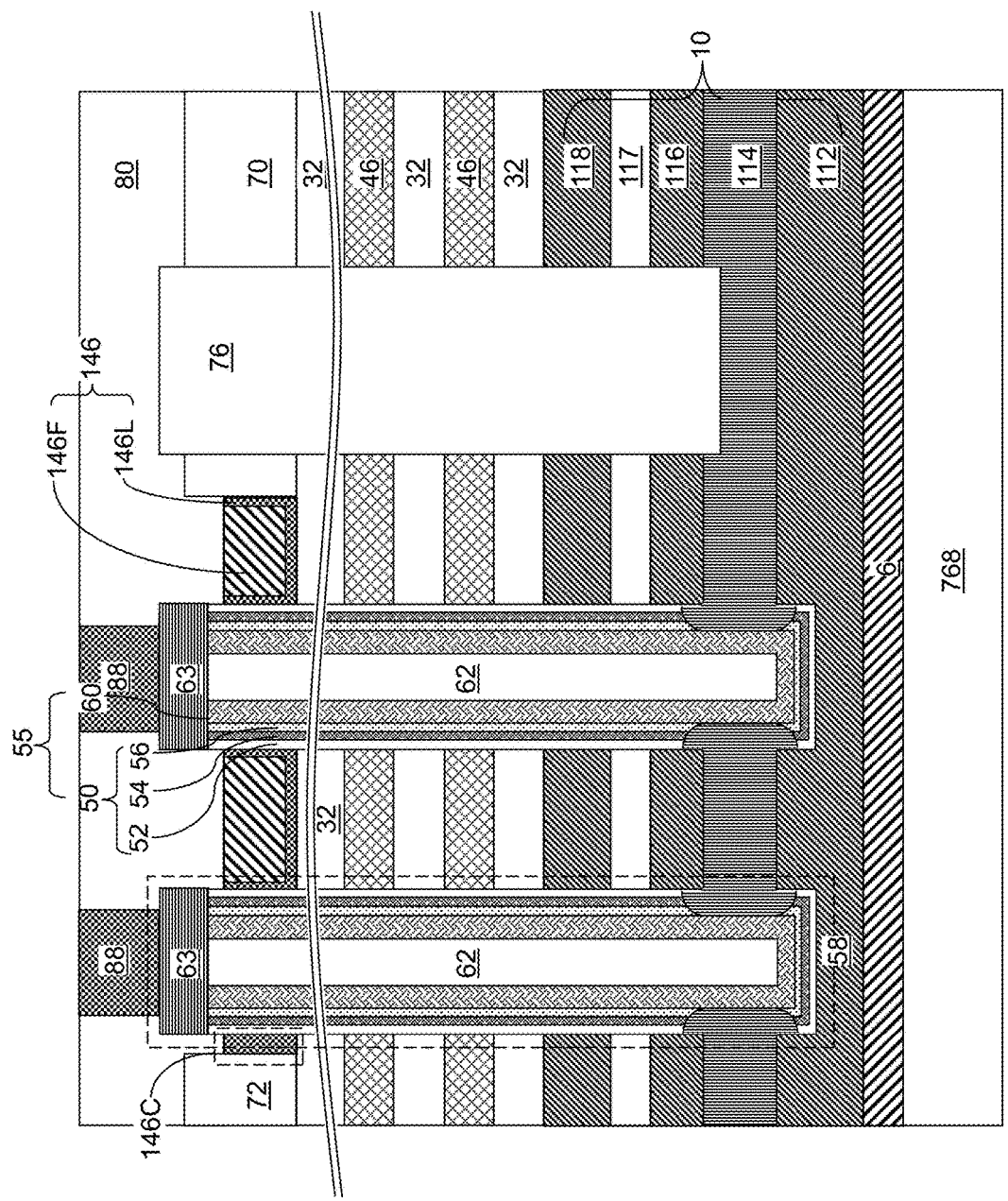
FIG. 21B is a vertical cross-sectional view of an alternative embodiment of the first exemplary structure of FIG. 21A.

FIG. 21A illustrates an embodiment in which the lateral thickness of each cylindrical arc portion of 146C of the drain-select-level electrically conductive strip 146 is more than twice the minimum lateral thickness of the drain-select-level metallic nitride liner 146L, which is the lateral thickness of a vertical portion of the drain-select-level metallic nitride liner 146L in a non-merging configuration. In this configuration, the cylindrical arc portions 146C can contain a segment of a drain-select-level metallic fill material portion 146F. FIG. 21B illustrates an alternative embodiment of the first exemplary structure in which the lateral thickness of each cylindrical arc portion 146C of the drain-select-level electrically conductive strip is less than twice the minimum lateral thickness of the drain-select-level metallic nitride liner 146L. In this case, the cylindrical arc portions 146C can consist of a segment of the drain-select-level metallic liner layer 146L.

Referring to all drawings of the first exemplary structure, the first exemplary structure can include a three-dimensional memory device. The first exemplary structure can comprise: an alternating stack of insulating layers 32 and electrically conductive layers 46 located over a substrate 8; drain-select-level electrically conductive strips 146 located over the alternating stack (32, 46); a drain-select-level isolation structure 72 located between a neighboring pair of the drain-select-level electrically conductive strips 146; memory stack structures 55 comprising a memory film 50 and a vertical semiconductor channel 60 vertically extending through the alternating stack (32, 46) and a respective one of the drain-select-level electrically conductive strips 146; and a contact level dielectric layer 80 overlying the drain-select-level electrically conductive strips 146, the drain-select-level isolation structure 72, and the memory stack structures 55. The contact level dielectric layer 80 contacts a sidewall of the drain-select-level isolation structure 72. The memory stack structures 55 contact, and are completely laterally surrounded by, a cylindrical sidewall of a respective one of the drain-select-level electrically conductive strips 146. In other words, the memory stack structures 55 contact and are laterally surrounded by a closed periphery CP (as illustrated in FIG. 20B) within a cylindrical sidewall of a respective one of the metallic nitride liners 146L of the drain-select-level electrically conductive strips 146.

In one embodiment, the three-dimensional memory device comprises drain regions 63 located at a top end of a respective one of the memory stack structures 55, wherein a bottom periphery of each of the drain regions 63 coincides with a topmost periphery of an outer sidewall of an underlying one of the memory stack structures 55.

In one embodiment, sidewalls of the drain-select-level electrically conductive strips 146 are in contact with sidewalls of the memory stack structures 55, and are vertically coincident with sidewalls of the drain regions 63.

In one embodiment, each of the drain-select-level electrically conductive strips 146 has a respective laterally alternating sequence of planar vertical sidewall segments and convex vertical sidewall segments, wherein each convex vertical sidewall segment is laterally spaced from a most proximal one of the memory stack structures by a uniform lateral spacing, which is the same as the thickness of a cylindrical arc portion of 146C of the drain-select-level electrically conductive strip 146 (as illustrated in FIG. 20B).

In one embodiment, each of the drain-select-level electrically conductive strips 146 has a top surface located below a horizontal plane including a top surface of the drain-select-level isolation structure 72, and each of the drain-select-level electrically conductive strips 146 has a bottom surface located within a horizontal plane including a bottom surface of the drain-select-level isolation structure 72.

In one embodiment, the memory stack structures 55 are arranged as rows that laterally extend with a uniform pitch along a first horizontal direction hd1; and the three-dimensional memory device further comprises an insulating cap strip 70 located over the alternating stack (32, 46) and having a straight sidewall that extend along the first horizontal direction hd1 by at least twice the uniform pitch.

In one embodiment, the drain-select-level isolation structure 72 generally extends along a first horizontal direction hd1; and the drain-select-level isolation structure includes a pair of laterally alternating sequences of planar vertical sidewall segments and concave vertical sidewall segments that alternate along the first horizontal direction hd1. Each laterally alternating sequence of planar vertical sidewall segments and concave vertical sidewall segments can contact a respective drain-select-level electrically conductive strip 146.

In one embodiment, each of the concave vertical sidewall segments is laterally spaced from a respective most proximal one of the memory stack structures by a uniform lateral spacing, which is the lateral thickness of the cylindrical arc portion of 146C of the drain-select-level electrically conductive strip 146. The uniform lateral spacing can be the same as a lateral width of peripheral portions of the drain-select-level electrically conductive strips 146 disposed between the drain-select-level isolation structure 72 and most proximal ones among the memory stack structures 55.

In one embodiment, each of the drain-select-level electrically conductive strips 146 comprises a respective metallic nitride liner 146L and a respective metallic fill material portion 146F. Each metallic nitride liner 146L consists essentially of a conductive metal nitride; and each metal fill material portion 146F consists essentially of an elemental metal or an intermetallic alloy.

In one embodiment, the three-dimensional memory device can comprise: a source contact layer 114 underlying the alternating stack (32, 46) and contacting the vertical semiconductor channels 60 within the memory stack structures 55; and a dielectric wall structure 76 vertically extending through the alternating stack (32, 46), laterally extending along the first horizontal direction hd1, and laterally spaced from the drain-select-level electrically conductive strips 146 and the drain-select-level isolation structure 72 by a portion of an insulating cap layer 70L.

Figures 22, 23:
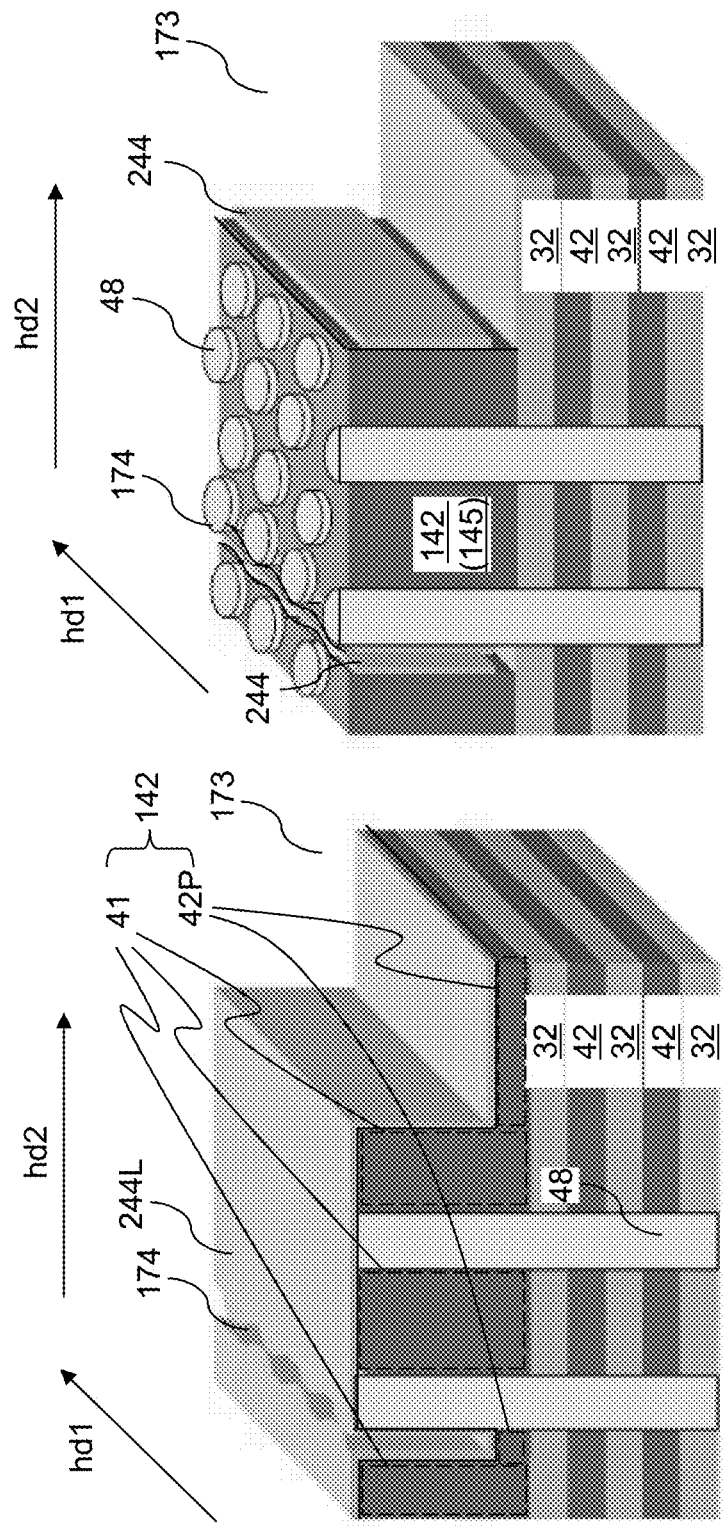
FIG. 22 is a perspective view of the upper region of a second exemplary structure after depositing a conformal doped semiconductor material liner according to a second embodiment of the present disclosure.
FIG. 23 is a perspective view of the upper region of the second exemplary structure after formation of doped semiconductor spacers by anisotropically etching the conformal doped semiconductor material liner and after removing unmasked portions of the topmost sacrificial material layer according to the second embodiment of the present disclosure.

Referring to FIG. 22, a second exemplary structure according to a second embodiment of the present disclosure can be derived from the first exemplary structure of FIG. 8 by depositing a conformal doped semiconductor material liner 244L. Specifically, the conformal doped semiconductor material liner 244L can be deposited on the physically exposed surfaces of the patterned template structure 142 and the physically exposed surfaces of the sacrificial pillar structures 48. The conformal doped semiconductor material liner 244L includes a doped semiconductor material that is formed as, or can be converted into, a conductive semiconductor material, i.e., a semiconductor material having electrical conductivity greater than having electrical conductivity greater than $1.0 \times 10^5$ S/cm. The doped semiconductor material of the conformal doped semiconductor material liner 244L can include amorphous silicon, polysilicon, and/or a silicon-germanium alloy. The conformal doped semiconductor material liner 244L can have a doping of the first conductivity type (e.g., p-type), which is the opposite of the second conductivity type. The atomic concentration of dopants of the first conductivity type in the conformal doped semiconductor material layer 244L can be in a range from $5.0 \times 10^{19}/cm^3$ to $2.0 \times 10^{21}/cm^3$, although lesser and greater thicknesses can also be employed.

The conformal doped semiconductor material liner 244L can be deposited over the first template material portions 41 (i.e., portions of the first template material that are incorporated into the patterned template structure 142) and on physically exposed surfaces of the sacrificial pillar structures 48. The conformal doped semiconductor material liner 244L can be deposited by a conformal deposition process such as low pressure chemical vapor deposition (LPCVD) process. The thickness of the conformal doped semiconductor material liner 244L can be in a range from 1 nm to 10 nm, such as from 2 nm to 6 nm, although lesser and greater thicknesses can also be employed.

Referring to FIG. 23, the conformal doped semiconductor material liner 244L and the patterned template structure 142 can be anisotropically etched, for example, by a reactive ion etch process. The anisotropic etch includes a first step that etches horizontal portions of the conformal doped semiconductor material liner 244L. For example, the first step of the anisotropic etch process can be selected from $HBr/Cl_2/O_2$, $HBr/O_2$, $BCl_3/Cl_2$, and $SF_6$. The overetch portion of the first step can be minimized to prevent any significant etching of the sacrificial pillar structures 48. Remaining vertical portions of the conformal doped semiconductor material liner 244L constitute doped semiconductor spacers 244. The doped semiconductor spacers 244 can have a uniform lateral width throughout.

The anisotropic etch process can include a second step that employs an etch chemistry for anisotropically etching the material of the patterned template structure 142. The etch chemistry of the second step of the anisotropic etch process can be selective to the material of the sacrificial pillar structures 48 and the insulating layers 32. For example, if the patterned template structure 142 includes silicon nitride and if the sacrificial pillar structures 48 include a semiconductor material, the second step of the anisotropic etch can employ an etch chemistry selected from $CHF_4/O_2$, $CF_4/O_2$, $SF_6$, or $SF_6/O_2$ with no or minimal ion assistance to provide selectivity with respect to silicon oxide. The anisotropic etch removes horizontal portions of the patterned template structure 142 that underlie the drain-select-level line trenches (173, 174). The sacrificial material portions 42P within the patterned template structure 142 as provided at the processing steps of FIG. 22 are removed by the second step of the anisotropic etch process, and the drain-select-level line trenches (173, 174) are vertically extended by the anisotropic etch process. Thus, the patterned template structure is divided into multiple discrete material portions that include the first template material portions 41, which are herein referred to as template material portions 41. Each discrete remaining portion 41 of the patterned template structure 142 constitutes a template material block 145. The patterned template structure 142 after the anisotropic etch process includes a plurality of template material blocks that are laterally spaced apart by the drain-select-level line trenches (173, 174). A pair of doped semiconductor spacers 244 can be located on sidewalls of each template material block 145, i.e., a discrete portion of the patterned template structure 142.

The doped semiconductor spacers 244 can have a uniform lateral thickness. A subset of the doped semiconductor spacers 244 that are formed at a periphery of a straight drain-select-level line trench 173 can have a pair of straight sidewalls that laterally extend along the first horizontal direction hd1. A subset of the doped semiconductor spacers 244 formed at a periphery of a contoured drain-select-level line trench 174 can have an inner sidewall and an outer sidewall. The inner sidewall can have a laterally alternating sequence of planar vertical sidewall segments that contact a respective one of the first template material portion 41 and concave vertical sidewall segments that contact upper portions of sidewalls of a row of sacrificial pillar structures 48. The outer sidewall can have a set of convex vertical sidewall segments. In one embodiment, the outer sidewall can have a laterally alternating sequence of planar vertical sidewall segments and convex vertical sidewall segments that generally extends along the first horizontal direction hd1. In another embodiment, the outer sidewall can have convex vertical sidewall segments that are adjoined among one another at vertical edges. The convex vertical sidewall segments of the doped semiconductor spacers 244 can be laterally spaced from a most proximal one of sidewalls of the sacrificial pillar structures 48 by a same uniform lateral spacing, which is the lateral thickness of the doped semiconductor spacers 244. The remaining volume of each contoured drain-select-level line trench 174 defines a gap that laterally extends along the first horizontal direction hd1 and having a modulated width. The gap defined by the contoured drain-select-level line trench 174 is self-aligned to sidewalls of peripheral rows of the sacrificial pillar structures 48 that are located on either side of the contoured drain-select-level line trench 174. A top surface of the topmost insulating layer 32 can be physically exposed at the bottom of each of the drain-select-level line trenches (173, 174). The top surfaces of the patterned template structure 142 can be vertically recessed with respect to the top surfaces of the sacrificial pillar structures 48. A bottom surface of each doped semiconductor spacer 244 can be located above the horizontal plane including the top surface of the topmost insulating layer 32. The vertical distance between the bottom surface of each doped semiconductor spacer 244 and the horizontal plane including the top surface of the topmost insulating layer 32 can be the same as the thickness of the topmost sacrificial material layer 42 as provided at the processing steps of FIGS. 2A and 2B.

Figure 24:
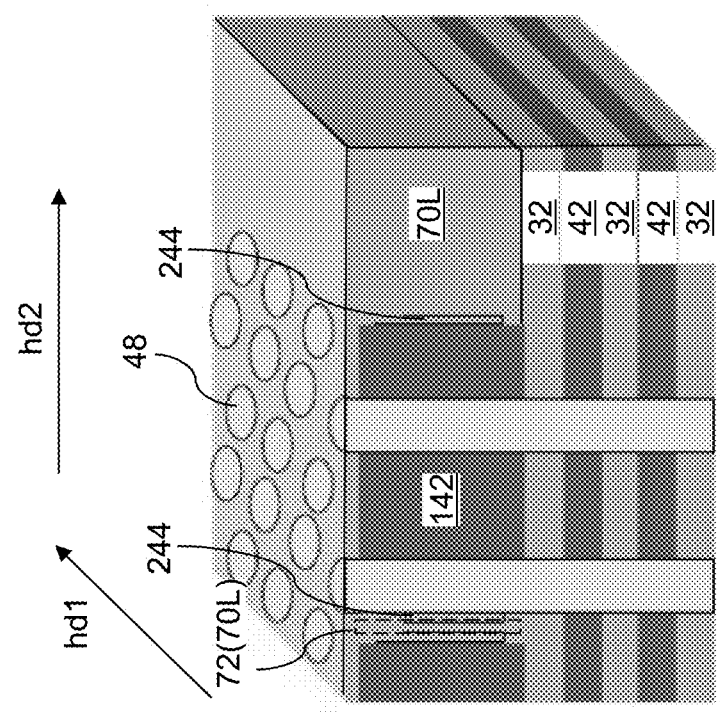
FIG. 24 is a perspective view of the upper region of the second exemplary structure after formation of an insulating cap layer according to the second embodiment of the present disclosure.

Referring to FIG. 24, a dielectric material can be deposited in the drain-select-level line trenches (173, 174) and over the patterned template structure 142 and the doped semiconductor spacers 244, and can be planarized to form an insulating cap layer 70L. The dielectric material of the insulating cap layer 70L is different from the material of the patterned template structure 142 and the material of the doped semiconductor spacers 244. In one embodiment, the dielectric material of the patterned template structure 142 can include silicon nitride, and the material of the doped semiconductor spacers 244 includes polysilicon. In this embodiment, the dielectric material of the insulating cap layer 70L can include undoped silicate glass or a doped silicate glass. The dielectric material of the insulating cap layer 70L can be deposited by a conformal deposition process such as chemical vapor deposition, or can be deposited by a self-planarizing process such as spin coating. Excess portions of the deposited dielectric material can be removed from above the horizontal plane including the top surfaces of the sacrificial pillar structures 48 by a planarization process, which can include chemical mechanical planarization. Each portion of the insulating cap layer 70L that fills the contoured drain-select-level line trenches 174 is herein referred to as a drain-select-level isolation structure 72. In one embodiment, the top surface of the insulating cap layer 70L can be coplanar with the top surfaces of the sacrificial pillar structures 48.

At least the sacrificial matrix layer 170 can be replaced with a combination of the patterned template structure 142, doped semiconductor spacers 244 contacting sidewalls of the patterned template structure 142, and an insulating cap layer 70L by the processing steps FIGS. 3A and 3B through the processing steps of FIG. 8 and FIGS. 22-24. In one embodiment, the combination of the topmost sacrificial material layer 42 and the sacrificial matrix layer 170 can be replaced with combination of the patterned template structure 142, the doped semiconductor spacers 244 contacting sidewalls of the patterned template structure 142, and the insulating cap layer 70L.

Each group of memory stack structures 55 contacting a respective template material block 145 (i.e., a discrete portion of the patterned template structure 142) includes first rows of memory stack structures 55 that are encircled by the template material block and second rows of memory stack structures 55 that contact the template material block only on one side, i.e., not encircled by the template material block. The first rows of the memory stack structures 55 contact the patterned template structure 142 and do not contact any of the doped semiconductor spacers 244. The second rows of the memory stack structures 55 contact the patterned template structure 142 and a respective one of the doped semiconductor spacers 244.

Figure 25:
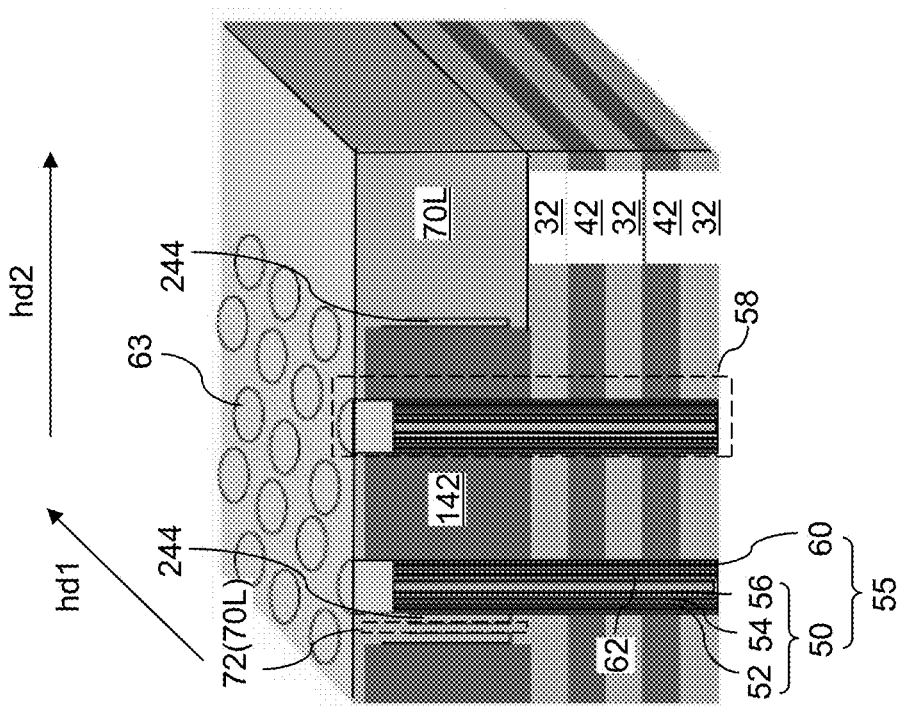
FIG. 25 is a perspective view of the upper region of the second exemplary structure after replacement of the sacrificial pillar structures with memory opening fill structures according to the second embodiment of the present disclosure.

Referring to FIG. 25, the sacrificial pillar structures 48 in the memory openings 49 can be replaced with memory opening fill structures 58 in the memory array region 100. Each memory opening fill structure 58 comprises a memory stack structure 55 and a drain region 63 overlying the memory stack structure 55. Sidewalls of the drain regions 63 contact sidewalls of the combination of the patterned template structure 142 and the insulating cap layer 70L. The sacrificial pillar structures 48 in the support openings 19 in the contact region 300 can be replaced within support pillar structures, which can be identical to the memory opening fill structures 58 except for locations and changes of lateral dimensions that may be induced by differences in the lateral dimensions of the support openings 19 with respective to the memory openings 49. The memory opening fill structures 58 include active device components that flow electrical current under electrical bias, while the support pillar structures are not electrically connected in a configuration that enables electrical current flow, and thus, function only as structural components that provide mechanical support in subsequent processing steps. The processing steps illustrated in FIGS. 13A-13E can be employed to replace each sacrificial pillar structure 48 with the memory array region 100 with a memory opening fill structure 68, and to replace each sacrificial pillar structure 48 within the contact region with a support pillar structure.

Figure 26:
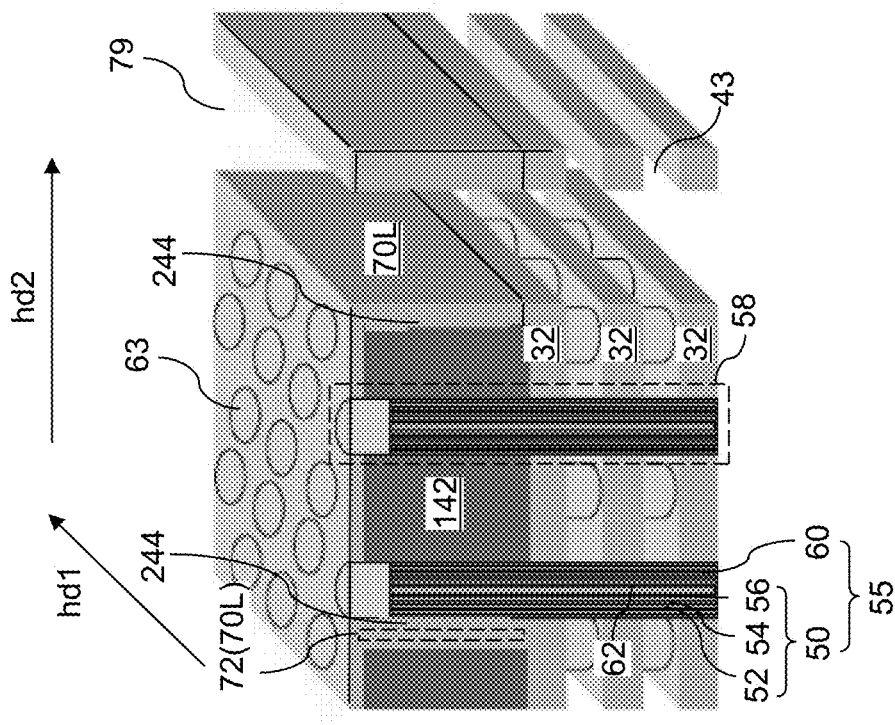
FIG. 26 is a perspective view of the upper region of the second exemplary structure after formation of a backside trench according to the second embodiment of the present disclosure.

Referring to FIG. 26, a photoresist layer (not shown) can be applied over the insulating cap layer 70L, and can be lithographically patterned to form openings in areas between clusters of memory opening fill structures 58. The openings can rectangular openings having straight edges that laterally extend along the first horizontal direction. The areas of the openings do not overlap with the areas of the memory opening fill structures 58 in the memory array region 100 or with the areas of the support pillar structures in the contact region 300. Further, the areas of the openings do not overlap with the areas of the patterned template structure 142 or the doped semiconductor spacers 244.

The pattern in the photoresist layer can be transferred through the insulating cap layer 70L, the alternating stack (32, 42) and the retro-stepped dielectric material portion 65 employing an anisotropic etch to form backside trenches 79. The backside trenches 79 vertically extend from the top surface of the insulating cap layer 70L to a top surface of the source-level sacrificial layer 104, and laterally extend through the memory array region 100 and the contact region 300.

In one embodiment, the backside trenches 79 can laterally extend along the first horizontal direction hd1 and can be laterally spaced apart among one another along the second horizontal direction hd2 (which is perpendicular to the first horizontal direction hd1). The memory stack structures 55 can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between each neighboring pair of a backside trench 79 and a drain-select-level isolation structure 72, and between each neighboring pair of drain-select-level isolation structures 72. The photoresist layer can be removed, for example, by ashing. The patterned template structure 142 is encapsulated by the insulating cap layer 70L, the topmost insulating layer 32, and sidewalls of the memory opening fill structures 58.

Figure 27:
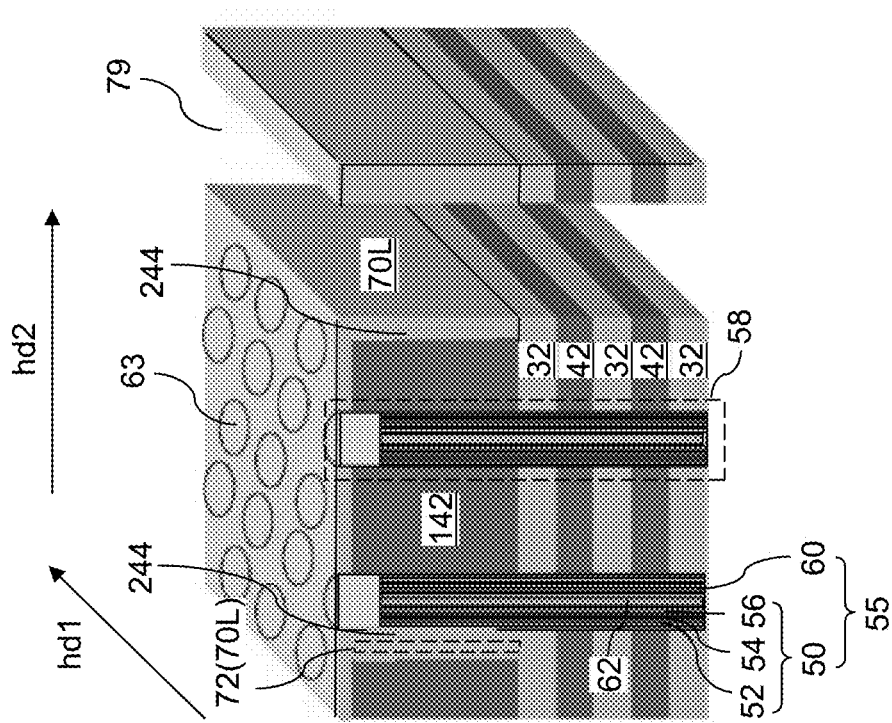
FIG. 27 is a perspective view of the upper region of the second exemplary structure after formation of backside recesses according to the second embodiment of the present disclosure.

Referring to FIG. 27, the processing steps of FIGS. 15A-15E can be performed to replace the in-process source-level material layers 10' with source-level material layers 10.

A source contact layer 114 contacts a lower portion of each sidewall of the vertical semiconductor channels 60 of the memory opening fill structures 58. The source-level material layers 10 can include a set of layers including the buried source layer (112, 114, 116), the source-level insulating layer 117, and the optional source-select-level conductive layer 118 as in the first embodiment.

Subsequently, the sacrificial material layers 42 are can be removed selective to the insulating layers 32, the insulating cap layers 70L, the source contact layer 114, and the drain regions 63. For example, an etchant that selectively etches the materials of the sacrificial material layers 42 with respect to the materials of the insulating layers 32, the insulating cap layer 70L, the retro-stepped dielectric material portion 65 (illustrated in FIGS. 2B and 3B), and the material of the outermost layer of the memory films 50 can be introduced into the backside openings 79, for example, employing an isotropic etch process. For example, the sacrificial material layers 42 can include silicon nitride, the materials of the insulating layers 32, the insulating cap layer 70L, the retro-stepped dielectric material portion 65, and the outermost layer of the memory films 50 can include silicon oxide materials.

The isotropic etch process can be a wet etch process employing a wet etch solution, or can be a gas phase (dry) etch process in which the etchant is introduced in a vapor phase into the backside opening 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art.

Each of the backside recesses 43 can be a laterally extending cavity having a lateral dimension that is greater than the vertical extent of the cavity. In other words, the lateral dimension of each of the backside recesses 43 can be greater than the height of the respective backside recess 43. A plurality of backside recesses 43 can be formed in the volumes from which the material of the sacrificial material layers 42 is removed. Each of the backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each of the backside recesses 43 can have a uniform height throughout.

Referring to FIG. 28, a backside blocking dielectric layer 44 can be subsequently formed in the backside recesses 43. The backside blocking dielectric layer 44 can include at least one dielectric material that is subsequently employed to prevent charge tunneling between the charge storage layers 54 and electrically conductive layers to be subsequently formed in the backside recesses 43. For example, the backside blocking dielectric layer 44 can include silicon oxide and/or a dielectric metal oxide such as aluminum oxide. The backside blocking dielectric layer 44 can be formed by a conformal deposition process such as chemical vapor deposition or atomic layer deposition. The thickness of the backside blocking dielectric layer 44 can be in a range from 1 nm to 6 nm, such as 2 nm to 4 nm, although lesser and greater thicknesses can also be employed.

At least one metallic material can be subsequently deposited in the backside recesses 43 and at peripheral portions of the backside trenches 79. For example, a metallic barrier layer 46A can be conformally deposited in the backside recesses 43, for example, by chemical vapor deposition. The metallic barrier layer 46A can include the same material as in the first embodiment. Subsequently, a metal fill material is deposited in the plurality of backside recesses 43, on the sidewalls of the at least one the backside trench 79, and over the top surface of the insulating cap layer 70L to form a metallic fill material layer 46B. The metallic fill material layer 46B can include the same material as in the first embodiment.

A plurality of electrically conductive layers 46 can be formed in the plurality of backside recesses 43, and a continuous metallic material layer can be formed on the sidewalls of each backside trench 79 and over the insulating cap layer 70L. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer includes a continuous portion of the metallic barrier layer 46A and a continuous portion of the metallic fill material layer 46B that are located in the backside trenches 79 or above the insulating cap layer 70L.

The deposited metallic material of the continuous electrically conductive material layer is etched back from the sidewalls of each backside trench 79 and from above the insulating cap layer 70L, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode, or a select gate electrode, for the plurality of vertical memory devices.

Referring to FIG. 29, a dielectric material is deposited in the backside trenches 79 to form dielectric wall structures 76. Each of the dielectric wall structures 76 can laterally extend along the first horizontal direction hd1 and can vertically extend through each layer of an alternating stack of the insulating layers 32 and the electrically conductive layers 46. Each dielectric wall structure 76 can contact sidewalls of the insulating cap layer 70L.

Subsequently, the material of the insulating cap layer 70L can be recessed by an etch process to physically expose top surfaces of the patterned template structure 142. For example, if the insulating cap layer 70L includes silicon oxide, a wet etch process employing dilute hydrofluoric acid can be employed to remove the horizontal portions of the insulating cap layer overlying the horizontal plane including the top surfaces of the patterned template structure 142. Remaining portions of the insulating cap layer 70L can include insulating cap strips 70 located on both sides of each dielectric wall structure 76 and the drain-select-level isolation structures 72. Each insulating cap strip 70 can have a pair of straight sidewalls that laterally extend along the first horizontal direction hd1 and laterally spaced along the second horizontal direction hd2 by a uniform spacing.

Each drain-select-level isolation structure 72 can include a pair of upper contoured sidewalls, a pair of middle contoured sidewalls, and a pair of lower contoured sidewalls. Each upper contoured sidewall contacts sidewalls of a row of drain regions 63 arranged along the first horizontal direction hd1. Further, each upper contoured sidewall contacts upper end regions of outer sidewalls of a row of memory films 50 arranged along the first horizontal direction hd1. In addition, each upper contoured sidewall contacts upper regions of planar vertical sidewall segments of a sidewall of a template material block, i.e., a discrete portion of the patterned template structure 142. Each middle contoured sidewall contacts a contoured sidewall of a doped semiconductor spacer 244, which includes a set of convex vertical sidewall segments that are arranged along the first horizontal direction hd1 and adjoined among one another at vertical edges or forming a laterally alternating sequence of the convex vertical sidewall segments and planar vertical sidewall segments of the doped semiconductor spacer 244. Each drain-select-level isolation structure 72 can be narrower at the level of the middle contoured sidewall than at levels of the upper contoured sidewall and the lower contoured sidewall. Each upper contoured sidewall contacts regions of outer sidewalls of a row of memory films 50 arranged along the first horizontal direction hd1. Further, each lower contoured sidewall contacts lower regions of planar vertical sidewall segments of a sidewall of a template material block.

Figure 30A:
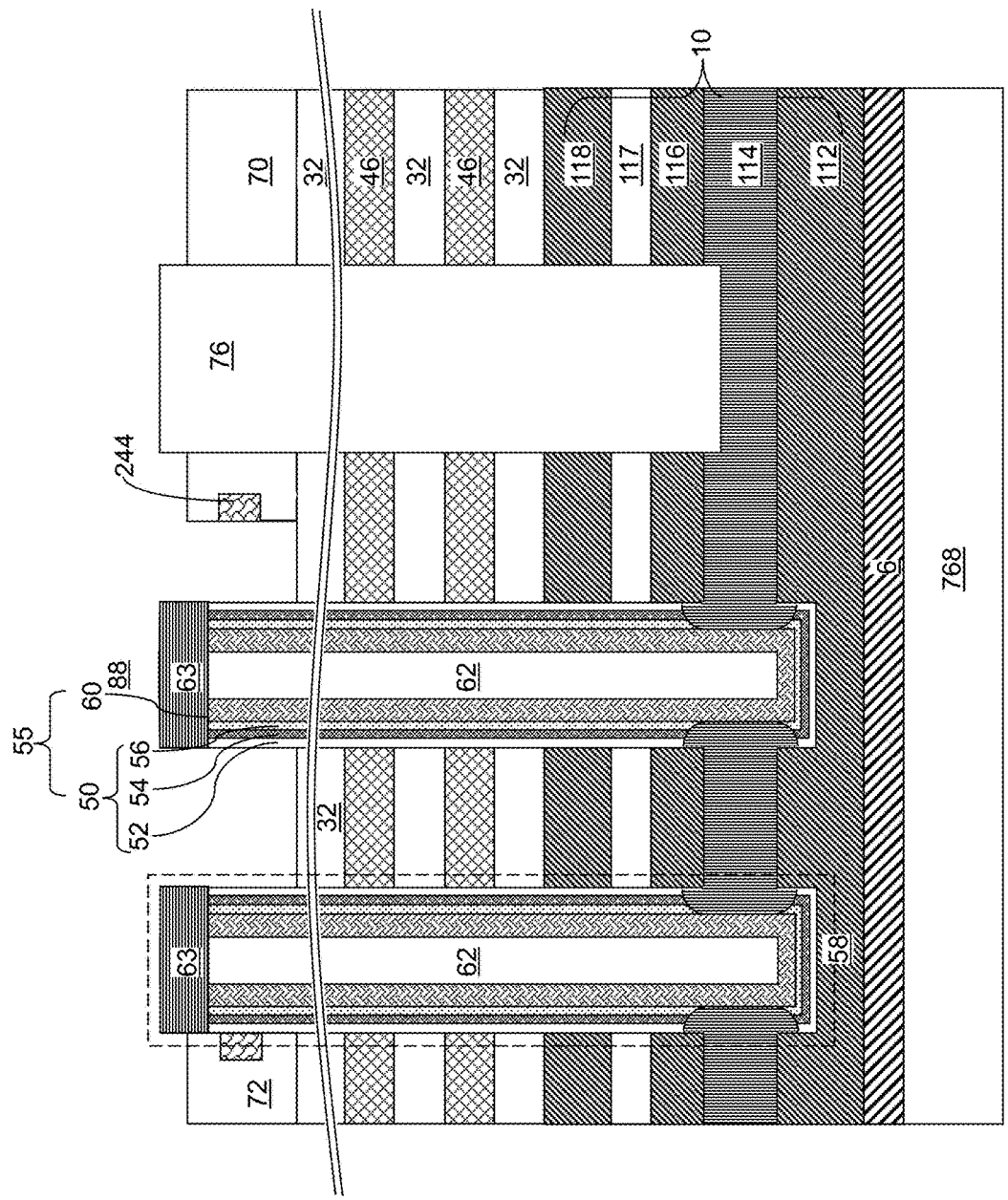
FIG. 30A is a vertical cross-sectional view of a region of the second exemplary structure after formation of drain-select-level cavities by removal of template material blocks according to the second embodiment of the present disclosure.
Figure 30B:
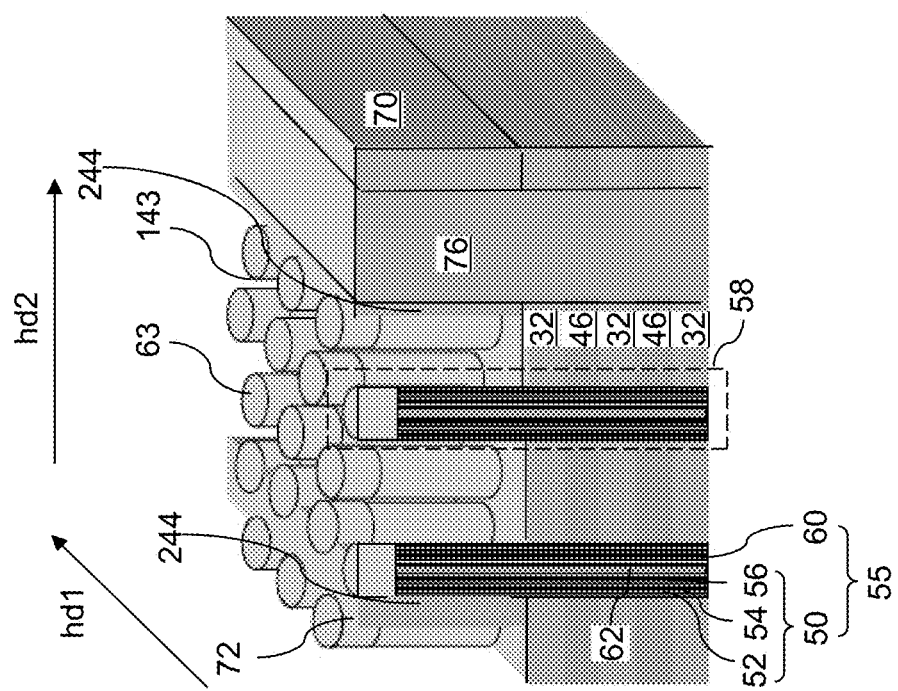
FIG. 30B is a perspective view of an upper region of the second exemplary structure of FIG. 30A.

Referring to FIGS. 30A and 30B, the patterned template structure 142 can be removed selective to the memory opening fill structures 58, the insulating cap strips 70, the drain-select-level isolation structures 72, the doped semiconductor spacers 244, the topmost insulating layer 32, and the dielectric wall structure 76 by an etch process. The etch process can be an anisotropic etch process (such as a reactive ion etch process) or an isotropic etch process (such as a wet etch process). In one embodiment, the entirety of each of the template material blocks 145 of the patterned template structure 142 can be removed employing a wet etch process that removes the template material blocks selective to materials of the doped semiconductor spacers 244 and the physically exposed portions of the memory opening fill structures 58, which include the drain regions 63 and the memory films 50 within the memory stack structures 55. For example, if the template material blocks of the patterned template structure 142 include, or consist essentially of, silicon nitride, a wet etch process employing hot phosphoric acid can be employed to remove the patterned template structure 142. Drain-select-level cavities 143 are formed in each volume from which the template material blocks of the patterned template structure 142 are removed. Regions of outer sidewalls of each memory film 50 that are not covered by the doped semiconductor spacers 244 can be physically exposed.

Each physically exposed surface of the memory films 50 within first rows of the memory opening fill structures 58 (that are not the outermost rows of the memory opening fill structures 58 within each drain-select-level cavity 143) can have a cylindrical configuration. Thus, the physically exposed portion of the outer sidewall of each memory film 50 with the first rows of the memory opening fill structures 58 can azimuthally encompass 360 degrees around a vertical axis that passed through a geometrical center of the volume of the memory opening fill structure 58 that includes the memory film 50. Each memory film 50 within second rows of the memory opening fill structures 58 (that the two outermost rows of the memory opening fill structures 58 within each drain-select-level cavity 143) can be contacted by a respective doped semiconductor spacer 244.

Figure 31A:
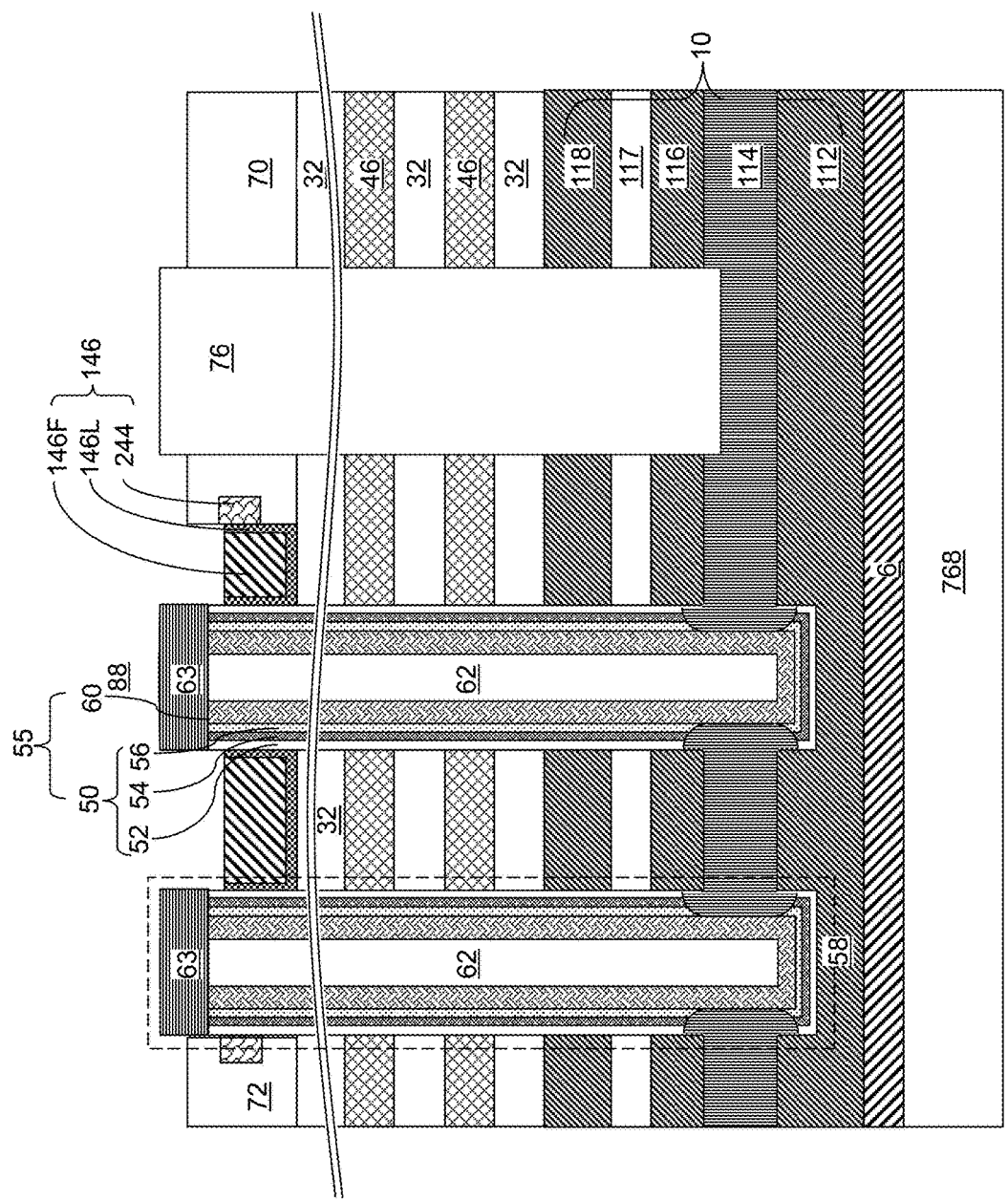
FIG. 31A is a vertical cross-sectional view of a region of the second exemplary structure after formation of drain-select-level electrically conductive strips according to the second embodiment of the present disclosure.
Figure 31B:
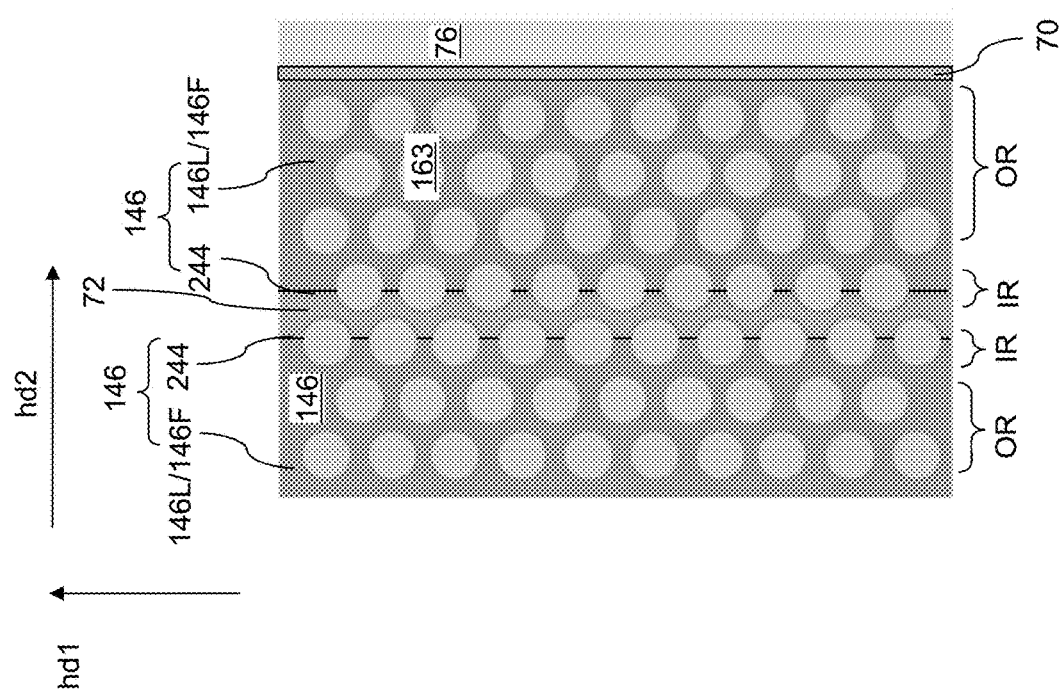
FIG. 31B is a top-down view of a region of the second exemplary structure of FIG. 30A.

Referring to FIGS. 31A and 31B, at least one electrically conductive material can be deposited within volumes of the drain-select-level cavities 143. The at least one electrically conductive material is deposited directly on outer surfaces of the memory stack structures 55. The at least one electrically conductive material can include a metallic nitride liner material and a metallic fill material. The metallic nitride liner material can comprise, for example, TiN, TaN, and/or WN. The metallic fill material can comprise, for example, W, Co, Mo, and Ru. Each of the at least one electrically conductive material can be deposited conformally (for example, employing a chemical vapor deposition process) or non-conformally (for example, employing a physical vapor deposition process). The at least one electrically conductive material can be planarized, for example, by chemical mechanical planarization process, at, or above, the horizontal plane including the top surfaces of the drain regions 63. Subsequently, the at least one electrically conductive material can be vertically recessed below the horizontal plane including the bottom surfaces of the drain regions 63, for example, by a recess etch process. The recess etch process can be selective to the materials of the drain regions 63, the insulating cap strips 70, and the drain-select-level isolation structures 72. Each drain-select-level cavity 143 can be filled with a respective portion of the at least one electrically conductive material. The combination of the remaining portions of the at least one electrically conductive material and the doped semiconductor spacers 244 constitutes drain-select-level conductive strips 146. In one embodiment, the drain-select-level electrically conductive strips 146 can comprise a combination of a respective portion of the at least one deposited electrically conductive material and a respective pair of doped semiconductor spacers 244.

Each drain-select-level conductive strip 146 generally extends along the first horizontal direction hd1. Each drain-select-level conductive strip 146 can include a pair of doped semiconductor spacers 244, a drain-select-level metallic nitride liner 146L (which is a remaining portion of the metallic nitride liner material), and a drain-select-level metallic fill material portion 146F (which is a remaining portion of the metallic fill material). A drain-select-level metallic nitride liner 146L contacts sidewalls of all memory films 50 within a group of memory stack structures 55 located between a neighboring pair of a drain-select-level isolation structure 72 and a dielectric wall structure 76, or between a neighboring pair of drain-select-level isolation structures 72. A doped semiconductor spacer 244 contacts outer sidewalls of memory films 50 within an outermost row of memory stack structures 55 within a group of memory stack structures 55 located between a neighboring pair of a drain-select-level isolation structure 72 and a dielectric wall structure 76, or between a neighboring pair of drain-select-level isolation structures 72.

Figure 32:
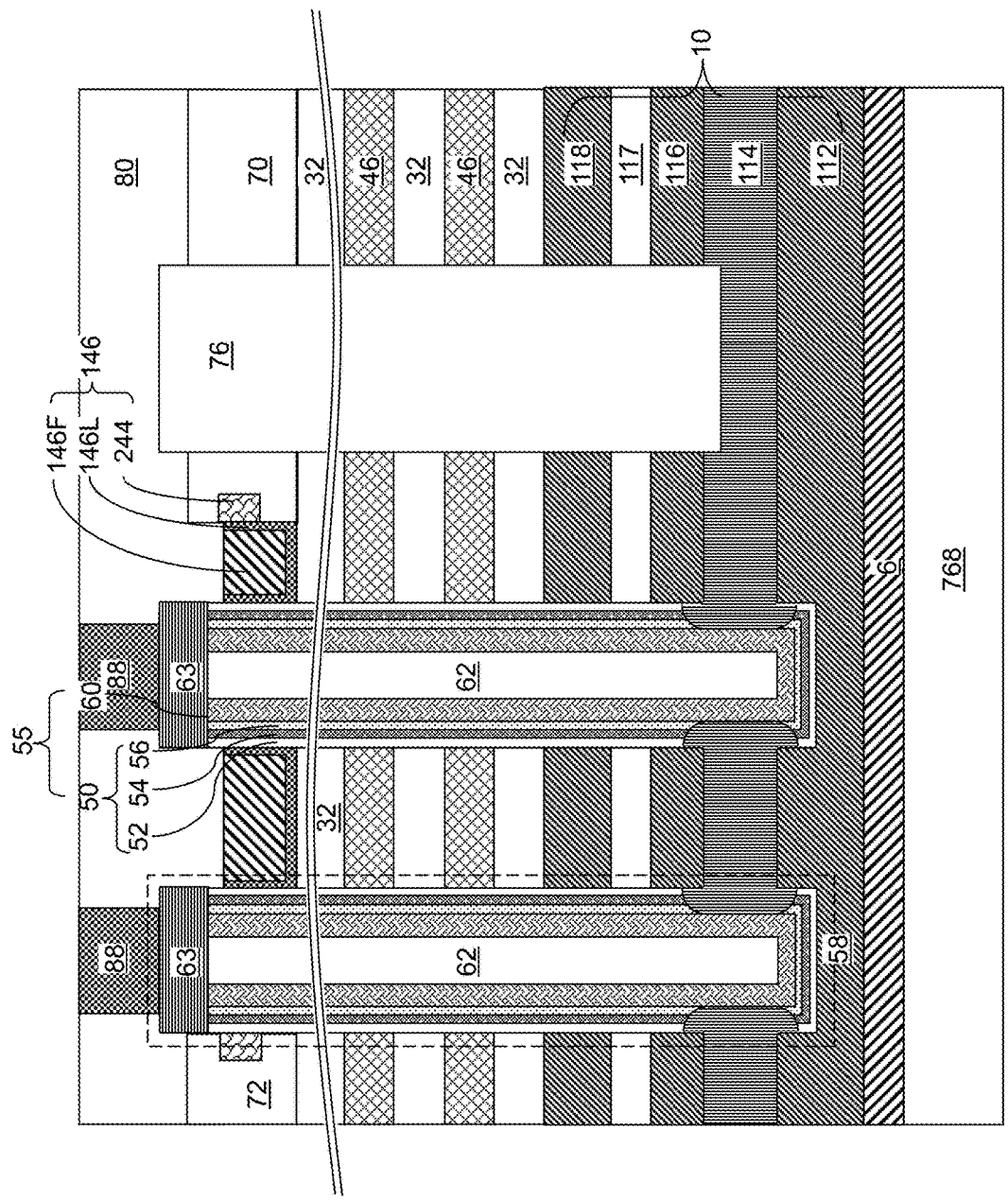
FIG. 32 is a vertical cross-sectional view of a region of the second exemplary structure after formation of a contact level dielectric layer and contact via structures according to the second embodiment of the present disclosure.

Referring to FIG. 32, a dielectric material such as silicate glass can be deposited over the drain-select-level isolation structures 72, the insulating cap strips 70, the drain regions 63, and the dielectric wall structure 76. The dielectric material can be planarized to provide a planar top surface. The planarized remaining portion of the dielectric material constitutes a contact level dielectric layer 80. Drain contact via structures 88 can be formed through the contact level dielectric layer 80 on a top surface of a respective one of the drain regions 63.

Referring to all drawings of the first and second exemplary structures, the second exemplary structure can include a three-dimensional memory device. The three-dimensional memory device can comprise: an alternating stack of insulating layers 32 and electrically conductive layers 46 located over a substrate 8; drain-select-level electrically conductive strips 146 located over the alternating stack (32, 46), wherein each of the drain-select-level electrically conductive strips 146 comprises a combination of at least one metallic material portion (146L, 146F) and a doped semiconductor spacer 244; a drain-select-level isolation structure 72 located between a neighboring pair of drain-select-level electrically conductive strips 146; memory stack structures 55 comprising a memory film 50 and a vertical semiconductor channel 60 vertically extending through the alternating stack (32, 46) and a respective one of the drain-select-level electrically conductive strips 146; and drain regions 63 located on top of a respective one of the memory stack structures 55.

In one embodiment, each doped semiconductor spacer 244 contacts a sidewall of a respective metallic material portion 146L, i.e., a drain-select-level metallic nitride liner 146L. In one embodiment, sidewalls of the drain-select-level electrically conductive strips 146 are in contact with sidewalls of the memory stack structures 55, and are vertically coincident with sidewalls of the drain regions 63.

In one embodiment, each doped semiconductor spacer 244 contacts convex vertical surfaces of a respective subset of the memory stack structures 55. In one embodiment, a bottom periphery of each of the drain regions 63 coincides with a topmost periphery of an outer sidewall of an underlying one of the memory stack structures 55. In one embodiment, an annular top surface of each memory film 50 contacts a bottom surface of a respective drain region 63.

In one embodiment shown in FIG. 31B, at least one metallic material portion (146L, 146F), such as the drain-select-level metallic nitride liner 146L of each of the drain-select-level electrically conductive strips 146 contacts entire sidewalls of all memory films 50 within an inner row (IR) of memory stack structures 55 located distal from the drain-select-level isolation structure 72. The at least one metallic material portion (146L, 146F), such as the drain-select-level metallic nitride liner 146L of each of the drain-select-level electrically conductive strips 146 contacts inner parts of sidewalls of all memory films 50 within an outer row (OR) of memory stack structures 55 located between the drain-select-level isolation structure 72 and the inner row(s) (IR) of memory stack structures 55. The doped semiconductor spacer 244 contacts outer parts of sidewalls of all memory films 50 within the outer row of memory stack structures 55.

In one embodiment, the at least one metallic material portion (146L, 146F) comprises a metallic nitride liner 146L and a metallic fill material portion 146F; and the doped semiconductor spacer 244 contacts the metallic nitride liner 146L. In one embodiment, the doped semiconductor spacer 244 has a bottom surface that is vertically offset from a bottom surface of the metallic nitride liner 146L.

In one embodiment, the drain-select-level isolation structure 72 generally extend along a first horizontal direction hd1; and the drain-select-level isolation structure 72 includes a pair of laterally alternating sequences of planar vertical sidewall segments and concave vertical sidewall segments that alternate along the first horizontal direction hd1. In one embodiment, each of the concave vertical sidewall segments is laterally spaced from a respective most proximal one of the memory stack structures by a uniform lateral spacing, which can be the lateral thickness of a doped semiconductor spacer 244.

In one embodiment, the three-dimensional memory device comprises: a source contact layer 114 underlying the alternating stack (32, 46) and contacting vertical semiconductor channels 60 within the memory stack structures 55; and a dielectric wall structure 76 vertically extending through the alternating stack (32, 46), laterally extending along the first horizontal direction hd1, and laterally spaced from the drain-select-level electrically conductive strips 146 and the drain-select-level isolation structure 72 by a portion of an insulating cap strip 70.

Figure 33A:
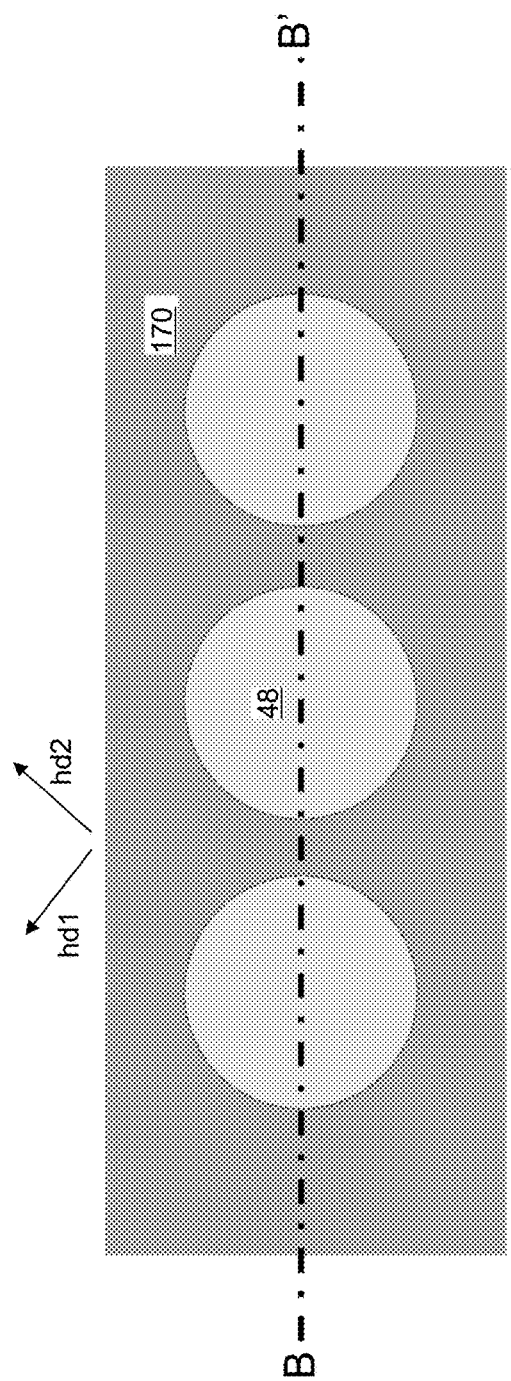
FIG. 33A is a top-down view of a region of a third exemplary structure after formation of sacrificial pillar structures according to a third embodiment of the present disclosure.
Figure 33B:
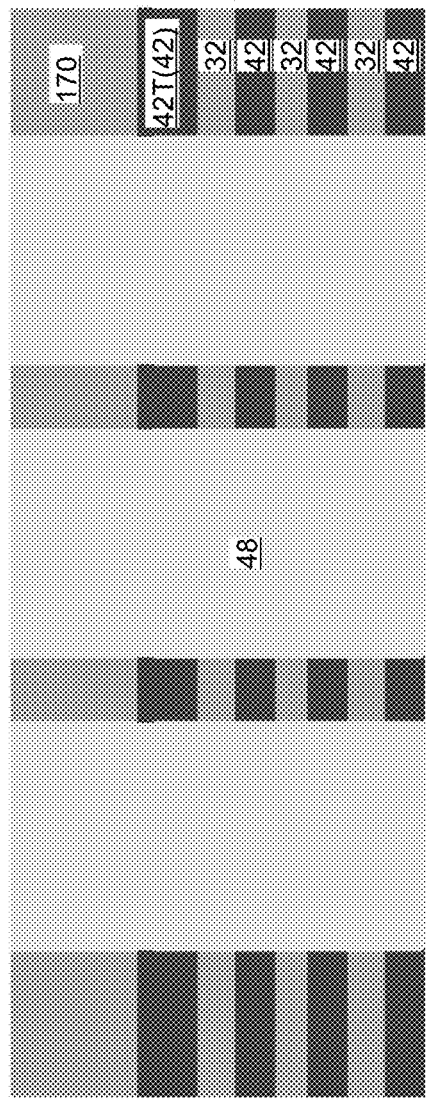
FIG. 33B is a vertical cross-sectional view of the third exemplary structure of FIG. 33A along the vertical plane B-B'.

Referring to FIGS. 33A and 33B, a third exemplary structure according to a third embodiment of the present disclosure can be the same as the first exemplary structure illustrated in FIG. 4 of the first embodiment. A topmost sacrificial material layer 42T is expressly illustrated. Each of the sacrificial pillar structures 48 can be formed through the sacrificial matrix layer 170 and through the alternating stack (32, 42) with a straight sidewall that extends from the bottommost surface of the alternating stack (32, 42) to the topmost surface of the sacrificial matrix layer 170. Each sacrificial pillar structure 48 is an in-process structure, i.e., a structure that is modified during a subsequent processing step. As such, each of the in-process sacrificial pillar structures 48 comprises a straight sidewall that extend from a bottom surface of a respective in-process sacrificial pillar structure 48 to a top surface of the sacrificial matrix layer 170, Referring to FIGS. 34A and 34B, the sacrificial matrix layer 170 can be removed selective to the materials of the topmost sacrificial material layer 42T and the sacrificial pillar structures 48 (i.e., the in-process sacrificial pillar structures 48). For example, if the topmost sacrificial material layer 42T comprises silicon nitride and if the sacrificial pillar structures 48 include a semiconductor material such as amorphous silicon, the sacrificial matrix layer 170 can be removed selective to the topmost sacrificial material layer 42T and the sacrificial pillar structures 48 by performing a wet etch process employing dilute hydrofluoric acid.

Referring to FIGS. 35A and 35B, each of the in-process sacrificial pillar structures 48 is modified to isotropically reduce a lateral extent thereof above the alternating stack (32, 42) without reducing the lateral extent at levels below the topmost sacrificial material layer 42T of the alternating stack (32, 42). In other words, upper regions of the in-process sacrificial pillar structures 48 that protrude above a topmost surface of the alternating stack (32, 42) are thinned to provide sacrificial pillar structures 48 that have a lesser lateral dimension in upper regions protruding above the alternating stack (32, 42) compared to lower regions embedded in the alternating stack (32, 42).

For example, an oxidation process can be performed to convert physically exposed surface portions of the sacrificial pillar structures 48 into semiconductor oxide portions 247. For example, if the sacrificial pillar structures 48 include amorphous silicon, a thermal oxidation process can be performed to convert surface portions of the sacrificial pillar structures 48 into silicon oxide portions. Each remaining sacrificial pillar structure 48 can have an upper region 48U having a respective maximum lateral dimension, which is herein referred to as a first maximum lateral dimension mld1, and a lower region 48L having a respective maximum lateral dimension, which is herein referred to as a second maximum lateral dimension mld2, which is greater than dimension mld1. The upper region 48U can be located above the horizontal plane including the bottom surface of the topmost sacrificial material layer 42T, and the lower region 48L can be located below the horizontal plane including the top surface of the topmost sacrificial material layer 42T. Thus, the sacrificial pillar structures extend through the alternating stack (32, 42) and include a respective upper region 48U that protrudes above the alternating stack (32, 42) and having a first maximum lateral dimension mld1 and a respective lower region 48L embedded within the alternating stack (32, 42) and having a second maximum lateral dimension mld2 that is greater than the first maximum lateral dimension mld1.

Referring to FIGS. 36A and 36B, the semiconductor oxide portions 247 can be removed selective to the sacrificial pillar structures 48 and the topmost sacrificial material layer 42T. For example, a wet etch process employing dilute hydrofluoric acid can be performed to isotropically etch the semiconductor oxide portions 247 without etching the sacrificial pillar structures 48 and the topmost sacrificial material layer 42T.

Figure 37A:
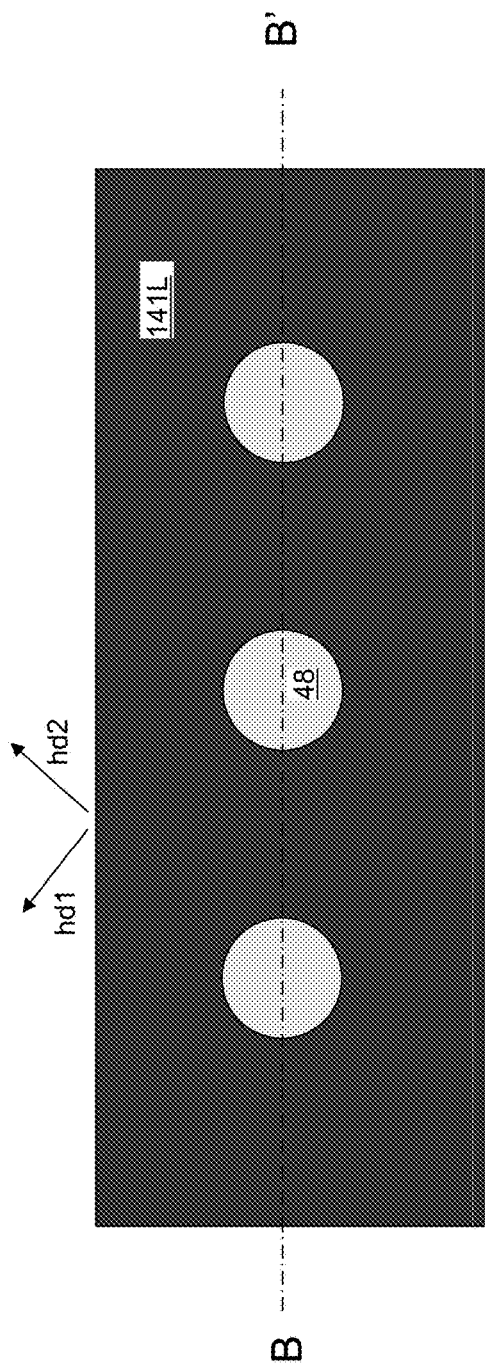
FIG. 37A is a top-down view of a region of the third exemplary structure after formation of a first template material layer according to the third embodiment of the present disclosure.
Figure 37B:
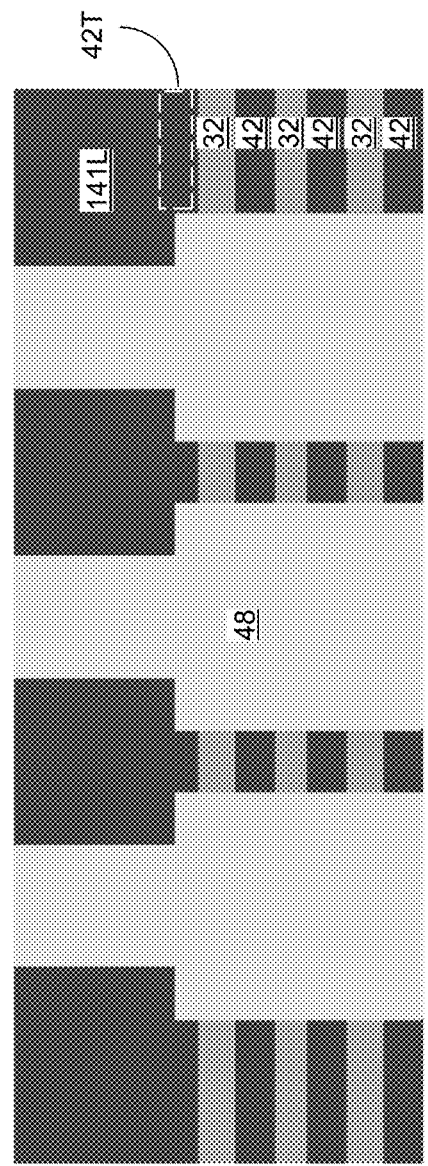
FIG. 37B is a vertical cross-sectional view of the third exemplary structure of FIG. 37A along the vertical plane B-B'.

Referring to FIGS. 37A and 37B, a first template material can be deposited above the topmost sacrificial material layer 42T. The first template material is different from the materials of the sacrificial pillar structures 48 and the insulating layers 32, and may be the same as, or may be different from, the material of the topmost sacrificial material layer 42T. In one embodiment, the topmost sacrificial material layer 42T can include silicon nitride, and the first template material can include silicon nitride. The first template material can be deposited by a conformal deposition process such as low pressure chemical vapor deposition (LPCVD). Excess portions of the first template material can be removed from above the top surface of the sacrificial pillar structures 48 by a planarization process such as chemical mechanical planarization. The remaining continuous portion of the first template material forms a first template material layer 141L, which is a continuous first template material portion that laterally surrounds upper end portions of the sacrificial pillar structures 48. The top surfaces of the sacrificial pillar structures 48 can be coplanar with the top surfaces of the first template material layer 141L.

Referring to FIGS. 38A and 38B, a masking layer (not shown), such as a photoresist layer, can be applied over the third exemplary structure, and can be patterned by lithographic exposure and development to cover multiple areas within the memory array region 100. The pattern of the sacrificial pillar structures 48 can be the same as in the first exemplary structure illustrated in FIG. 5. The pattern of the pattern of the openings in the photoresist layer can be the complement of the pattern of the openings in the photoresist layer in the first exemplary structure illustrated in FIG. 5. In other words, all areas of the third exemplary structure corresponding to the complement of the combinations of the first areas A1 and the second areas A2 in the first exemplary structure of FIG. 5 can be covered with the patterned photoresist layer, and all areas of the third exemplary structure corresponding to the combination of the first areas A1 and the second areas A2 in the first exemplary structure of FIG. 5 can contain openings in the photoresist layer over the third exemplary structure. In other words, the patterned photoresist layer in the third embodiment includes openings in the first and second areas (A1, A2) illustrated in FIG. 5.

The first template material layer 141L can be patterned into first template material portions 141 by an anisotropic etch process employing the patterned photoresist layer as an etch mask. Specifically, unmasked regions of the first template material layer 141L can be anisotropically etched employing an etch chemistry that is selective to the material of the sacrificial pillar structures 48 and the photoresist layer. For example, if the sacrificial pillar structures 48 include amorphous silicon and if the sacrificial matrix layer 170 includes a silicate glass material, an etch chemistry that etches silicon nitride selective to silicon and silicon oxide, such as a reactive ion etch process employing $CHF_4/O_2$, $CF_4/O_2$, $SF_6$, or $SF_6/O_2$ with no or minimal ion assistance, can be employed for the anisotropic etch process. The first template material layer 141L and the topmost sacrificial material layer 42T can be etched through in each area that is not covered by the photoresist layer. Drain-select-level line trenches (173, 174) can be formed by the anisotropic etch process. The drain-select-level line trenches (173, 174) are line trenches that are formed at a drain select level, which is a level at which drain select gate electrodes are subsequently formed. The pattern of the drain-select-level line trenches (173, 174) can be the same as in the first exemplary structure illustrated in FIG. 8.

The drain-select-level line trenches (173, 174) can include straight drain-select-level line trenches 173 (as shown in FIG. 8 and having the same geometrical shape as in FIG. 8) and contoured drain-select-level line trenches 174. The straight drain-select-level line trenches 173 include a respective pair of straight sidewalls that extend along the first horizontal direction. The contoured drain-select-level line trenches 174 generally extend along the first horizontal direction hd1. Each contoured drain-select-level line trench 174 can have a pair of sidewalls including a respective alternating sequence of planar vertical sidewall segments and concave vertical sidewall segments. The planar vertical sidewall segments are physically exposed surface segments of the patterned first template material portions 141. The concave vertical sidewall segments are physically exposed surface segments of the sacrificial pillar structures 48. The photoresist layer can be subsequently removed, for example, by ashing.

Generally, the first template material portions 141 can be formed by depositing a first template material layer 141L over the alternating stack (32, 42) and around the upper regions of the sacrificial pillar structures 48, forming a masking layer including openings over the first template material layer 141L and the sacrificial pillar structures 48, and anisotropically etching unmasked regions of the first template material layer 141L selective to the sacrificial pillar structures 48, i.e., without etching the sacrificial pillar structures 48. The openings in the masking layer can have a respective uniform width. Remaining portions of the first template material layer 141L constitute the first template material portions 141.

Referring to FIGS. 39A and 39B, a second template material layer, which is herein referred to as a conformal template material liner 144L, can be conformally deposited on the physically exposed surfaces of the first template material portions 141, the sacrificial pillar structures 48, and the topmost insulating layer 32. The material of the conformal template material liner 144L may be the same as, or may be different from, the material(s) of the first template material portions 141. The material of the conformal template material liner 144L is herein referred to as a second template material. The second template material is different from the material to be subsequently employed to form an insulating cap layer. In one embodiment, the conformal template material liner 144L includes a dielectric material such as silicon nitride. In one embodiment, the first template material portions 141 and the conformal template material liner 144L comprise a same material (e.g., silicon nitride) that is different from the material (e.g., silicon oxide) of the insulating layers 32. In one embodiment, the first template material portions 141 and the conformal template material liner 144L can comprise, and/or consist essentially of, silicon nitride. The conformal template material liner 144L can be deposited by a conformal deposition process such as low pressure chemical vapor deposition (LPCVD) process. The thickness of the conformal template material liner 144L can be in a range from 1 nm to 10 nm, such as from 2 nm to 6 nm, although lesser and greater thicknesses can also be employed.

Referring to FIGS. 40A and 40B, the conformal template material liner 144L can be anisotropically etched, for example, by a reactive ion etch process. The anisotropic etch process can be selective to the material of the sacrificial pillar structures 48 and the insulating layers 32. For example, if the conformal template material liner 144L and the first template material portions 141 include silicon nitride and if the sacrificial pillar structures 48 include a semiconductor material, an anisotropic etch employing $CHF_4/O_2$, $CF_4/O_2$, $SF_6$, or $SF_6/O_2$ with no or minimal ion assistance can be employed to provide selectivity with respect to silicon oxide. Horizontal portions of the conformal template material liner 144L are removed by the anisotropic etch process, and remaining vertical portions of the conformal template material liner 144L constitute second template material portions 144. The second template material portions 144 are formed on sidewalls of each first template material portion 141. In one embodiment, a pair of second template material portions 144 may be formed on a first template material portion 141. The drain-select-level line trenches (173, 174) are vertically extended by the anisotropic etch process.

Each contiguous combination of a first template material portion 141, at least one second template material portion 144, and an underlying portion of the topmost sacrificial material layer 42T (if present) constitutes a template material block 145. The collection of all template material blocks 145 constitutes a patterned template structure 142. In one embodiment, the template material blocks 145 can be free of any semiconductor material.

The second template material portions 144 can be formed as spacers having a uniform lateral thickness. A subset of the second template material portions 144 that are formed at a periphery of a straight drain-select-level line trench 173 (illustrated in FIG. 10) can have a pair of straight sidewalls that laterally extend along the first horizontal direction hd1. A subset of the second template material portions 144 formed at a periphery of a contoured drain-select-level line trench 174 can have an inner sidewall and an outer sidewall. The inner sidewall can have a laterally alternating sequence of planar vertical sidewall segments that contact a respective one of the first template material portion 141 and concave vertical sidewall segments that contact upper portions of sidewalls of a row of sacrificial pillar structures 48. The outer sidewall can have a set of convex vertical sidewall segments. In one embodiment, the outer sidewall can have a laterally alternating sequence of planar vertical sidewall segments and convex vertical sidewall segments that generally extends along the first horizontal direction hd1. In another embodiment, the outer sidewall can have convex vertical sidewall segments that are adjoined among one another at vertical edges. The convex vertical sidewall segments of the second template material portions 144 can be laterally spaced from a most proximal one of sidewalls of the sacrificial pillar structures 48 by a same uniform lateral spacing, which is the lateral thickness of the second template material portions 144. The remaining volume of each contoured drain-select-level line trench 174 defines a gap that laterally extends along the first horizontal direction hd1 and having a modulated width. The gap defined by the contoured drain-select-level line trench 174 is self-aligned to sidewalls of peripheral rows of the sacrificial pillar structures 48 that are located on either side of the contoured drain-select-level line trench 174. A top surface of the topmost insulating layer 32 can be physically exposed at the bottom of each of the drain-select-level line trenches (173, 174).

Figure 41A:
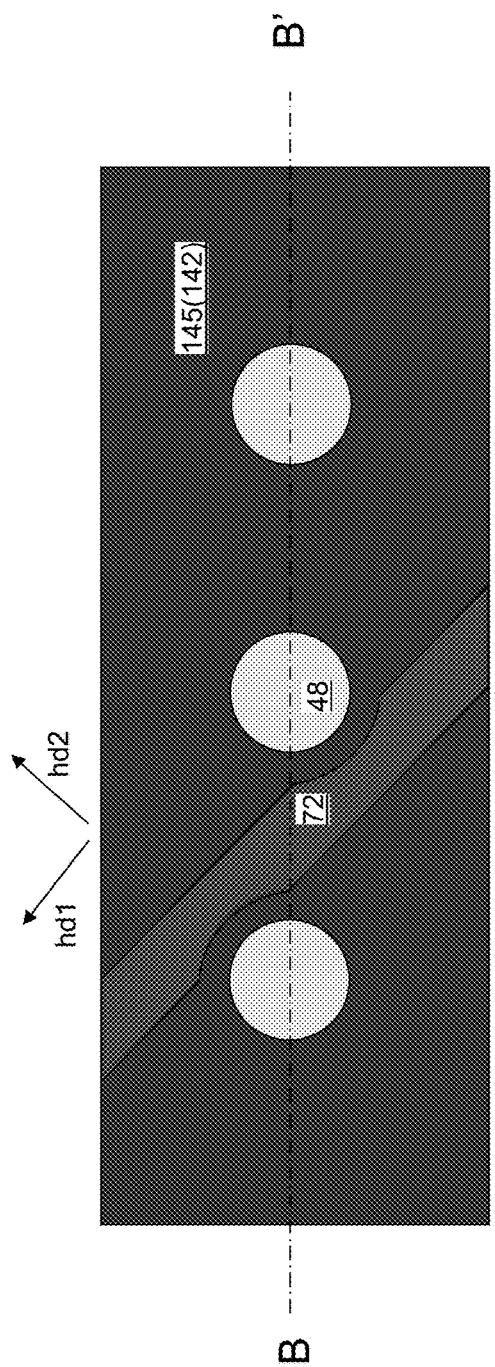
FIG. 41A is a top-down view of a region of the third exemplary structure after formation of drain-select-level isolation structures according to the third embodiment of the present disclosure.
Figure 41B:
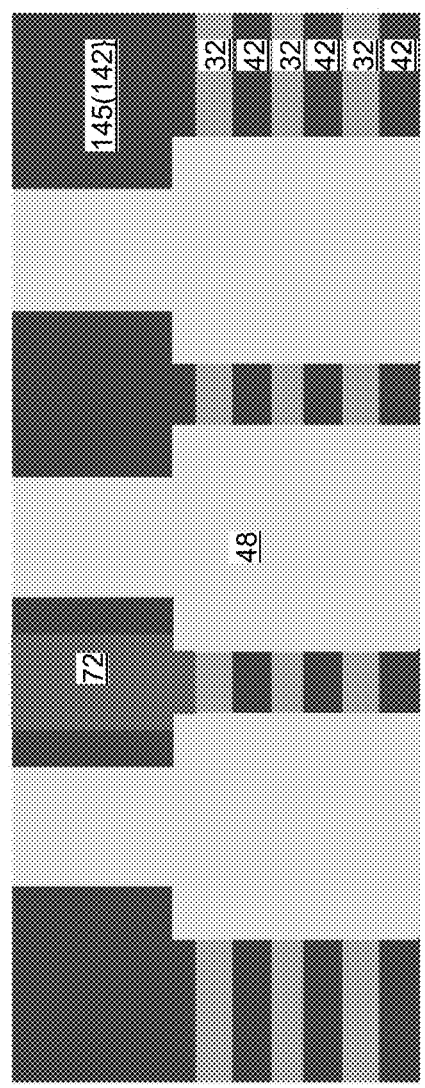
FIG. 41B is a vertical cross-sectional view of the third exemplary structure of FIG. 41A along the vertical plane B-B'.

Referring to FIGS. 41A and 41B, a dielectric material can be deposited in the drain-select-level line trenches (173, 174) and over the patterned template structure 142 (i.e., the template material blocks 145). The dielectric material can be removed from above the horizontal plane including the top surface of patterned template structure 142 by a planarization process such as a recess etch and/or chemical mechanical planarization. Remaining portions of the dielectric material constitute an insulating cap layer, which fill the drain-select-level line trenches (173, 174). Specifically, remaining portions of the dielectric material in the contoured drain-select-level line trenches 174 constitute drain-select-level isolation structures 72, and remaining portions of the dielectric material in the straight drain-select-level line trenches 173 constitute insulating cap strips, as described above with respect to the first embodiment.

At least the sacrificial matrix layer 170 can be replaced with a combination of the patterned template structure 142 and an insulating cap layer (i.e., the combination of the drain-select-level isolation structures 72 and the insulating cap strips such as the insulating cap strips 70 illustrated in FIGS. 20A, 20B, 31A, and 31B) by the processing steps FIGS. 34A and 34B through the processing steps of FIGS. 41A and 41B. A combination of a patterned template structure 142 and dielectric material portions (such as the drain-select-level isolation structures 72 and the insulating cap strips such as the insulating cap strips 70 illustrated in FIGS. 20A, 20B, 31A, and 31B) are formed over the alternating stack (32, 42) and around the upper regions 48U of the sacrificial pillar structures 48. The patterned template structure 142 comprises template material blocks 145 that laterally surround upper regions 48U of a respective subset of the sacrificial pillar structures 48 and have a respective sidewall including a plurality of convex vertical sidewall segments. In one embodiment, the combination of the topmost sacrificial material layer 42T and the sacrificial matrix layer 170 can be replaced with combination of the patterned template structure 142 and the insulating cap layer. The patterned template structure 142 comprises template material blocks 145 that laterally surround an upper region of a respective subset of the sacrificial pillar structures 48 and have a respective sidewall including a plurality of convex vertical sidewall segments. The plurality of convex vertical sidewall segments of the patterned template structure 142 (i.e., of the template material blocks 145) contact a plurality of concave vertical sidewall segments of the drain-select-level isolation structures 72.

Referring to FIGS. 42A and 42B, an isotropic etchant that etches the material of the sacrificial pillar structures 48 selective to the materials of the patterned template structure 142, the drain-select-level isolation structures 72, and the alternating stack (32, 42) can be applied to the third exemplary structure. The sacrificial pillar structures 48 are removed by the isotropic etchant to form memory cavities 49', which are unfilled volumes of the memory openings 49 at this processing step. For example, if the sacrificial pillar structures 48 comprise silicon, the sacrificial pillar structures 48 can be removed by a wet etch process employing hot trimethyl-2 hydroxyethyl ammonium hydroxide ("hot TMY") or tetramethyl ammonium hydroxide (TMAH).

Referring to FIGS. 43A and 43B, a blocking dielectric 52 and a charge storage layer 54 can be formed as continuous material layers employing conformal deposition processes. The blocking dielectric 52 can have the same composition and thickness as in the first and second embodiments. The charge storage layer 54 can have the same composition and thickness as in the first and second embodiments. A cover material layer 261L can be formed by conformally depositing a cover material, which is a sacrificial material that can be removed selective to the materials of the blocking dielectric 52 and the charge storage layer 54. The cover material layer 261L can include, for example, amorphous silicon, a silicon-germanium alloy, amorphous carbon, or a diamond-like carbon (DLC).

Referring to FIGS. 44A and 44B, portions of the cover material layer 261L can be removed by an anisotropic etch process such as a reactive ion etch process. Portions of the cover material layer 261L overlying the patterned template structure 142 or not masked by overlying portions of the blocking dielectric 52 or the charge storage layer 54 are removed from inside the memory openings 49. Thus, upper portions of the cover material layer 261L at a level of the combination of the patterned template structure 142 and the dielectric material portions (such as the drain-select-level isolation structures 72 and the insulating cap strips such as the insulating cap strips 70 illustrated in FIGS. 20A, 20B, 31A, and 31B) are removed without removing lower portions of the cover material layer 261L located at levels of the alternating stack (32, 42). Each remaining portion of the cover material layer 261L constitutes a cover material portion 261. Each cover material portion 261 can have a cylindrical configuration, and covers cylindrical portions of the charge storage layer located at the levels of the alternating stack (32, 42) and underlies the patterned template structure 142.

Figure 45A:
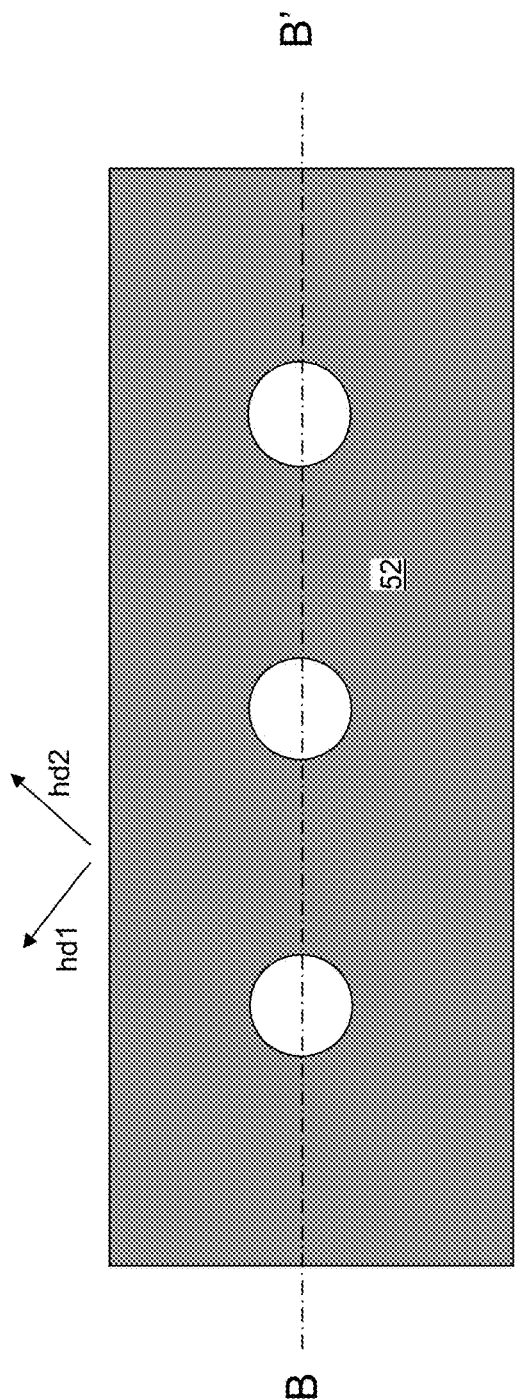
FIG. 45A is a top-down view of a region of the third exemplary structure after removal of unmasked portions of the charge storage layers according to the third embodiment of the present disclosure.
Figure 45B:
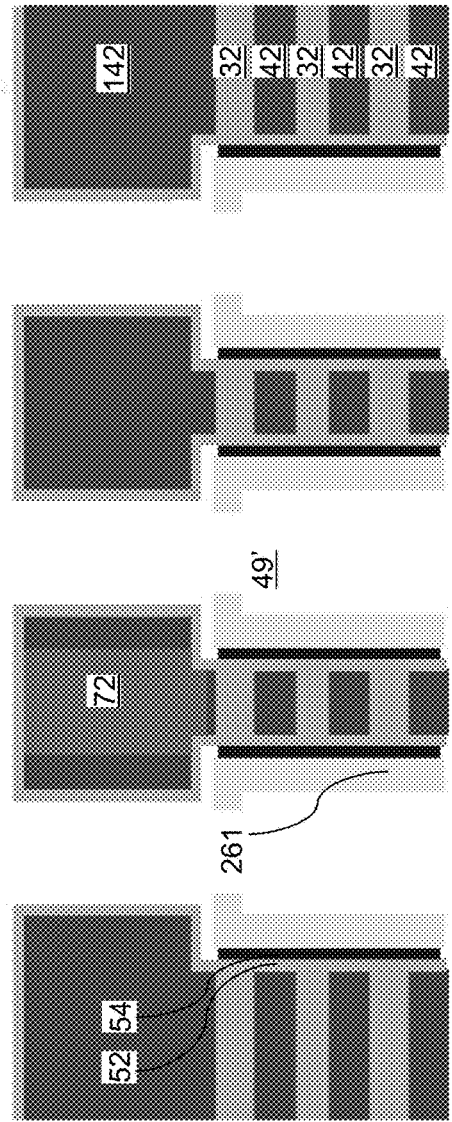
FIG. 45B is a vertical cross-sectional view of the third exemplary structure of FIG. 45A along the vertical plane B-B'.

Referring to FIGS. 45A and 45B, unmasked portions of the charge storage layer 54 can be removed selective to the blocking dielectric layer 52. Thus, upper portions of the charge storage layer 54 at the level of the combination of the patterned template structure 142 and the dielectric material portions (such as the drain-select-level isolation structures 72 and the insulating cap strips such as the insulating cap strips 70 illustrated in FIGS. 20A, 20B, 31A, and 31B) are removed without removing lower portions of the charge storage layer 54 located at the levels of the alternating stack (32, 42). For example, if the charge storage layer 54 comprises silicon nitride and if the blocking dielectric 52 comprises silicon oxide, the unmasked portions of the charge storage layer 54 can be removed selective to the blocking dielectric 52 employing a wet etch process that etches silicon nitride selective to silicon oxide. For example, a wet etch process employing a combination of $NH_4F$, NaOH, HF, glycerin, and/or $H_2O$ can be employed to remove the unmasked portions of the charge storage layer 54 selective to the blocking dielectric 52.

Figure 46A:
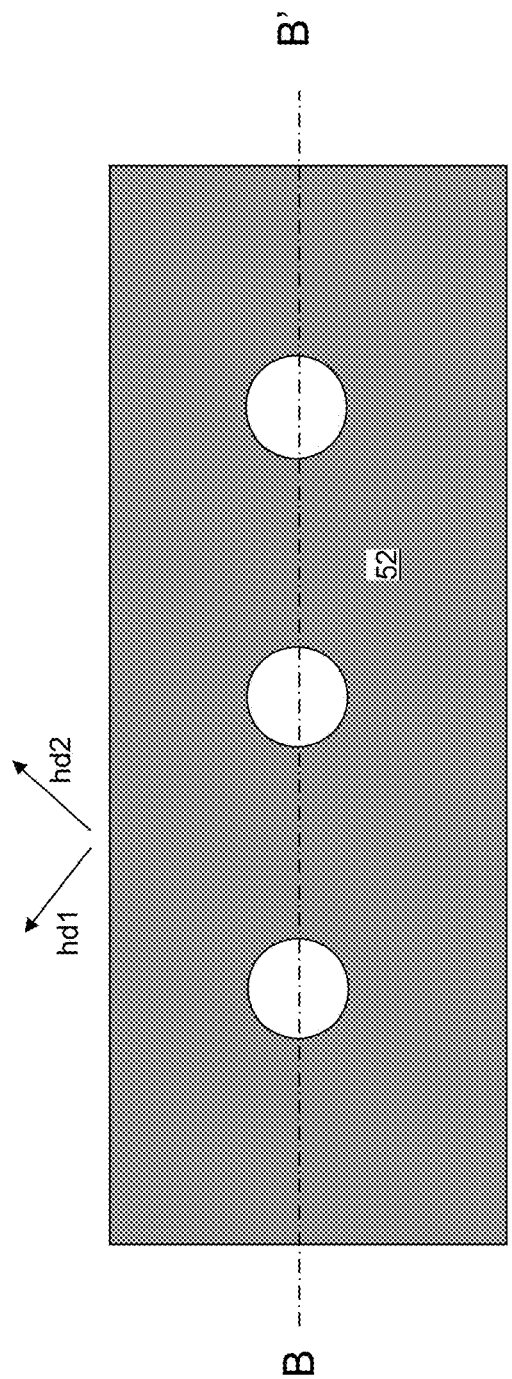
FIG. 46A is a top-down view of a region of the third exemplary structure after removal of the cylindrical cover material portions according to the third embodiment of the present disclosure.
Figure 46B:
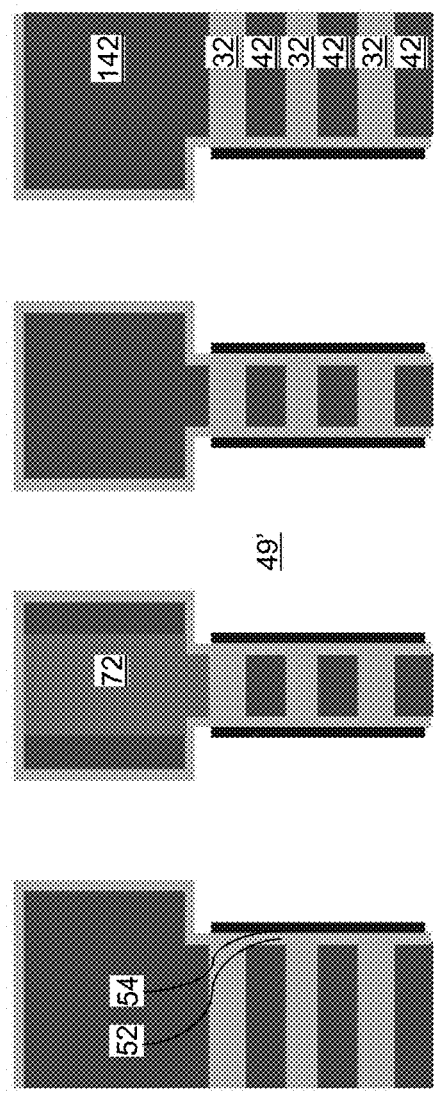
FIG. 46B is a vertical cross-sectional view of the third exemplary structure of FIG. 46A along the vertical plane B-B'.

Referring to FIGS. 46A and 46B, the cover material portions 261 can be removed selective to the materials of the charge storage layers 54 and the blocking dielectrics 52. For example, if the cover material portions 261 include a semiconductor material such as amorphous silicon, a wet etch process employing hot trimethyl-2 hydroxyethyl ammonium hydroxide ("hot TMY") or tetramethyl ammonium hydroxide (TMAH) can be employed to remove the cover material portions 261. If the cover material portions 261 comprise carbon, the cover material portions 261 can be removed by ashing.

Referring to FIGS. 47A and 47B, a tunneling dielectric 56 and a semiconductor channel material layer can be formed as continuous material layers at the periphery of each memory cavity 49' by conformal deposition processes. The semiconductor channel material layer can have a doping of the first conductivity type as in the first and second embodiments. A dielectric material is deposited on the semiconductor channel material layer and is vertically recessed to form dielectric cores 62. The top surfaces of the dielectric cores 62 can be located between the first horizontal plane including the top surface of the patterned template structure 142 and the second horizontal plane including the bottommost surface of the patterned template structure 142. Core cavities (i.e., air gaps) 69 can be formed in the volumes within the dielectric cores 62 that are not filled with the material of the dielectric cores 62. Each dielectric core 62 can embed a core cavity 69 that is devoid of any solid material therein. An upper cylindrical portion of each dielectric core 62 protrudes above the respective core cavity 69 above a horizontal plane including a bottom surface of the patterned template structure 142. Each core cavity 69 can have a maximum lateral dimension mldc that is greater than a maximum lateral dimension of the upper cylindrical portion of the dielectric core 62.

A semiconductor fill material can be deposited in recesses above the top surfaces of the dielectric cores 62. Portions of the blocking dielectric 52, the charge storage layer 54, the tunneling dielectric 56, the semiconductor channel material layer, and the semiconductor fill material located above the horizontal plane including the top surface of the patterned template structure 142 can be removed by a planarization process such as chemical mechanical planarization. Each remaining portion of the semiconductor fill material constitutes a drain semiconductor material portion 163.

The continuous material layer of the blocking dielectric 52 is divided into multiple discrete blocking dielectrics 52 located within a respective one of the memory openings 49. The continuous material layer of the tunneling dielectric 56 is divided into multiple discrete tunneling dielectrics 56. Remaining portions of the semiconductor channel material layer include multiple discrete vertical semiconductor channels 60. Each contiguous combination of a blocking dielectric 52, a charge storage layer 54, and a tunneling dielectric 56 constitutes a memory film 50. Each contiguous combination of a memory film 50 and a vertical semiconductor channel 60 constitutes a memory stack structure 55. Each memory film 50 comprises a first vertically-extending portion 501 that extends vertically through the alternating stack (32, 42) with a first sidewall (which may be an inner sidewall or an outer sidewall); a horizontally-extending portion 502 that extends horizontally between the patterned template structure 142 and a topmost one of the sacrificial material layers 42 (that is not a part of the patterned template structure 142); and a second vertically-extending portion 503 that extends vertically through a respective template material block 145 (which is a discrete portion within the patterned template structure 142).

In one embodiment, each memory film 50 comprises a stack of a blocking dielectric 52, a charge storage layer 54, and a tunneling dielectric 56; and the entirety of the charge storage layer 54 is located below a bottom surface of the patterned template structure 142. Dielectric cores 62 can be embedded within a respective one of the vertical semiconductor channels 60 and can include a respective upper cylindrical portion embedded within the patterned template structure 142. The core cavities 69 can be embedded within a respective one of the dielectric cores 62, and can have a maximum lateral dimension mldc that is greater than a maximum lateral dimension of an overlying one of the upper cylindrical portions of the dielectric cores 62.

In one embodiment, each memory film 50 can be formed as a stack of a blocking dielectric 52, a charge storage layer 54, and a tunneling dielectric 56, and the charge storage layer 54 can be patterned such that the charge storage layer 54 does not protrude above a horizontal plane including a bottom surface of the patterned template structure 142 while each of the blocking dielectric 52 and the tunneling dielectric 56 protrudes above the horizontal plane including the bottom surface of the patterned template structure 142.

Referring to FIGS. 48A and 48B, dopants of both the first and second conductivity types (e.g., boron and phosphorus) can be implanted into surface regions of the drain semiconductor material portions 163 by ion implantation or by plasma doping. An implanted region 263 can be formed on a top surface region of each drain semiconductor material portion 163.

Referring to FIGS. 49A and 49B, the processing steps of FIGS. 14 and 15A-15E can be sequentially performed to form backside trenches 79 and to replace the in-process source-level material layers 10' with source-level material layers 10.

The processing steps FIG. 16 can be performed to remove the sacrificial material layers 42 and the patterned template structure 142 selective to the insulating layers 32, the memory stack structures 55, the drain-select-region isolation structures 72, the insulating cap strips, and the drain semiconductor material portions 163. For example, a wet etch employing hot phosphoric acid can be employed to remove the sacrificial material layers 42 and the patterned template structure 142 in case the sacrificial material layers 42 and the patterned template structure 142 comprise silicon nitride. Backside recesses are formed in volumes from which the sacrificial material layers 42 are removed, and drain-select-level cavities are formed in volumes from which the patterned template structure 142 is removed. The processing steps of FIG. 17 can be performed to simultaneously form electrically conductive layers 46 in the backside recesses and to form drain-select-level electrically conductive strips 146 in the drain-select-level cavities.

Alternatively, an insulating cap layer 70L including the drain-select-level isolation structures 72, the insulating cap strips 70 (shown in FIG. 18) and an additional horizontal dielectric material portion overlying top surfaces of the patterned template structure 142 may be formed as illustrated in FIG. 11. In this case, the processing steps of FIGS. 18, 19A and 19B, and 20A and 20B can be sequentially performed to replace the patterned template structure 142 with drain-select-level electrically conductive strips 146 in the same manner as in the first embodiment.

A separate anneal can be performed or the device can be raised to an elevated temperature during processing of another layer to diffuse the dopants of the first and second conductivity type from the implanted regions 263 into the drain semiconductor material portions 163 to form select gate level channel regions 60P of the first conductivity type (e.g., p-type) and drain regions 63 of the second conductivity type (e.g., n-type). Boron has a much larger diffusion length than phosphorus. Thus, boron diffuses further down into the drain semiconductor material portions 163 than phosphorus to form the select gate level channel regions 60P under the respective drain regions 63. Each drain region 63 can have a doping of the second conductivity type at a dopant concentration in a range from $5.0 \times 10^{19}/\text{cm}3$ to $2.0 \times 10^{21}/\text{cm}3$. Each contiguous combination of a memory film 50, a vertical semiconductor channel 60, select gate level channel region 60P, a dielectric core 62, a core cavity 69, and a drain region 63 constitutes a memory opening fill structure 58. Each vertical semiconductor channel 60 comprises a respective first vertically-extending portion extending through levels of the electrically conductive layers 46 and having a first maximum lateral channel dimension (e.g., diameter) mlcd1, and a respective second vertically-extending portion located at a level of the drain-select-level conductive strips 146 and having a second maximum lateral channel dimension (e.g., diameter) mlcd2 that is less than the first maximum lateral channel dimension mlcd1.

Referring to FIGS. 50A and 50B, an alternative configuration of the third exemplary structure can be derived from the third exemplary structure of FIGS. 42A and 42B by sequentially depositing a blocking dielectric 52 and a charge storage layer 54 employing the processing steps of FIGS. 43A and 43B without forming the cover material layer 261L. Subsequently, the processing steps of FIGS. 47A and 47B can be performed to form a tunneling dielectric 56, a vertical semiconductor channel 60, a dielectric core 62, and a drain semiconductor material portion 163 within each memory opening 49.

Each memory film 50 includes a first vertically-extending portion 501 that extends vertically through the alternating stack (32, 42) with a first sidewall (which may be an inner sidewall or an outer sidewall); a horizontally-extending portion 502 that extends horizontally between the patterned template structure 142 and a topmost one of the sacrificial material layers 42 (that are not portions of the patterned template structure 142); and a second vertically-extending portion 503 that extends vertically through the patterned template structure 142.

In one embodiment, dielectric cores 62 can be embedded within a respective one of the vertical semiconductor channels 60 and can include a respective upper cylindrical portion embedded within the patterned template structure 142. Core cavities 69 can be embedded within a respective one of the dielectric cores 62, and can have and can have a maximum lateral dimension mldc that is greater than a maximum lateral dimension of an overlying one of the upper cylindrical portions of the dielectric cores 62.

In one embodiment, each memory film 50 comprises a stack of a blocking dielectric 52, a charge storage layer 54, and a tunneling dielectric 56; and each of the blocking dielectric 52, the charge storage layer 54, and the tunneling dielectric 56 vertically extends through each layer of the alternating stack (32, 42) up to a top surface of the patterned template structure 142.

Figure 51A:
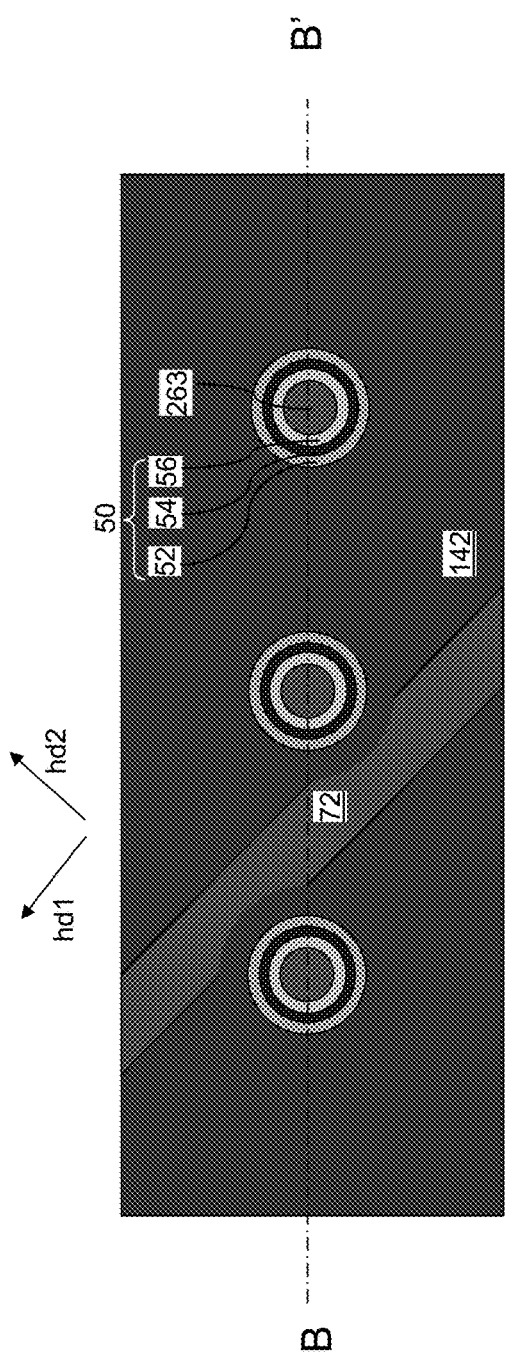
FIG. 51A is a horizontal cross-sectional view of a region of the third exemplary structure after formation of drain implant dopant regions according to the alternative configuration of the third embodiment of the present disclosure.
Figure 51B:
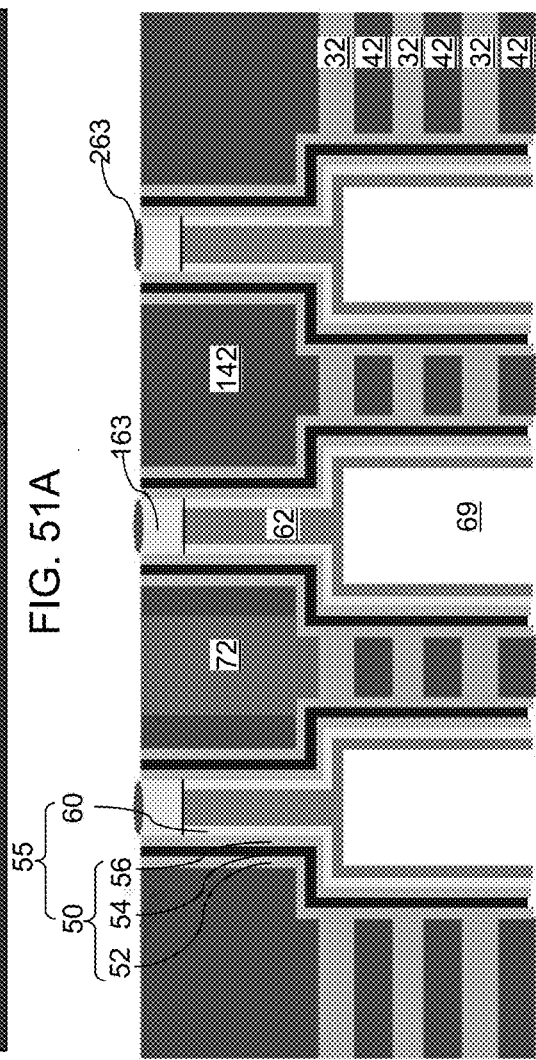
FIG. 51B is a vertical cross-sectional view of the third exemplary structure of FIG. 51A along the vertical plane B-B'. The horizontal plane A-A' is the plane of the horizontal cross-sectional view of FIG. 51A.

Referring to FIGS. 51A and 51B, dopants of the first and second conductivity type can be implanted into surface regions of the drain semiconductor material portions 163 by ion implantation or by plasma doping. An implanted region 263 can be formed on a top surface region of each drain semiconductor material portion 163.

Referring to FIGS. 52A and 52B, the processing steps of FIGS. 49A and 49B can be sequentially performed to form backside trenches 79, to replace the in-process source-level material layers 10' with source-level material layers 10, to replace the sacrificial material layers 42 with electrically conductive layers 46, and to replace the patterned template structure 142 with drain-select-level electrically conductive strips 146.

A separate anneal can be performed or the device can be raised to an elevated temperature during processing of another layer to diffuse the dopants of the first and second conductivity type from the implanted regions 263 into the drain semiconductor material portions 163 to form select gate level channel regions 60P of the first conductivity type (e.g., p-type) and drain regions 63 of the second conductivity type (e.g., n-type). Boron has a much larger diffusion length than phosphorus. Thus, boron diffuses further down into the drain semiconductor material portions 163 than phosphorus to form the select gate level channel regions 60P under the respective drain regions 63. Each drain region 63 can have a doping of the second conductivity type at a dopant concentration in a range from $5.0 \times 10^{19}/cm3$ to $2.0 \times 10^{21}/cm3$. Each contiguous combination of a memory film 50, a vertical semiconductor channel 60, select gate level channel region 60P, a dielectric core 62, a core cavity 69, and a drain region 63 constitutes a memory opening fill structure 58. A contact level dielectric layer 80 and drain contact via structures 88 can be formed as in the first and second embodiments. Each vertical semiconductor channel 60 comprises a respective first vertically-extending portion extending through levels of the electrically conductive layers 46 and having a first maximum lateral channel dimension mlcd1, and a respective second vertically-extending portion located at a level of the drain-select-level conductive strips 146 and having a second maximum lateral channel dimension mlcd2 that is less than the first maximum lateral channel dimension mlcd1.

Referring to all drawings of the third embodiment and related drawings of the first and second embodiment, the third exemplary structure comprises a three-dimensional memory device. The three-dimensional memory device comprises: an alternating stack (32, 46) of insulating layers 32 and electrically conductive layers 46 located over a substrate 8; drain-select-level electrically conductive strips 146 located over the alternating stack (32, 46); a drain-select-level isolation structure 72 located between a neighboring pair of the drain-select-level electrically conductive strips 146; memory stack structures 55 comprising a respective memory film 50 and a respective vertical semiconductor channel 60 vertically extending through the alternating stack (32, 46) and a respective one of the drain-select-level electrically conductive strips 146, wherein the memory stack structures 55 contact, and are completely laterally surrounded by, a cylindrical sidewall of a respective one of the drain-select-level electrically conductive strips 146; and a contact level dielectric layer 80 overlying the drain-select-level electrically conductive strips 146, the drain-select-level isolation structure 72 and the memory stack structures 55, wherein the contact level dielectric layer 80 contacts the drain-select-level isolation structure 72.

In one embodiment, the three-dimensional memory device further comprises drain regions 63 located at a top end of a respective one of the memory stack structures 55. In one embodiment, the drain regions 63 are laterally spaced from the drain-select-level electrically conductive strips 146 by a memory film 50. The portions of the memory film 50 located between a neighboring pair of a drain region 63 and a drain-select-level electrically conductive strip 146 can consist of a tunneling dielectric 56 and a blocking dielectric 52 as illustrated in FIGS. 49A and 49B, or can include a tunneling dielectric 56, a charge storage layer 54, and a blocking dielectric 52 as illustrated in FIGS. 52A and 52B.

In one embodiment, the top surfaces of the drain regions 63 may be coplanar with the top surfaces of the memory films 50 and the top surfaces of the drain-select-level electrically conductive strips 146. In case a recess etch process is employed to vertically recess top surfaces of the drain-select-level electrically conductive strips 146 prior to deposition of the contact level dielectric layer 80, the top surfaces of the drain-select-level electrically conductive strips 146 may be vertically recessed below the horizontal plane including the top surfaces of the drain regions 63 may be coplanar with the top surfaces of the memory films 50.

In one embodiment, each of the drain-select-level electrically conductive strips 146 has a respective laterally alternating sequence of planar vertical sidewall segments and convex vertical sidewall segments, wherein each convex vertical sidewall segment is laterally spaced from a most proximal one of the memory stack structures 55 by a uniform lateral spacing, which can be the same as the thickness of the second template material portions 144.

In one embodiment, the memory stack structures 55 are arranged as rows that laterally extend with a uniform pitch along a first horizontal direction hd1; and the three-dimensional memory device further comprises an insulating cap strip 70 (as illustrated in FIGS. 20A, 20B, 21A, and 21B) located over the alternating stack (32, 46) and having a straight sidewall that extend along the first horizontal direction hd1 by at least twice the uniform pitch.

In one embodiment, the drain-select-level isolation structure 72 generally extends along a first horizontal direction hd1; and the drain-select-level isolation structure 72 includes a pair of laterally alternating sequences of planar vertical sidewall segments and concave vertical sidewall segments that alternate along the first horizontal direction hd1. In one embodiment, each of the concave vertical sidewall segments is laterally spaced from a respective most proximal one of the memory stack structures by a uniform lateral spacing. In one embodiment, the uniform lateral spacing is the same as a lateral width of peripheral portions of the drain-select-level electrically conductive strips 146 disposed between the drain-select-level isolation structure 72 and most proximal ones among the memory stack structures 55.

In one embodiment, each of the drain-select-level electrically conductive strips 146 comprises a respective metallic nitride liner 146L and a respective metallic fill material portion 146F; each metallic nitride liner 146L consists essentially of a conductive metal nitride; and each metal fill material portion 146F consists essentially of an elemental metal or an intermetallic alloy.

In one embodiment, each of the memory stack structures 55 comprises: an upper portion vertically extending through a respective one of the drain-select-level electrically conductive strips 146 and having a first maximum lateral dimension mld1; and a lower portion vertically extending through the alternating stack (32, 46) and having a second maximum lateral dimension mld2 that is greater than the first maximum lateral dimension mld1.

In one embodiment, each memory film 50 comprises: a first vertically-extending portion 501 that extends vertically through the alternating stack (32, 46) with a first sidewall (which may be an outer sidewall or an inner sidewall); a horizontally-extending portion 502 that extends horizontally between the drain-select-level electrically conductive strips 146 and a topmost one of the electrically conductive layers 46 and including a horizontal surface adjoined to the first sidewall (which may be an upper surface adjoined to the outer sidewall or a lower surface adjoined the inner sidewall); and a second vertically-extending portion 503 that extends vertically through a respective one of the drain-select-level electrically conductive strips 146 within a second sidewall (which may be an outer sidewall adjoined to the upper surface or an inner sidewall adjoined to the lower surface).

In one embodiment, each memory film 50 comprises a stack of a blocking dielectric 52, a charge storage layer 54, and a tunneling dielectric 56; and an entirety of the charge storage layer 54 is located below a bottom surface of one of the drain-select-region electrically conductive strips 146 as illustrated in FIGS. 49A and 49B.

In one embodiment, each memory film 50 comprises a stack of a blocking dielectric 52, a charge storage layer 54, and a tunneling dielectric 56; and each of the blocking dielectric 52, the charge storage layer 54, and the tunneling dielectric 56 vertically extends through each layer of the alternating stack (32, 46) up to a top surface of a respective one of drain regions 63 overlying the memory stack structures 55 as illustrated in FIGS. 52A and 52B.

In one embodiment, the three-dimensional memory device further comprises: dielectric cores 62 embedded within a respective one of the vertical semiconductor channels 60 and including a respective upper cylindrical portion embedded within the drain-select-level electrically conductive strips 146; and core cavities 69 embedded within a respective one of the dielectric cores 62 and having a maximum lateral dimension mldc (as illustrated in FIGS. 47B and 50B) that is greater than a maximum lateral dimension of an overlying one of the upper cylindrical portions of the dielectric cores 62.

The three-dimensional memory device of the various embodiments of the third exemplary structure can comprise an alternating stack of insulating layers 32 and electrically conductive layers 46 located over a substrate, drain-select-level electrically conductive strips 146 located over the alternating stack (32, 46), a drain-select-level isolation structure 72 located between a neighboring pair of the drain-select-level electrically conductive strips 46, and memory stack structures 55 extending through the alternating stack (32, 46) and the drain-select-level electrically conductive strips 146 and comprising a respective vertical semiconductor channel 60 vertically extending through the alternating stack (32, 46) and a respective one of the drain-select-level electrically conductive strips 146. As shown in FIGS. 47B and 50B, each vertical semiconductor channel 60 comprises a respective first vertically-extending portion 60A extending through levels of the electrically conductive layers 46 and having a first maximum lateral channel dimension mlcd1, and a respective second vertically-extending portion 60C located at a level of the drain-select-level conductive strips 146 and having a second maximum lateral channel dimension mlcd2 that is less than the first maximum lateral channel dimension mlcd1.

In one embodiment, the three-dimensional memory device comprises a three-dimensional NAND memory device, the electrically conductive layers 46 comprise word lines of the three-dimensional NAND memory device, and the drain-select-level electrically conductive strips 146 comprise drain select gate electrodes of the three-dimensional NAND memory device.

In some embodiments, each first vertically-extending portion 60A of the vertical semiconductor channels 60 has a first convex outer sidewall that extends from a bottommost layer of the alternating stack (32, 46) and at least to a topmost one of the electrically conductive layers 46, and each second-vertically extending portion 60C of the vertical semiconductor channels 60 has a second convex outer sidewall that extends through a respective one of the drain-select-level electrically conductive strips 146 as illustrated in FIGS. 49B and 52B. The second convex outer sidewall is laterally offset inward from the first convex outer sidewall by a uniform lateral offset distance (i.e., a lateral distance between two vertical planes including the second convex outer sidewall or the first convex outer sidewall) in each of the vertical semiconductor channels 60. In some embodiments, the first convex outer sidewall comprises a first cylindrical sidewall, and the second convex outer sidewall comprises a second cylindrical sidewall having a same rotational symmetry axis (which can be a vertical line passing through a geometrical center of each memory opening fill structure 58) as the first cylindrical sidewall. As used herein, a geometrical center of an element refers to the center of mass of a hypothetical object having a same geometrical shape and location as the element and having a uniform density throughout.

In some embodiments shown in FIGS. 47B and 50B, each of the vertical semiconductor channels 60 comprises an annular horizontal connection portion 60B (which may be an annular horizontally-extending portion) adjoining a top end of a respective first vertically-extending portion 60A and a bottom end of a respective second vertically-extending portion 60C. Dielectric cores 62 can be located within a respective one of the vertical semiconductor channels 60. Each of the dielectric cores 62 includes a respective core cavity 69 devoid of any solid state material (i.e., any material in a solid phase) therein. The core cavity 69 is located entirely underneath a horizontal plane including bottom surfaces of the drain-select-level electrically conductive strips 146. In some embodiments, the core cavity 69 has a greater lateral extent than an overlying one of the second vertically-extending portions of the vertical semiconductor channels 60. An interior of the first vertically-extending portion of each vertical semiconductor channel 60 is filled by a respective one of the dielectric cores 62 and a respective core cavity 69, while an interior of the second vertically-extending portion of each vertical semiconductor channel 60 is completely filled by a respective one of the dielectric cores 62.

In some embodiments shown in FIGS. 47B and 50B, each memory stack structure 55 comprises a memory film 50 which comprises a first vertically-extending portion 501 that extends vertically through the alternating stack (32, 46), a horizontally-extending portion 502 that extends horizontally above a topmost one of the electrically conductive layers 46 and below the drain-select-level electrically conductive strips 146, and a second vertically-extending portion 503 that extends vertically through a respective one of the drain-select-level electrically conductive strips 146.

In one embodiment illustrated in FIGS. 49A and 49B, each memory film 50 comprises a stack of a blocking dielectric 52, a charge storage layer 54, and a tunneling dielectric 56; an entirety of the charge storage layer 54 is located below a bottom surface of one of the drain-select-level electrically conductive strips 146; and the blocking dielectric 52 directly contacts the tunneling dielectric 56 around a respective one of the second vertically-extending portions of the vertical semiconductor channels 60.

In another embodiment illustrated in FIGS. 52A and 52B, each memory film 50 comprises a stack of a blocking dielectric 52, a charge storage layer 54, and a tunneling dielectric 56; and each of the blocking dielectric 52, the charge storage layer 54, and the tunneling dielectric 56 laterally surrounds a respective one of the second vertically-extending portions of the vertical semiconductor channels 60 and vertically extends up to a horizontal plane including top surfaces of drain regions 63 that overlie the memory stack structures 55.

In some embodiments, each of the memory stack structures 55 contact, and are completely laterally surrounded by, a cylindrical sidewall of a respective one of the drain-select-level electrically conductive strips 146; and a contact level dielectric layer 80 overlies the drain-select-level electrically conductive strips 146, the drain-select-level isolation structure 72 and the memory stack structures 55, wherein the contact level dielectric layer 80 contacts the drain-select-level isolation structure 72.

In some embodiments, each of the drain-select-level electrically conductive strips 146 has a respective laterally alternating sequence of planar vertical sidewall segments and convex vertical sidewall segments, wherein each convex vertical sidewall segment is laterally spaced from a most proximal one of the memory stack structures 55 by a uniform lateral spacing.

Each of the exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate 8 can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate 8, e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels 60, wherein at least one end portion 60 of each of the plurality of semiconductor channels 60 extends substantially perpendicular to a top surface of the substrate 8 and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels 60.

A method of forming a three-dimensional memory device according to various embodiments includes forming an alternating stack of insulating layers 32 and sacrificial material layers 42 over a substrate 8, forming a patterned template structure (e.g., a drain select level sacrificial structure) 142 around memory openings 49 filled with the sacrificial pillar structures 48 in a drain-select-level above the alternating stack (32, 42), forming drain-select-level isolation structures 72 in trenches 174 in the patterned template structure, forming memory stack structures 55 in the memory openings 49 extending through the alternating stack (32, 42), where each of the memory stack structures 55 includes a memory film 50 and a vertical semiconductor channel 60, replacing the sacrificial material layers 42 with word lines (i.e., the electrically conductive layers 46), and separately replacing the patterned template structure 142 with a drain select gate electrode (i.e., the drain-select level electrically conductive strip 146). The drain select gate electrode may include only the metallic portion (146L, 146F) of the first embodiment or it may additionally include the pair of doped semiconductor spacers 244 of the second embodiment in addition to the metallic portion.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
    an alternating stack of insulating layers and electrically conductive layers located over a substrate;
    drain-select-level electrically conductive strips located over the alternating stack, wherein each of the drain-select-level electrically conductive strips comprises a combination of at least one metallic material portion and a doped semiconductor spacer;
    a drain-select-level isolation structure located between a neighboring pair of drain-select-level electrically conductive strips;
    memory stack structures comprising a memory film and a vertical semiconductor channel vertically extending through the alternating stack and a respective one of the drain-select-level electrically conductive strips; and
    drain regions located on top of a respective one of the memory stack structures;
    wherein each doped semiconductor spacer contacts convex vertical surfaces of a respective subset of the memory stack structures.

2. A three-dimensional memory device, comprising:
    an alternating stack of insulating layers and electrically conductive layers located over a substrate;
    drain-select-level electrically conductive strips located over the alternating stack, wherein each of the drain-select-level electrically conductive strips comprises a combination of at least one metallic material portion and a doped semiconductor spacer;
    a drain-select-level isolation structure located between a neighboring pair of drain-select-level electrically conductive strips;
    memory stack structures comprising a memory film and a vertical semiconductor channel vertically extending through the alternating stack and a respective one of the drain-select-level electrically conductive strips; and
    drain regions located on top of a respective one of the memory stack structures;
    wherein:
        the drain-select-level isolation structure generally extends along a first horizontal direction; and
        the drain-select-level isolation structure includes a pair of laterally alternating sequences of planar vertical sidewall segments and concave vertical sidewall segments that alternate along the first horizontal direction.

3. The three-dimensional memory device of claim 2, wherein each of the concave vertical sidewall segments is laterally spaced from a respective most proximal one of the memory stack structures by a uniform lateral spacing.

4. A method of forming a three-dimensional memory device, comprising:
    forming an alternating stack of insulating layers and spacer material layers over a substrate, wherein the spacer material layers are formed as, or are subsequently replaced with, electrically conductive layers;
    forming a sacrificial matrix layer over the alternating stack;
    forming sacrificial pillar structures through the sacrificial matrix layer and the alternating stack;
    replacing at least the sacrificial matrix layer with a combination of a patterned template structure, doped semiconductor spacers contacting sidewalls of the patterned template structure, and an insulating cap layer;
    replacing the sacrificial pillar structures with memory opening fill structures comprising a memory film and a vertical semiconductor channel;
    forming drain-select-level cavities by removing an entirety of each of the patterned template structure selective to materials of the doped semiconductor spacers and the insulating cap layer; and
    depositing at least one electrically conductive material within volumes of the drain-select-level cavities to form drain-select-level electrically conductive strips comprising a combination of a respective portion of the at least one deposited electrically conductive material and a respective pair of doped semiconductor spacers.

5. The method of claim 4, wherein:
    inner rows of the memory stack structures contact the patterned template structure and do not contact any of the doped semiconductor spacers; and
    outer rows of the memory stack structures contact the patterned template structure and a respective one of the doped semiconductor spacers.

6. The method of claim 4, further comprising removing horizontal portions of the insulating cap layer, wherein remaining portions of the insulating cap layer comprise a drain-select-level isolation structure contacting a pair of doped semiconductor spacers among the doped semiconductor spacers.

7. The method of claim 4, wherein the patterned template structure is formed by:
    forming recess regions surrounded by remaining portions of the sacrificial matrix layer by etching regions of the sacrificial matrix layer selective to the sacrificial pillar structures;
    depositing a template material within the recess regions; and
    planarizing the template material.

8. The method of claim 7, wherein the doped semiconductor spacers are formed by:
    removing the remaining portions of the sacrificial matrix layer after formation of the patterned template structure;

depositing a conformal doped semiconductor material liner over the patterned template structure and on physically exposed surfaces of the sacrificial pillar structures; and anisotropically etching horizontal portions of the conformal doped semiconductor material liner, wherein remaining vertical portions of the conformal doped semiconductor material liner constitute the doped semiconductor spacers.

9. The method of claim 7, wherein:

the template material portions comprise a dielectric material different from materials of the insulating layers and the insulating cap layer;

the sacrificial pillar structures comprise a sacrificial semiconductor material.

10. The material of claim 7, wherein the sidewalls of the doped semiconductor spacers include convex vertical sidewall segments that are laterally spaced from a most proximal one of sidewalls of the sacrificial pillar structures by a same uniform lateral spacing.

11. The method of claim 7, wherein the recess regions are formed by:

forming a photoresist layer including openings therein over the sacrificial matrix layer; and anisotropically etching unmasked regions of the sacrificial matrix layer employing an etch chemistry that is selective to a material of the sacrificial pillar structures, wherein:

a first subset of the sacrificial pillar structures protrudes within the recess regions; and a second subset of the sacrificial pillar structures contacts the remaining portions of the sacrificial material layer and has sidewalls that are physically exposed to a respective one of the recess regions.

12. The method of claim 4, wherein:

each memory opening fill structure comprises a memory stack structure and a drain region overlying the memory stack structure, and the entirety of each of the patterned template structure is removed employing a wet etch process that removes the patterned template structure selective to materials of the drain regions and memory films within the memory stack structures.

\* \* \* \* \*